(12) United States Patent
Lin et al.

(10) Patent No.: US 12,183,735 B2
(45) Date of Patent: Dec. 31, 2024

(54) SEMICONDUCTOR DEVICES AND METHODS OF MANUFACTURE

(71) Applicant: Taiwan Semiconductor Manufacturing Company, Ltd., Hsinchu (TW)

(72) Inventors: Ta-Chun Lin, Hsinchu (TW); Kuo-Hua Pan, Hsinchu (TW); Jhon Jhy Liaw, Zhudong Township (TW)

(73) Assignee: Taiwan Semiconductor Manufacturing Company, Ltd., Hsinchu (TW)

(*) Notice: Subject to any disclaimer, the term of this patent is extended or adjusted under 35 U.S.C. 154(b) by 0 days.

(21) Appl. No.: 18/356,541

(22) Filed: Jul. 21, 2023

(65) Prior Publication Data

US 2024/0021611 A1 Jan. 18, 2024

Related U.S. Application Data

(62) Division of application No. 17/304,911, filed on Jun. 28, 2021, now Pat. No. 11,804,485.

(60) Provisional application No. 63/173,067, filed on Apr. 9, 2021.

(51) Int. Cl.
```
H01L 27/088      (2006.01)
H01L 21/8234     (2006.01)
H01L 29/06       (2006.01)
H01L 29/66       (2006.01)
H01L 29/78       (2006.01)
```

(52) U.S. Cl.
CPC ............ *H01L 27/0886* (2013.01); *H01L 21/823431* (2013.01); *H01L 21/823481* (2013.01); *H01L 29/0649* (2013.01); *H01L 29/6681* (2013.01); *H01L 29/7851* (2013.01)

(58) Field of Classification Search
CPC ......... H01L 27/0886; H01L 21/823431; H01L 21/823481; H01L 29/0649; H01L 29/6681; H01L 29/7851
See application file for complete search history.

(56) References Cited

U.S. PATENT DOCUMENTS

| | | | |
|---|---|---|---|
| 2016/0336428 A1* | 11/2016 | Cheng | .................... H01L 29/167 |
| 2016/0379888 A1* | 12/2016 | Chao | .................... H01L 21/3081 |
| | | | 438/283 |
| 2019/0348527 A1* | 11/2019 | Liaw | ............... H01L 21/823821 |
| 2019/0371674 A1 | 12/2019 | Wu et al. | |
| 2020/0212037 A1 | 7/2020 | Yu et al. | |
| 2020/0279856 A1 | 9/2020 | Yamaguchi | |
| 2022/0328475 A1 | 10/2022 | Lin et al. | |

* cited by examiner

*Primary Examiner* — Christine A Enad
(74) *Attorney, Agent, or Firm* — Harrity & Harrity, LLP

(57) ABSTRACT

Transistors of different types of electronic devices on the same semiconductor substrate are configured with different transistor attributes to increase the performance of the different types of electronic devices. Fin height, shallow source drain (SSD) height, source or drain width, and/or one or more other transistor attributes may be co-optimized for the different types of electronic devices by various semiconductor manufacturing processes such as etching, lithography, process loading, and/or masking, among other examples. This enables the performance of a plurality of types of electronic devices on the same semiconductor substrate to be increased.

20 Claims, 42 Drawing Sheets

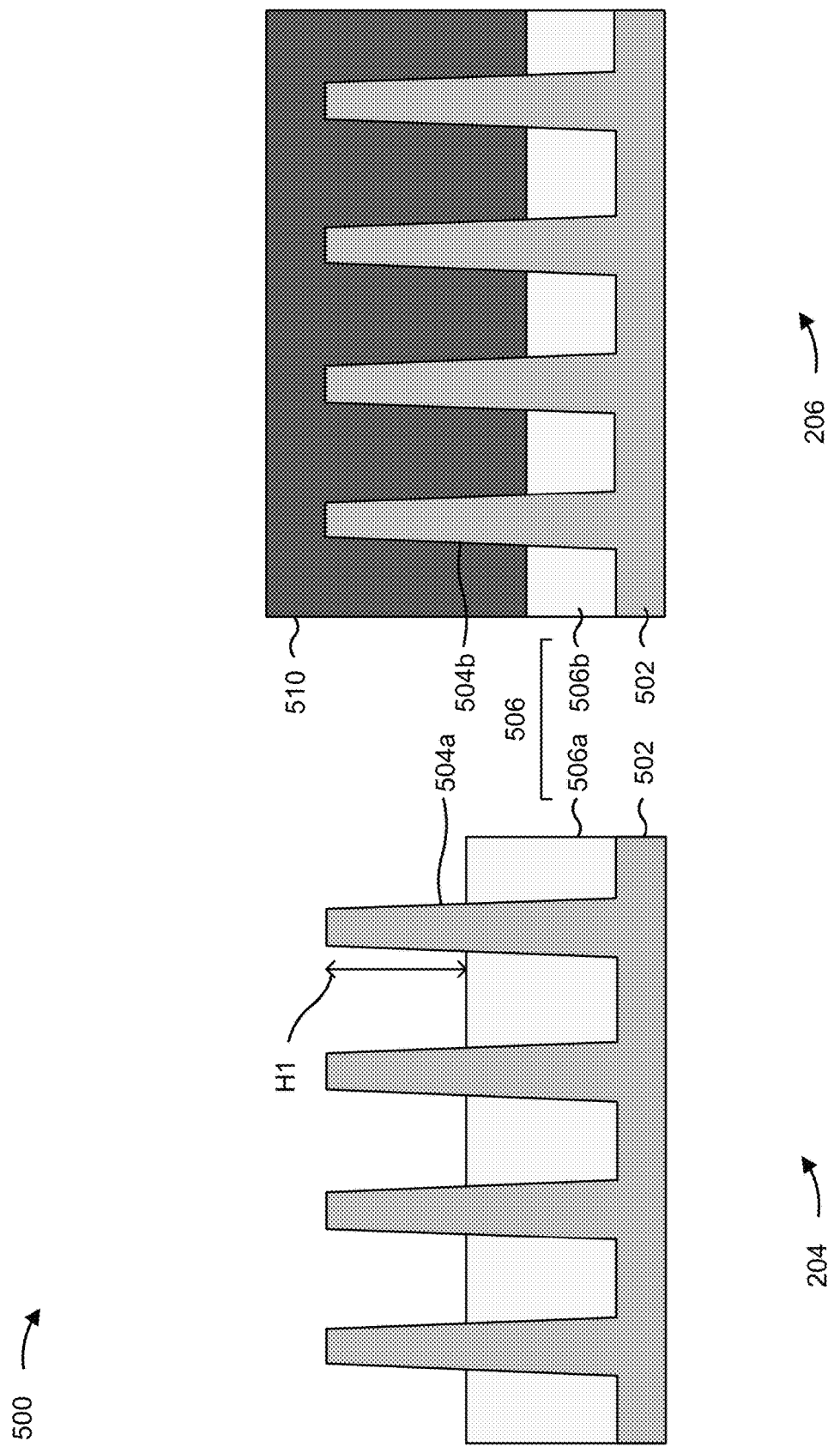

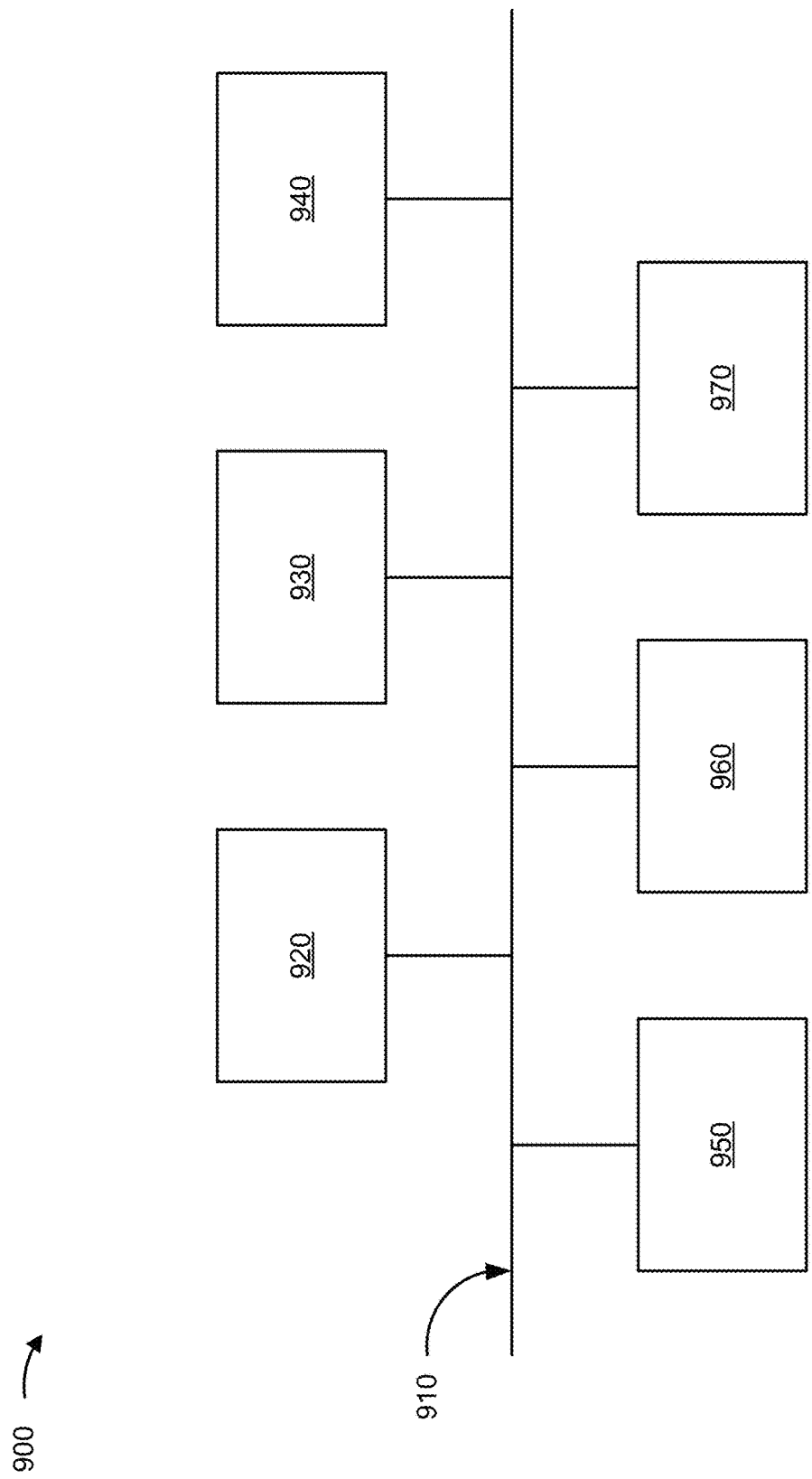

SEMICONDUCTOR DEVICES AND METHODS OF MANUFACTURE

CROSS-REFERENCE TO RELATED APPLICATIONS

This application is a divisional of U.S. patent application Ser. No. 17/304,911, filed Jun. 28, 2021, which claims priority to U.S. Provisional Patent Application No. 63/173,067, filed on Apr. 9, 2021, and entitled "SEMICONDUCTOR DEVICES AND METHODS OF MANUFACTURE," the contents of which are incorporated herein by reference in their entireties.

BACKGROUND

A field-effect transistor (FET) is a type of transistor that uses an electric field to control the flow of current. A FET includes three terminals: a source, a gate, and a drain. In operation, a FET controls the flow of current through the application of a voltage to the gate which, in turn, alters conductivity between the drain and the source. A commonly used type of FET is a metal-oxide-semiconductor field-effect transistor (MOSFET). Physically, a FET may be formed as a planar transistor, a finFET, a gate all around (GAA) transistor, or another type of form factor. A MOSFET can be used, for example, as a switch for an electrical signal (e.g., a radio frequency (RF) switch), as an amplifier for an electrical signal (e.g., a low-noise amplifier (LNA)), or in complementary metal oxide semiconductor (CMOS) logic (e.g., static random access memory (SRAM) and other types of memory devices), among other examples.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 4A-4G, 5A-5F, 6A-6G, 7A-7H, and 8A-8H are diagrams of example implementations described herein.

FIG. 9 is a diagram of example components of one or more devices of FIG. 1.

DETAILED DESCRIPTION

Figure 1:
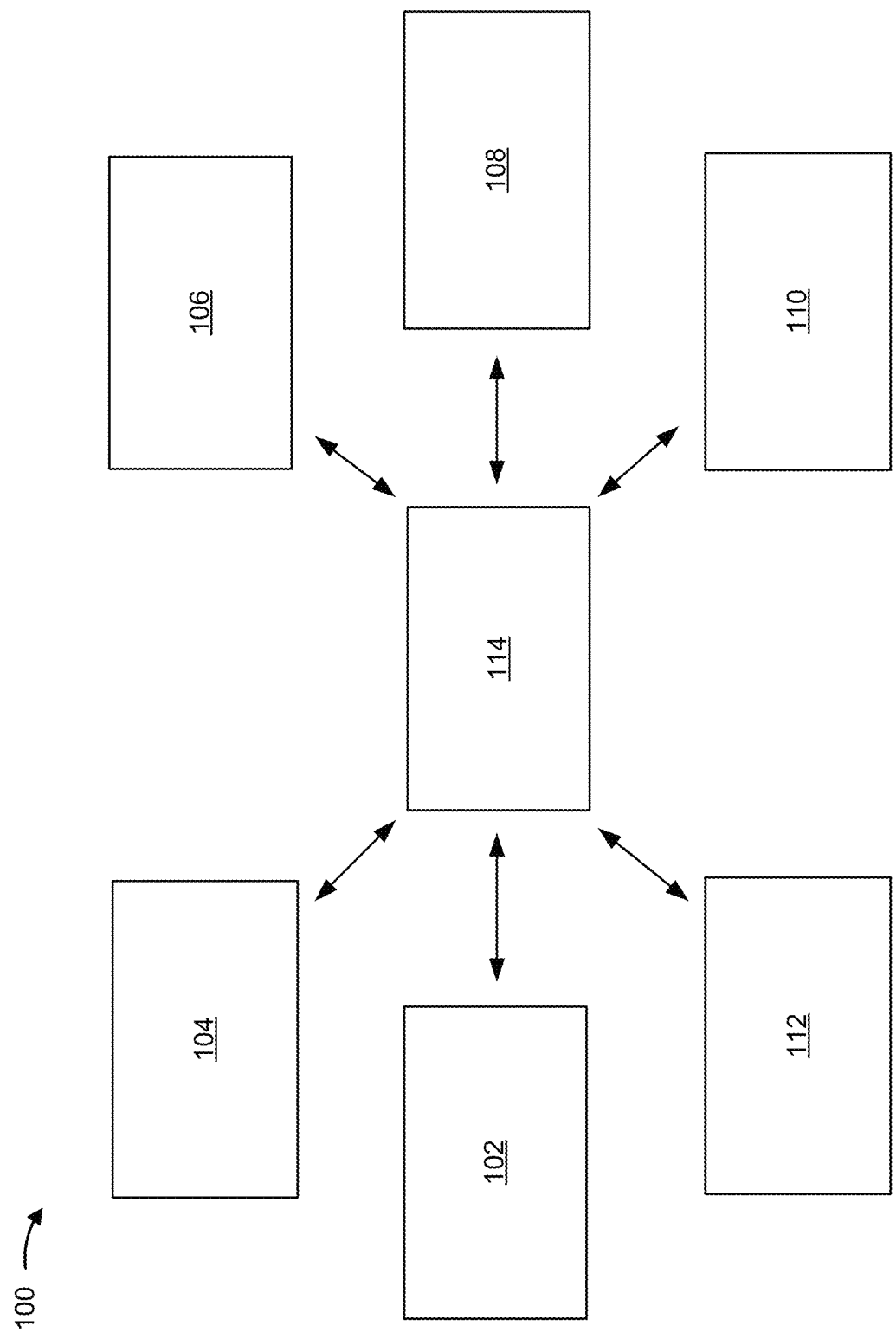
FIG. 1 is a diagram of an example environment in which systems and/or methods described herein may be implemented.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The performance of some types of electronic devices (e.g., system on chip (SoC) devices, high performance computation (HPC) devices, input/output (I/O) devices, and/or analog devices, among other examples) may be increased through operating parameters such as high power efficiency and low capacitance, among other examples. On the other hand, the performance of other types of electronic devices may be increased through high drive current and low resistance, among other examples. Various transistor (e.g., finFET) attributes such as fin height, shallow source-drain (SSD) profile or height, and/or source or drain contact (MD) width may impact the operating parameters of electronic devices. However, forming different types of electronic devices on the same semiconductor substrate to have the same transistor attributes may decrease the performance of one or more of the types of electronic devices and/or may result in sub-optimal performance of one or more types of the electronic devices.

In some implementations described herein, transistors (e.g., finFETs and/or other types of transistors) of different types of electronic devices configured with different transistor attributes increase the performance of different types of electronic devices included on the same semiconductor substrate such as a wafer. In this way, fin height, SSD height, source or drain width, and/or one or more other transistor attributes may be co-optimized for the different types of electronic devices by various semiconductor manufacturing processes such as etching, lithography, process loading, and/or masking, among other examples. This enables the performance of a plurality of types of electronic devices on the same semiconductor substrate to be increased.

FIG. 1 is a diagram of an example environment 100 in which systems and/or methods described herein may be implemented. As shown in FIG. 1, environment 100 may include a plurality of semiconductor processing tools 102-112 and a wafer/die transport tool 114. The plurality of semiconductor processing tools 102-112 may include a deposition tool 102, an exposure tool 104, a developer tool 106, an etch tool 108, a planarization tool 110, a plating tool 112, and/or another type of semiconductor processing tool. The tools included in example environment 100 may be included in a semiconductor clean room, a semiconductor foundry, a semiconductor processing facility, and/or manufacturing facility, among other examples.

The deposition tool 102 is a semiconductor processing tool that includes a semiconductor processing chamber and one or more devices capable of depositing various types of materials onto a substrate. In some implementations, the deposition tool 102 includes a spin coating tool that is capable of depositing a photoresist layer on a substrate such as a wafer. In some implementations, the deposition tool 102 includes a chemical vapor deposition (CVD) tool such as a plasma-enhanced CVD (PECVD) tool, a high-density plasma CVD (HDP-CVD) tool, a sub-atmospheric CVD (SACVD) tool, an atomic layer deposition (ALD) tool, a plasma-enhanced atomic layer deposition (PEALD) tool, or another type of CVD tool. In some implementations, the deposition tool 102 includes a physical vapor deposition (PVD) tool, such as a sputtering tool or another type of PVD tool. In some implementations, the example environment 100 includes a plurality of types of deposition tools 102.

The exposure tool 104 is a semiconductor processing tool that is capable of exposing a photoresist layer to a radiation source, such as an ultraviolet light (UV) source (e.g., a deep UV light source, an extreme UV light (EUV) source, and/or the like), an x-ray source, an electron beam (e-beam) source, and/or the like. The exposure tool 104 may expose a photoresist layer to the radiation source to transfer a pattern from a photomask to the photoresist layer. The pattern may include one or more semiconductor device layer patterns for forming one or more semiconductor devices, may include a pattern for forming one or more structures of a semiconductor device, may include a pattern for etching various portions of a semiconductor device, and/or the like. In some implementations, the exposure tool 104 includes a scanner, a stepper, or a similar type of exposure tool.

The developer tool 106 is a semiconductor processing tool that is capable of developing a photoresist layer that has been exposed to a radiation source to develop a pattern transferred to the photoresist layer from the exposure tool 104. In some implementations, the developer tool 106 develops a pattern by removing unexposed portions of a photoresist layer. In some implementations, the developer tool 106 develops a pattern by removing exposed portions of a photoresist layer. In some implementations, the developer tool 106 develops a pattern by dissolving exposed or unexposed portions of a photoresist layer through the use of a chemical developer.

The etch tool 108 is a semiconductor processing tool that is capable of etching various types of materials of a substrate, wafer, or semiconductor device. For example, the etch tool 108 may include a wet etch tool, a dry etch tool, and/or the like. In some implementations, the etch tool 108 includes a chamber that is filled with an etchant, and the substrate is placed in the chamber for a particular time period to remove particular amounts of one or more portions of the substrate. In some implementations, the etch tool 108 may etch one or more portions of the substrate using a plasma etch or a plasma-assisted etch, which may involve using an ionized gas to isotropically or directionally etch the one or more portions.

The planarization tool 110 is a semiconductor processing tool that is capable of polishing or planarizing various layers of a wafer or semiconductor device. For example, a planarization tool 110 may include a chemical mechanical planarization (CMP) tool and/or another type of planarization tool that polishes or planarizes a layer or surface of deposited or plated material. The planarization tool 110 may polish or planarize a surface of a semiconductor device with a combination of chemical and mechanical forces (e.g., chemical etching and free abrasive polishing). The planarization tool 110 may utilize an abrasive and corrosive chemical slurry in conjunction with a polishing pad and retaining ring (e.g., typically of a greater diameter than the semiconductor device). The polishing pad and the semiconductor device may be pressed together by a dynamic polishing head and held in place by the retaining ring. The dynamic polishing head may rotate with different axes of rotation to remove material and even out any irregular topography of the semiconductor device, making the semiconductor device flat or planar.

The plating tool 112 is a semiconductor processing tool that is capable of plating a substrate (e.g., a wafer, a semiconductor device, and/or the like) or a portion thereof with one or more metals. For example, the plating tool 112 may include a copper electroplating device, an aluminum electroplating device, a nickel electroplating device, a tin electroplating device, a compound material or alloy (e.g., tin-silver, tin-lead, and/or the like) electroplating device, and/or an electroplating device for one or more other types of conductive materials, metals, and/or similar types of materials.

Wafer/die transport tool 114 includes a mobile robot, a robot arm, a tram or rail car, an overhead hoist transport (OHT) system, an automated materially handling system (AMHS), and/or another type of device that is used to transport wafers and/or dies between semiconductor processing tools 102-112 and/or to and from other locations such as a wafer rack, a storage room, and/or the like. In some implementations, wafer/die transport tool 114 may be a programmed device that is configured to travel a particular path and/or may operate semi-autonomously or autonomously.

The number and arrangement of devices shown in FIG. 1 are provided as one or more examples. In practice, there may be additional devices, fewer devices, different devices, or differently arranged devices than those shown in FIG. 1. Furthermore, two or more devices shown in FIG. 1 may be implemented within a single device, or a single device shown in FIG. 1 may be implemented as multiple, distributed devices. Additionally, or alternatively, a set of devices (e.g., one or more devices) of environment 100 may perform one or more functions described as being performed by another set of devices of environment 100.

Figure 2:
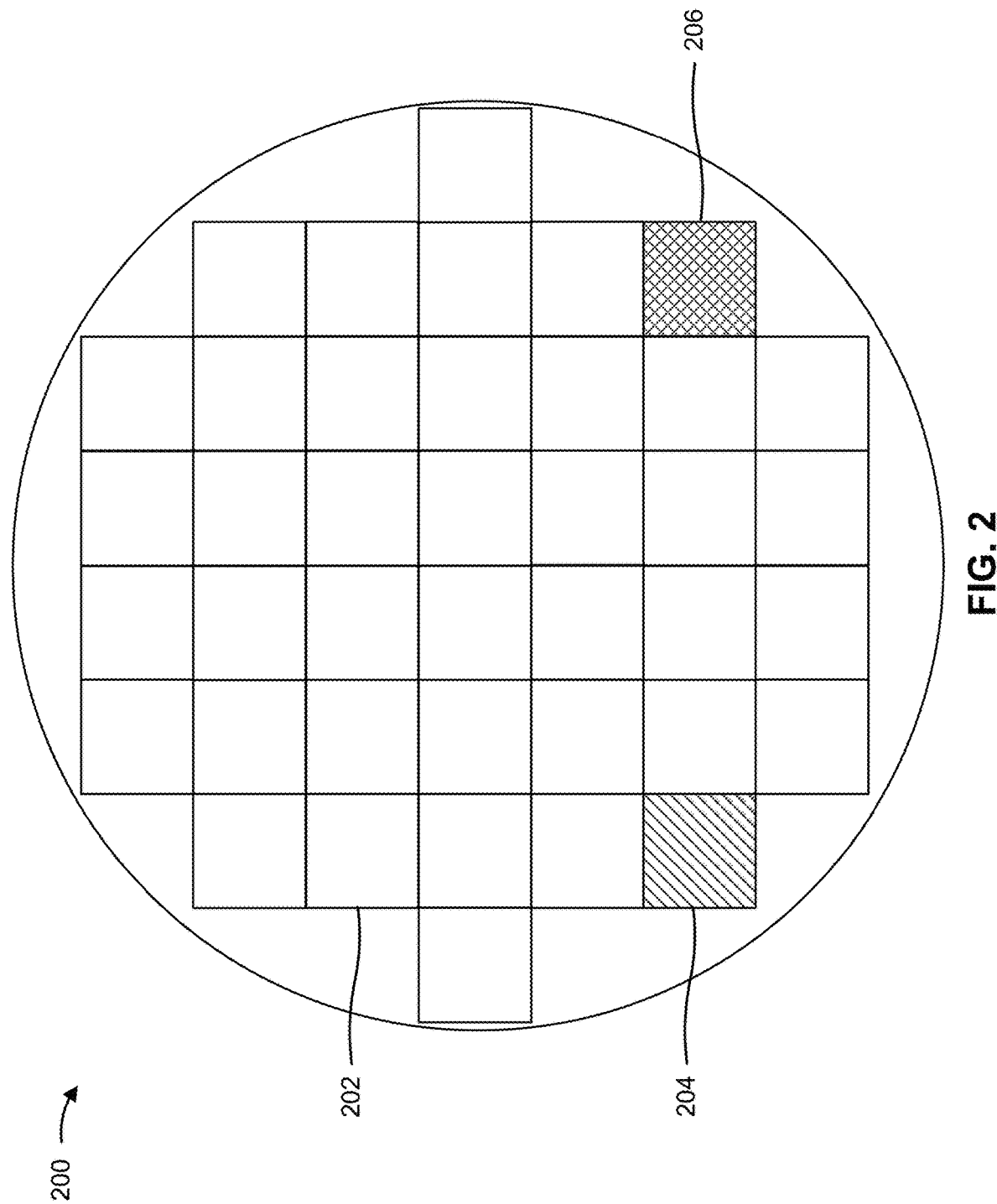
FIG. 2 is a diagram of an example semiconductor substrate described herein.

FIG. 2 is a diagram of an example semiconductor substrate 200 described herein. The semiconductor substrate 200 includes a semiconductor wafer or another type of semiconductor substrate on which semiconductor-based electronic devices 202 are formed.

The semiconductor substrate 200 includes a silicon (Si) substrate, a substrate formed of a material including silicon, a III-V compound semiconductor material substrate such as gallium arsenide (GaAs), a silicon on insulator (SOI) substrate, a germanium (Ge) substrate, a silicon germanium (SiGe) substrate, or another type of semiconductor substrate. The electronic devices 202 include semiconductor-based devices, such as a memory device (e.g., a static random access memory (SRAM), a dynamic random access memory (DRAM)), a logic device, a processor, an SoC device, an HPC device, an I/O device, an analog device, a diode-based device (e.g., a light emitting diode (LED) device), a ring oscillator (RO) device, and/or or another type of device that includes one or more transistors.

As shown in FIG. 2, the semiconductor substrate 200 includes a plurality of different types of electronic devices 202, including an electronic device 204 of a first type and an electronic device 206 of a second type. As an example, the electronic device 204 may include an SoC device and the electronic device 206 may include an HPC device. As another example, the electronic device 204 may include an I/O device and the electronic device 206 may include an analog device. In some implementations, the semiconductor substrate 200 includes a greater quantity of different types of electronic devices 202. The different types of electronic devices 202 included on the semiconductor substrate 200 include transistors that are configured with different attributes to increase the performance of the different types of electronic devices 202 formed on the same substrate, as described herein. The different types of electronic devices 202 may be formed such that the transistors included in each are configured with different attributes using one or more of the techniques described in connection with FIGS. 4A-4G, 5A-5F, 6A-6H, 7A-7I, 8A-8C, and/or elsewhere herein.

As indicated above, FIG. 2 is provided as an example. Other examples may differ from what is described with regard to FIG. 2.

Figure 3:
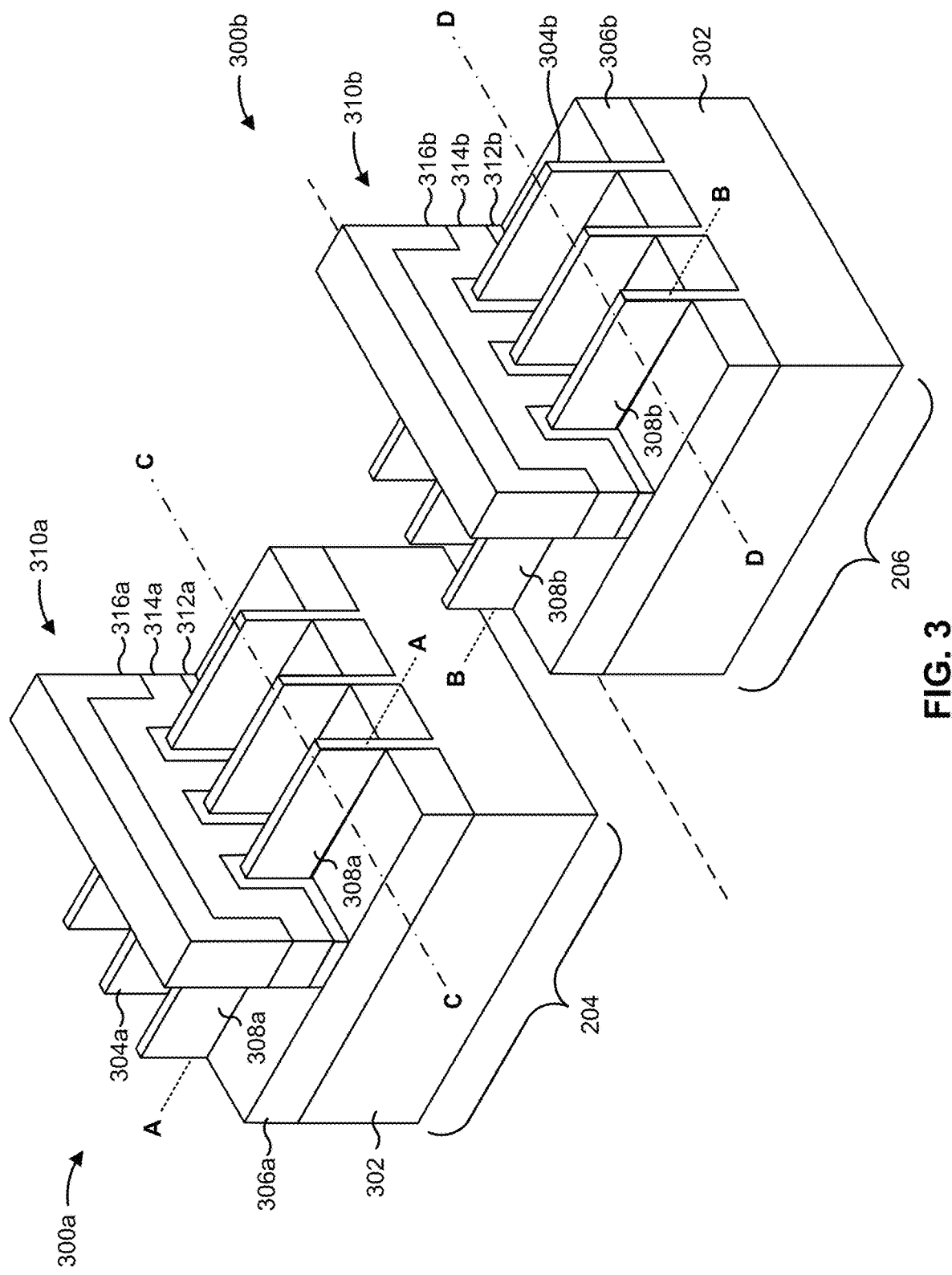
FIG. 3 is a diagram of example portions of electronic devices on a same semiconductor substrate described herein.

FIG. 3 is a diagram of example portions of electronic devices on a same semiconductor substrate described herein. In particular, FIG. 3 illustrates an example portion 300a of the electric device 204 and an example portion 300b of the electronic device 206, which are formed in different regions on the same semiconductor substrate 302 (e.g., the semiconductor substrate 200). FIGS. 4A-8H are schematic cross-sectional views of various portions of the electronic devices 204 and 206 substrate illustrated in FIG. 3 and corresponding to various processing stages of forming finFETs.

The substrate 302 includes a silicon (Si) substrate, a substrate formed of a material including silicon, a III-V compound semiconductor material substrate such as gallium arsenide (GaAs), a silicon on insulator (SOI) substrate, a germanium substrate (Ge), a silicon germanium (SiGe) substrate, or another type of semiconductor substrate. The substrate 302 may be a round/circular substrate having a 200 mm diameter, a 300 mm diameter, or other diameters, such as 450 mm, among others. The substrate 302 may also be any polygonal, square, rectangular, curved, or otherwise non-circular workpiece, such as a polygonal substrate as needed.

Fin structures are formed in the substrate 302 for the electronic device 204 and the electronic device 206. In particular, fin structures 304a are formed in the substrate 302 in the portion 300a of the electronic device 204, and fin structures 304b are formed in the substrate 302 in the portion 300b of the electronic device 206. Each fin structure 304a and 304b provides an active region where one or more devices (e.g., transistors) are formed. The fin structures 304a and 304b are fabricated using suitable processes including masking, photolithography, and/or etch processes, among other examples. In some implementations, the fin structures 304a and 304b include silicon materials or another elementary semiconductor, such as germanium, or a compound semiconductor including silicon carbide, gallium arsenic, gallium phosphide, indium phosphide, indium arsenide, and/or indium antimonide. In some implementations, the fin structures 304a and 304b may also be an alloy semiconductor including SiGe, GaAsP, AlInAs, AlGaAs, GaInAs, GaInP, GaInAsP, or a combination thereof. In some implementations, the fin structures 304a and 304b may be doped using n-type and/or p-type dopants as needed.

The plurality of fin structures 304a and 304b may be formed by etching a portion of the substrate 302 away to form recesses in the substrate 302. The recesses may then be filled with isolating material that is recessed or etched back to form shallow trench isolation (STI) layers 306a above the substrate 302 and between the fin structures 304a, and STI layers 306b above the substrate 302 and between the fin structures 304b. Other fabrication techniques for the STI layers 306a and 306b and/or the fin structures 304a and 304b may be used. The STI structures 306a and 306b may isolate some regions of the substrate 302 such as the active areas in the fin structures 304a and 304b, respectively. The STI layers 304a and 304b may be formed of silicon oxide, silicon nitride, silicon oxynitride, fluoride-doped silicate glass (FSG), a low-k dielectric material, and/or other suitable insulating material. The STI layers 304a and 304b may include a multi-layer structure, for example, having one or more liner layers.

The device 300 includes metal source or drain contacts (MDs or CAs) 330, which include cobalt (Co), ruthenium (Ru), and/or another conductive or metal material. The device 300 further includes gates 332 (MGs), which are formed of a polysilicon material, a metal (e.g., tungsten (W) or another metal), and/or another type of conductive material. The metal source or drain contacts 330 and the gates 332 are electrically isolated by one or more sidewall spacers, including spacers 334 in each side of the metal source or drain contacts 330 and spacers 336 on each side of the gate 332. The spacers 334 and 336 include a silicon oxide ($SiO_x$), a silicon nitride ($Si_xN_y$), a silicon oxy carbide (SiOC), a silicon oxycarbonitride (SiOCN), and/or another suitable material. In some implementations, the spacers 334 are omitted from the sidewalls of the source or drain contacts 330.

A dummy gate structure 310a is included in the electronic device 204 over the fin structures 304a (e.g., approximately perpendicular to the fin structures 304a), and a dummy gate structure 310b is included in the electronic device 206 over the fin structures 304b (e.g., approximately perpendicular to the fin structures 304b). In the example depicted in FIG. 3, the dummy gate structure 310a includes a gate dielectric layer 312a, a gate electrode layer 314a, and a hard mask layer 316a. Similarly the dummy gate structure 310b includes a gate dielectric layer 312b, a gate electrode layer 314b, and a hard mask layer 316b. In some implementations, the dummy gate structures 310a and 310b further include a capping layer and/or other suitable layers. The various layers in the dummy gate structures 310a and 310b may be formed by suitable deposition techniques and patterned by suitable photolithography and etching techniques. The dummy gate structure 310a engages the fin structures 304a on two or three sides of the fin structure 304a, and the dummy gate structure 310b engages the fin structures 304b on two or three sides of the fin structure 304b. Source or drain regions 308a are disposed in opposing regions of the fin structures 304a with respect to the dummy gate structure 310a. Similarly, source or drain regions 308b are disposed in opposing regions of the fin structures 304b with respect to the dummy gate structure 310b. Some source or drain regions may be shared between various transistors, and other source/drain regions that are not illustrated as being shared may be shared with neighboring transistors that are not illustrated, for example. In some implementations, various ones of the source or drain regions may be connected or coupled together such that FinFETs are implemented as two functional transistors. For example, if neighboring (e.g., as opposed to opposing) source or drain regions 308a or 308b are electrically connected, such as through coalescing the regions by epitaxial growth (e.g., neighboring source/drain regions, as opposed to on opposing sides of a dummy gate structure 310a or 310b, being coalesced), two functional transistors may be implemented. Other configurations in other examples may implement other numbers of functional transistors.

The term, "dummy", as described here, refers to a sacrificial structure which will be removed in a later stage and will be replaced with another structure, such as a high-k dielectric and metal gate structure in a replacement gate process. The replacement gate process refers to manufacturing a gate structure at a later stage of the overall gate manufacturing process. The gate dielectric layers 312a and 312b may include a dielectric oxide layer. For example, the dielectric oxide layer may be formed by chemical oxidation, thermal oxidation, atomic layer deposition (ALD), chemical vapor deposition (CVD), and/or other suitable methods. The gate electrode layers 314a and 314b may be a poly-silicon layer or other suitable layers. For example, the gate electrode layers 314a and 314b may be formed by suitable deposition processes such as low-pressure chemical vapor deposition (LPCVD) and plasma-enhanced CVD (PECVD). The hard mask layers 316a and 316b may be any material suitable to pattern the gate electrode layer 314a and 314b, respectively, with desired features/dimensions on the substrate.

In some implementations, the various layers of the dummy gate structures 310a and 310b are first deposited as blanket layers. Then, the blanket layers are patterned through a process including photolithography and etching processes, removing portions of the blanket layers and keeping the remaining portions over the STI layers 306a and 306b and the fin structures 304a and 304b to form the dummy gate structures 310a and 310b.

FIG. 3 further illustrates reference cross-sections that are used in later figures, including FIGS. 3A-8H. Cross-section A-A is in a plane along the channels in a fin structure 304a between opposing source/drain regions 308a. Cross-section B-B is in a plane along the channels in a fin structure 304b between opposing source/drain regions 308b. Cross-section C-C is in a plane perpendicular to cross-section A-A and is across a source or drain region 308a in fin structure 304a. Cross-section D-D is in a plane perpendicular to cross-section B-B and is across a source or drain region 308b in fin structure 304b. Subsequent figures refer to these reference cross-sections for clarity. In some figures, some reference numbers of components or features illustrated therein may be omitted to avoid obscuring other components or features for ease of depicting the figures.

One or more attributes of the structures and/or layers of the electronic device 204 and/or the electronic device 206 may be configured to increase and/or optimize one or more performance parameters of the electronic device 204 and/or the electronic device 206 for particular types of devices. For example, the fin height of the fin structures 304a (e.g., between the tops of the fin structures 304a and the top surfaces of the STI layers 306a) may be decreased, the width of a source or drain contact included in the electronic device may be decreased, the height of an epitaxial region (e.g., a source or drain region) included in the electronic device 204 may be decreased, the distance between an epitaxial region and a gate (e.g., a replacement gate that replaces the dummy gate structure 310a) included in the electronic device 204 may be increased to increase power efficiency, reduce capacitance, and/or increase transistor density in implementations in which the electronic device 204 includes an SoC device. As another example, the fin height of the fin structures 304b (e.g., between the tops of the fin structures 304b and the top surfaces of the STI layers 306b) may be increased, the width of a source or drain contact included in the electronic device 206 may be increased, the height of an epitaxial region (e.g., a source or drain region) included in the electronic device 206 may be increased, and/or the distance between an epitaxial region a gate (e.g., a replacement gate that replaces the dummy gate structure 310b) included in the electronic device 206 may be decreased to increase drive current, reduce channel resistance ($R_{ch}$), reduce contact resistance ($R_{esd}$), and/or reduce extension resistance ($R_{ext}$) and current crowding ($R_{sd}$) in implementations in which the device 300 includes an HPC device or an analog device. As another example, the fin height of the fin structures 304b may be increased and/or the distance between an epitaxial region and a gate of the electronic device 206 may be decreased to decrease hot carrier injection, decrease junction leakage, and/or reduce contact resistance ($R_{esd}$) in implementations in which the electronic device 206 includes an I/O device or a diode device.

In some implementations, other attributes of the structures and/or layers included in the electronic devices 204 and/or 206 are configured to increase various performance parameters of the electronic devices 204 and/or 206 (e.g., on-current, capacitance, sub-threshold leakage, junction leakage, hot carrier injection, resistance, power consumption, and/or drive current, among other examples), such as quantity of fin structures 304a and/or 304b, the fin pitch (or fin spacing) of the fin structures 304a and/or 304b, the width of the source or drain contacts parallel to the long dimension of the gates included in the electronic devices 204 and/or 206, and/or the width of the gates included in the electronic devices 204 and/or 206, among other examples.

As indicated above, FIG. 3 is provided as an example. Other examples may differ from what is described with regard to FIG. 3.

FIGS. 4A-4G are diagrams of an example implementation 400 described herein. The example implementation 400 includes an example of forming finFET fin structures (e.g., fin structures 304) to different fin heights for different types of electronic devices on the same semiconductor substrate. In this way, one or more performance parameters for different types of electronic devices on the same semiconductor substrate are increased and/or optimized using the techniques described in connection with FIGS. 4A-4G. FIGS. 4A-4G are illustrated from the perspective of the cross-sectional plane C-C in FIG. 3 for the electronic device 204, and from the perspective of the cross-sectional plane D-D in FIG. 3 for the electronic device 206.

Figure 4A:
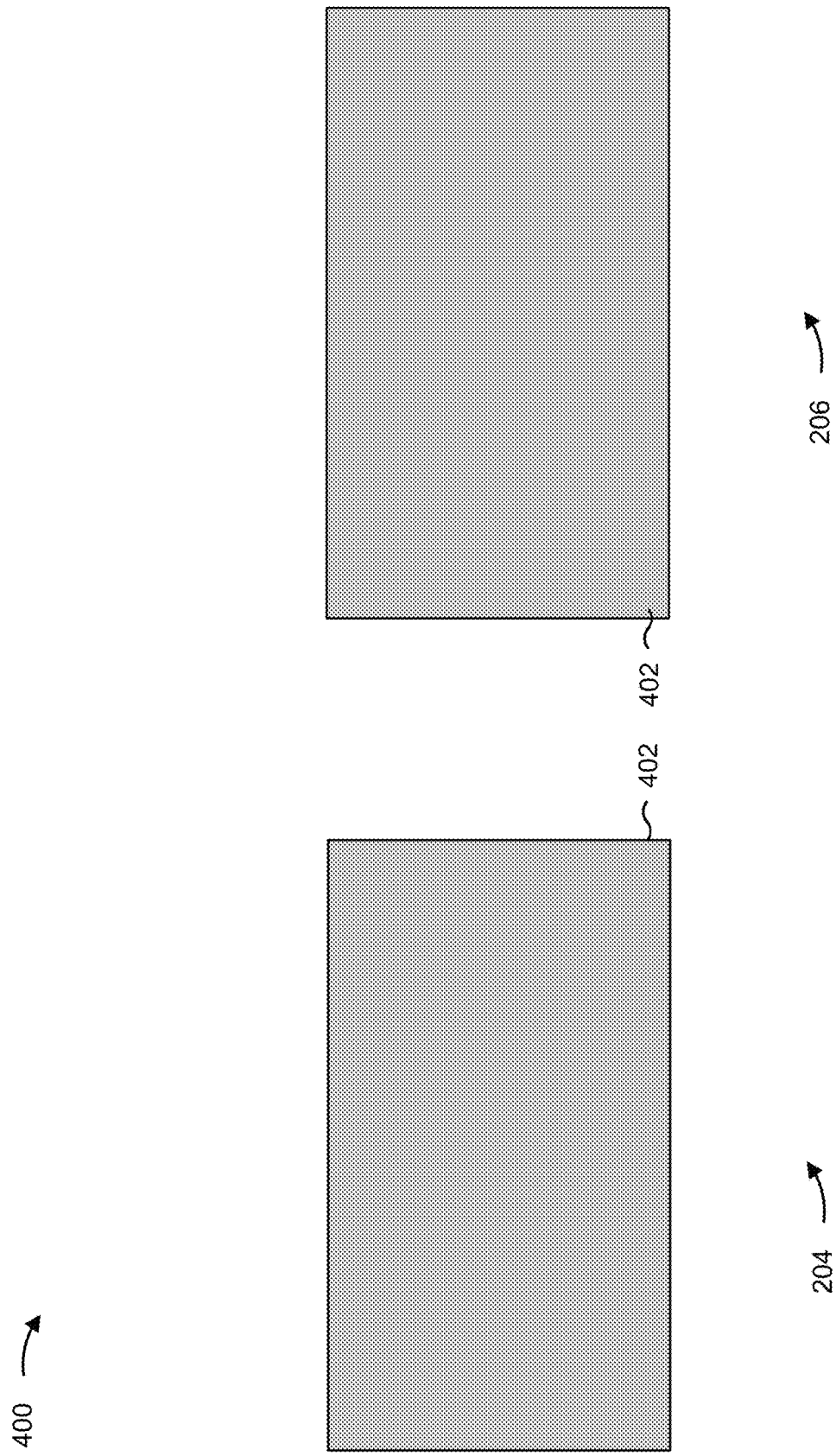

As shown in FIG. 4A, the example implementation 400 includes an electronic device 204 and an electronic device 206. The electronic devices 204 and 206 are formed on a substrate 402 (e.g., the same substrate) such as the semiconductor substrate 200. The electronic devices 204 and 206 include different types of electronic devices. For example, the electronic device 204 may include an SoC device and the electronic device 206 may include an HPC device, an I/O device, a diode device, or an analog device, among other examples.

Figure 4B:
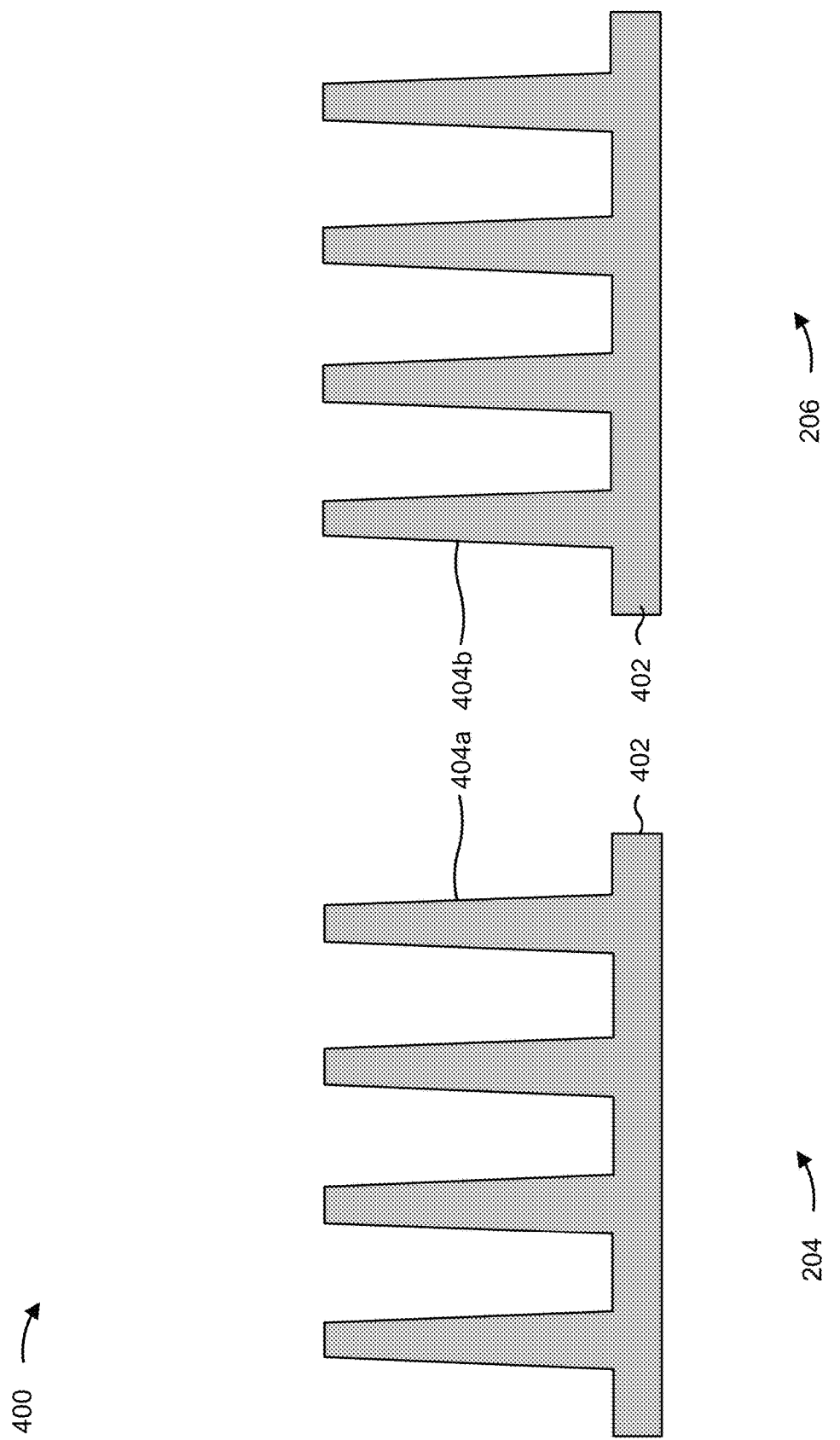

As shown in FIG. 4B, fin structures (e.g., fin structures 304) are formed in the substrate 402 for the electronic devices 204 and 206. In particular, a first plurality of fin structures 404a are formed in the substrate 402 for the electronic device 204, and a second plurality of fin structures 404b are formed in the substrate 402 for the electronic device 206.

In some implementations, a pattern in a photoresist layer is used to form the fin structures 404a and 404b. In these implementations, the deposition tool 102 forms the photoresist layer on the substrate 402. The exposure tool 104 exposes the photoresist layer to a radiation source to pattern the photoresist layer. The developer tool 106 develops and removes portions of the photoresist layer to expose the pattern. The etch tool 108 etches into the substrate 402 to form the fin structures 404a and 404b. In some implementations, the etch operation includes a plasma etch technique, a wet chemical etch technique, and/or another type of etch technique. In some implementations, a photoresist removal tool removes the remaining portions of the photoresist layer (e.g., using a chemical stripper, plasma ashing, and/or another technique). In some implementations, a hard mask layer is used as an alternative technique for forming the fin structures 404a and 404b based on a pattern.

Figure 4C:
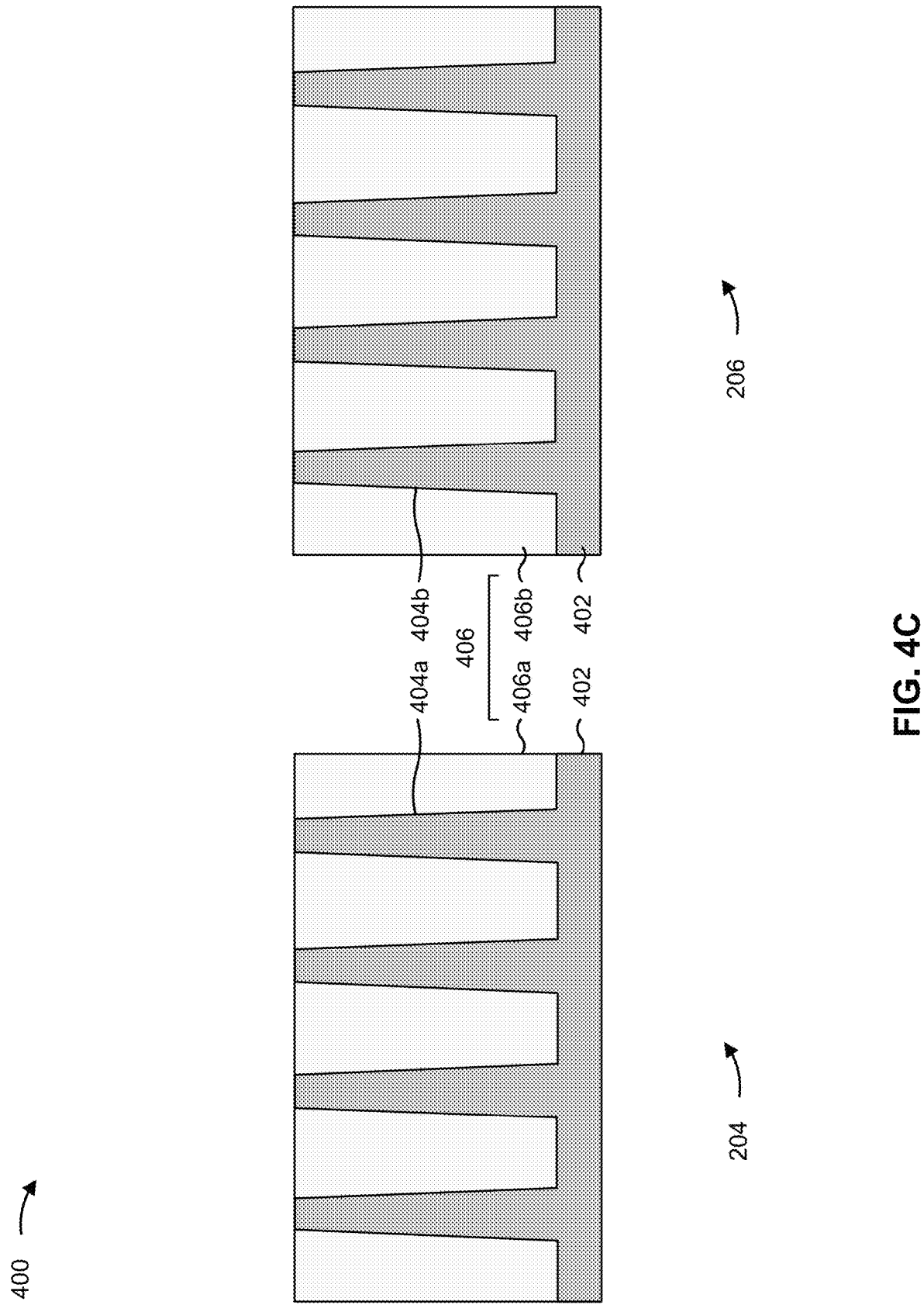

As shown in FIG. 4C, a shallow trench isolation (STI) layer 406 is formed in between the fin structures 404a and 404b. A portion 406a of the STI layer 406 is formed in between the fin structures 404a of the electronic device 204, and a portion 406b of the STI layer 406 is formed in between the fin structures 404b of the electronic device 206. The deposition tool 102 deposits the STI layer 406 by a CVD technique, a PVD technique, an ALD technique, a deposition technique described above in connection with FIG. 1, and/or another deposition technique. In some implementations, the planarization tool 110 performs a planarization or polishing operation to planarize the STI layer 406.

Figure 4D:
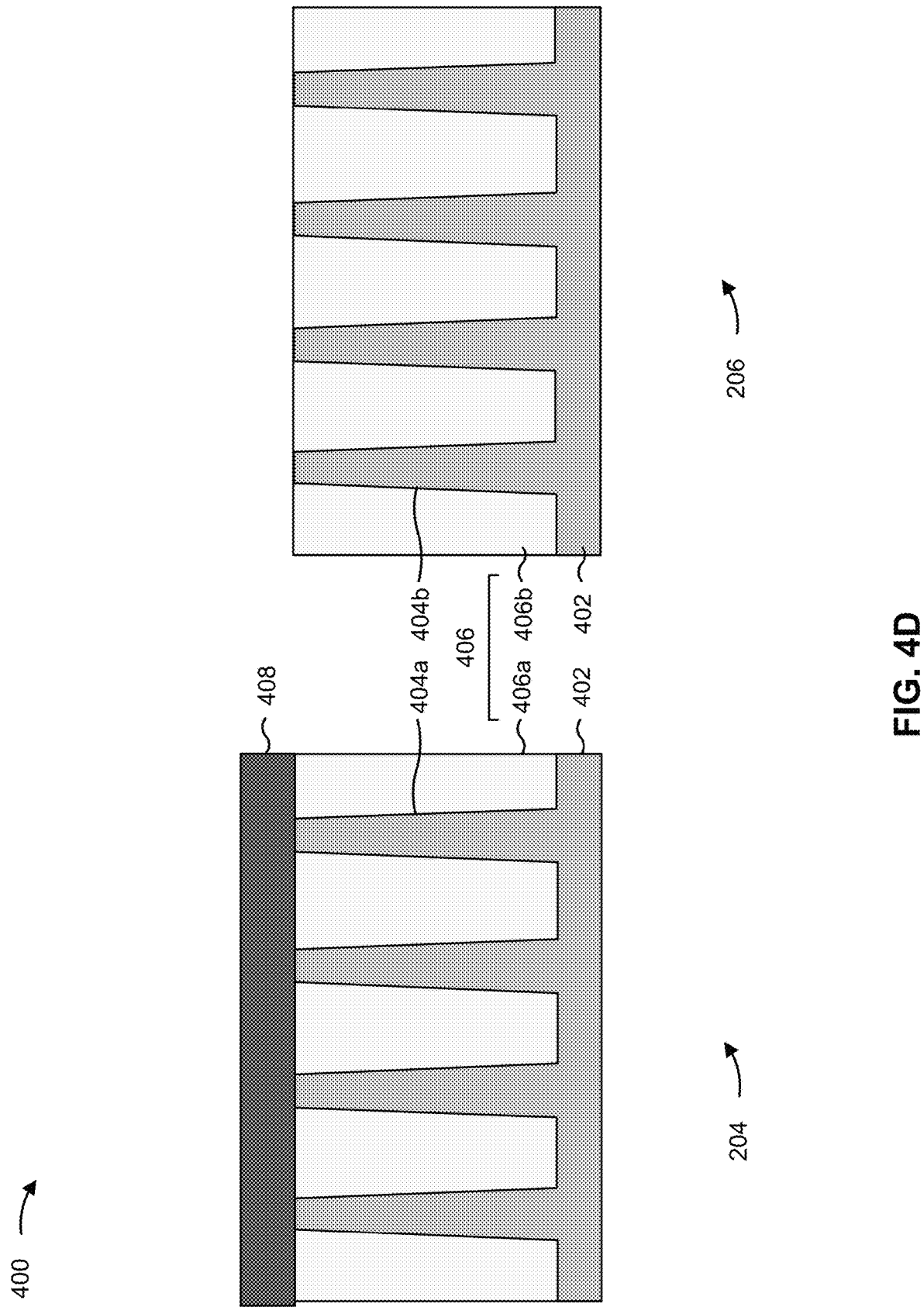

As shown in FIG. 4D, a photoresist layer 408 is formed on the portion 406a of the STI layer 406 and the fin structures 404a of the electronic device 204. The deposition tool 102 forms the photoresist layer 408 by a spin-coating technique or another deposition technique.

Figure 4E:
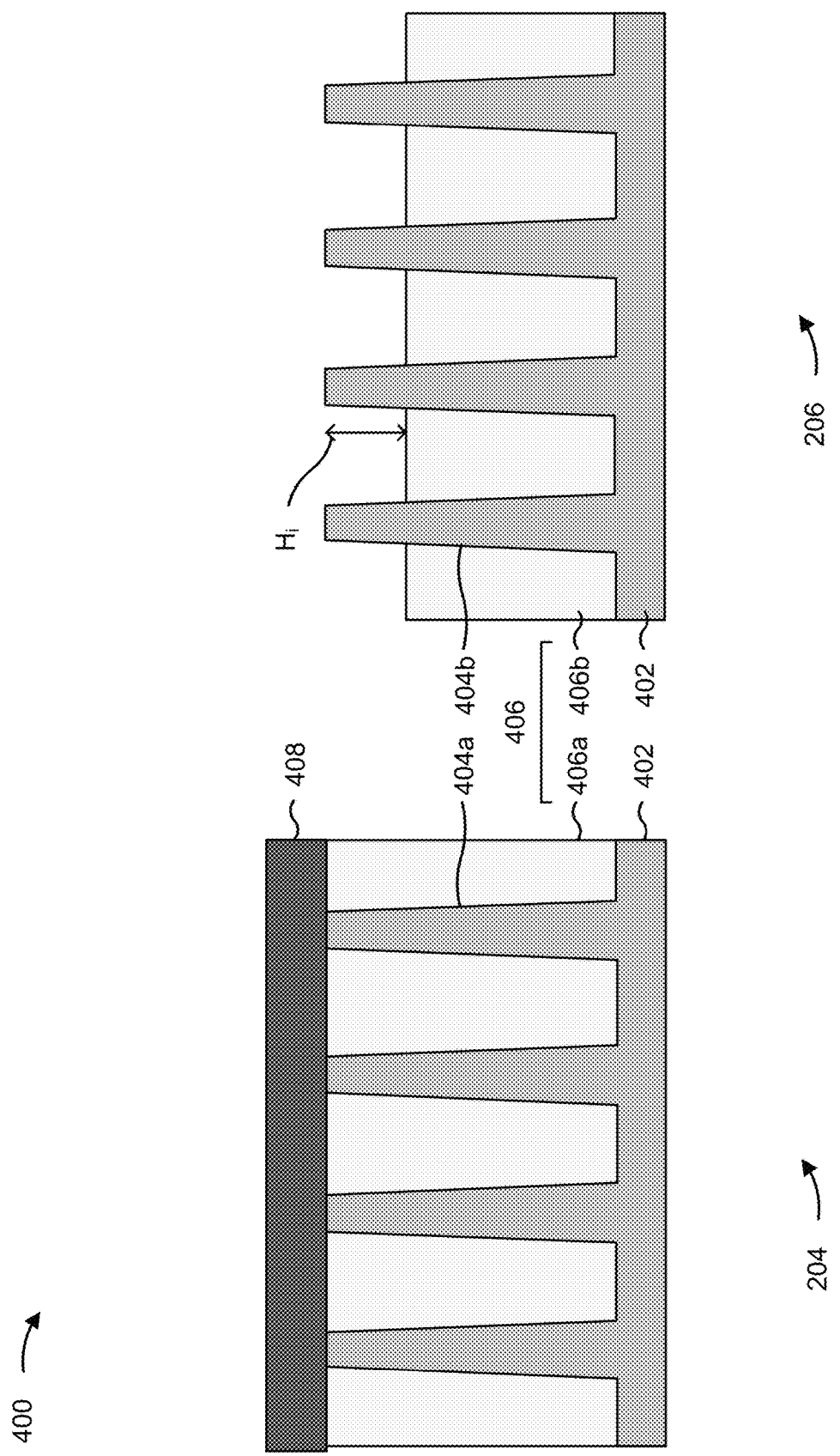

As shown in FIG. 4E, the portion 406b of the STI layer 406 between the fin structures 404b of the electronic device 206 is etched back in a first etch operation to expose portions of the fin structures 404b of the electronic device 206. The etch tool 108 etches a portion 406b of the STI layer 406 to expose the portions of the fin structures 404b. In some implementations, the first etch operation includes a plasma etch technique, a wet chemical etch technique, and/or another type of etch technique. The etch tool 108 etches the portion 406b of the STI layer 406 such that the fin height of the fin structures 404b of the electronic device 206, between a top of the fin structures 404b and a top surface of the portion 406b of the STI layer 406 as shown in FIG. 4E, is etched to an initial fin height ($H_i$).

The initial fin height ($H_i$) may be in a range of approximately 10 nanometers to approximately 20 nanometers to achieve a particular fin height in a subsequent etch operation for the fin structures 404b. However, other values for the initial fin height ($H_i$) are within the scope of the present disclosure. Additionally and/or alternatively, the portion 406b of the STI layer 406 is etched in the first etch operation such that a ratio between the initial fin height ($H_i$) and the final fin height (or subsequent fin height) after a second etch operation is in a range of approximately 1:8 to approximately 1:2. However, other values for the ratio are within the scope of the present disclosure. In some implementations, the portion 406b of the STI layer 406 is etched such that the fin structures 404a and 404b are formed to different fin heights in the same subsequent etch operation. In other words, the portion 406b of the STI layer 406 is etched to a depth in the first etch operation such that the portion 406a and the portion 406b can be etched together in a second etch operation to achieve desired fin heights for the fin structures 404a and 404b. Accordingly, the depth of (or amount of material removed from) the portion 406b of the STI layer 406 after the first etch operation may be based on the desired difference in fin height between the fin structures 404a and 404b.

Figure 4F:
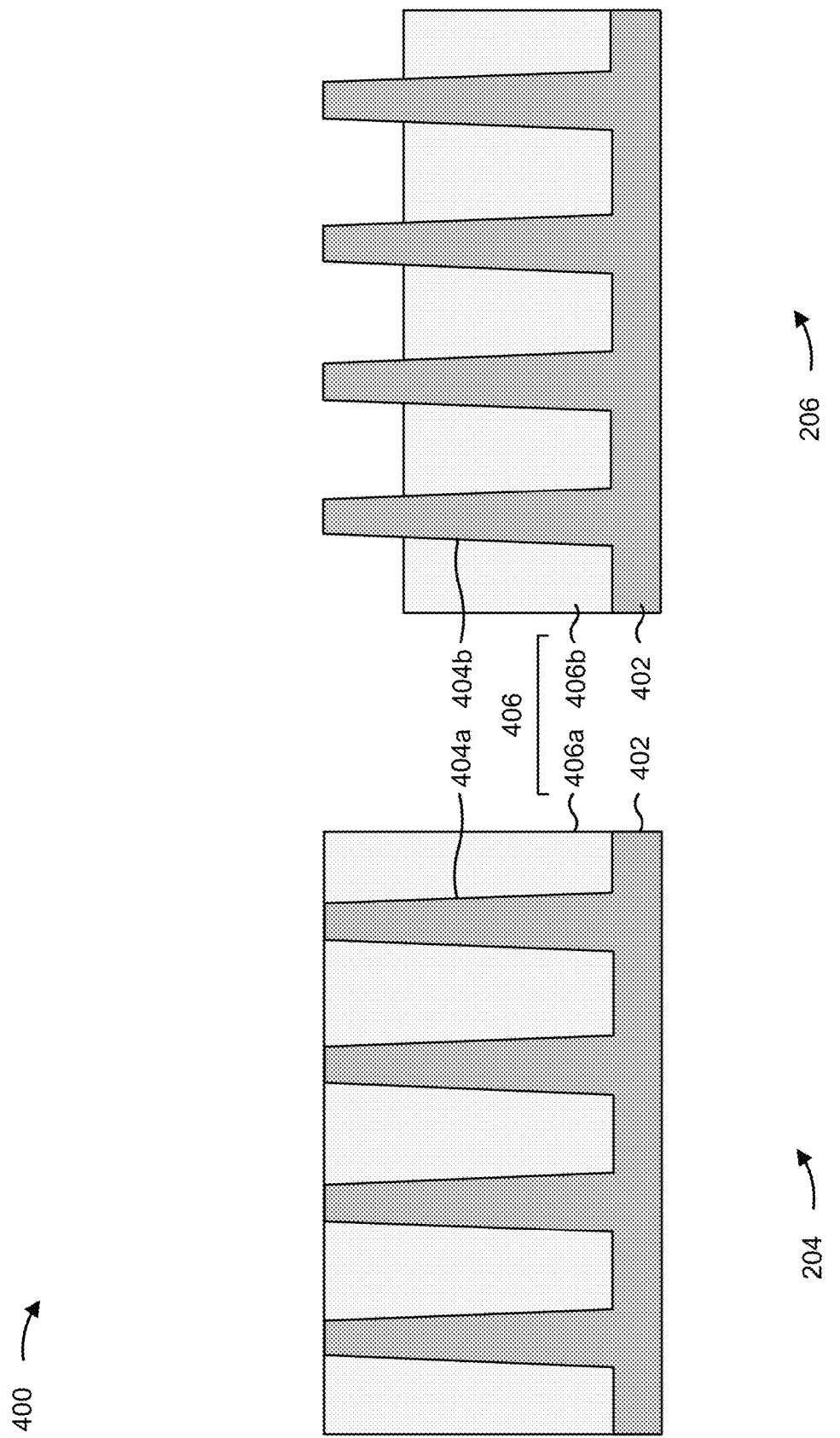

As shown in FIG. 4F, the photoresist layer 408 is removed from the portion 406a of the STI layer 406 and from the fin structures 404a of the electronic device 204. In particular, the photoresist layer 408 is removed after the first etch operation to etch back the portion 406b of the STI layer 406 such that the fin height of the fin structures 404b of the electronic device 206 is etched to the initial fin height. In some implementations, a photoresist removal tool removes the photoresist layer 408 using a chemical stripper, plasma ashing, and/or another technique.

Figure 4G:
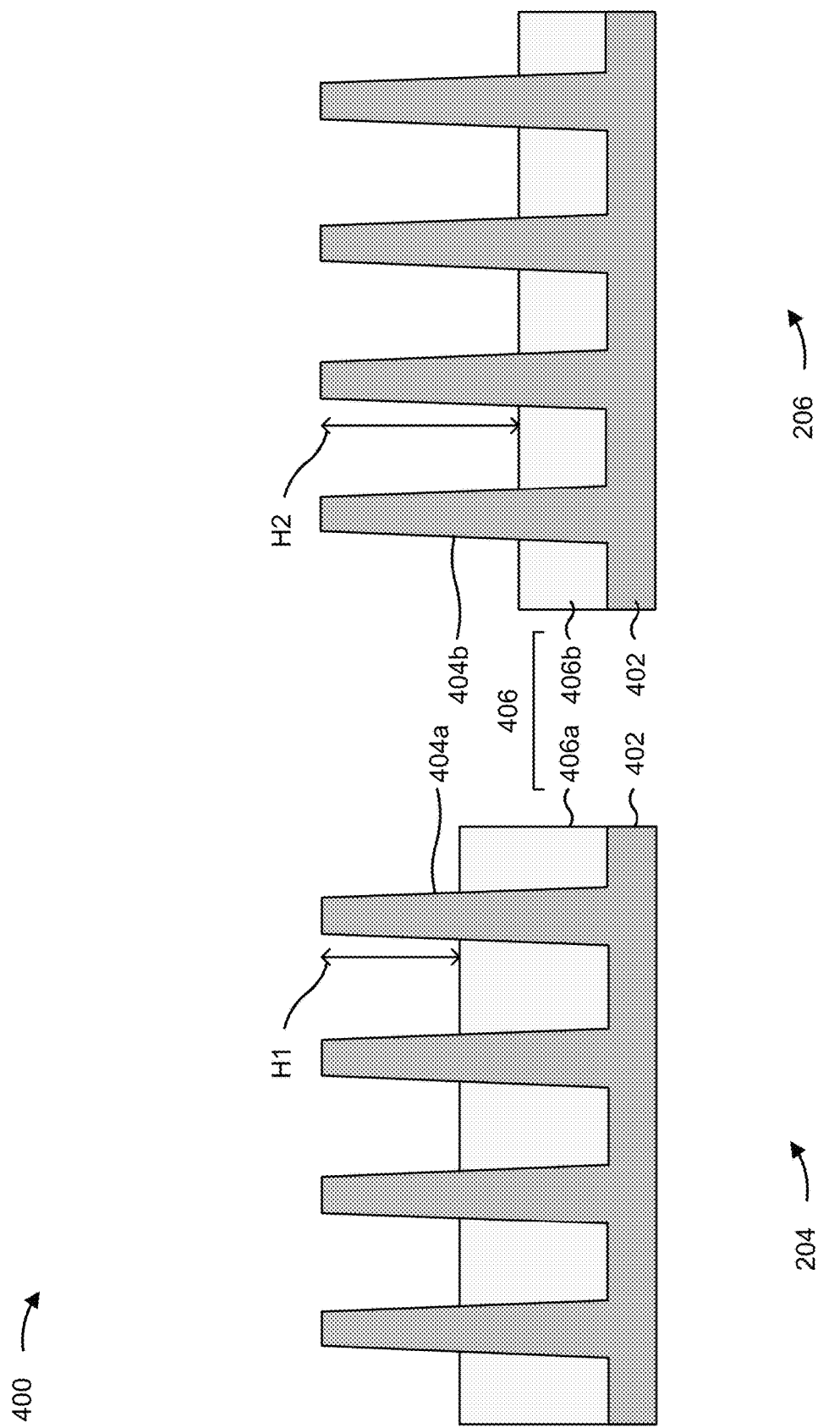

As shown in FIG. 4G, the portions 406a and 406b of the STI layer 406 are both etched in a second etch operation after removing the photoresist layer 408. The second etch operation includes etching the portion 406a of the STI layer 406 of the electronic device 204 to a fin height (H1) between a top of the fin structures 404a and a top of the portion 406a of the STI layer 406. Moreover, the second etch operation includes etching the portion 406b of the STI layer 406 of the electronic device 206 from the initial fin height to a fin height (H2). In some implementations, the second etch operation includes a plasma etch technique, a wet chemical etch technique, and/or another type of etch technique.

As further shown in FIG. 4G, etching the portion 406b of the STI layer 406 of the electronic device 206 in the first etch operation enables the portion 406b of the STI layer 406 of the electronic device 206 to be etched further (e.g., further from the initial fin height ($H_i$)) in the second etch operation relative to the portion 406a of the STI layer 406 of the electronic device 204. In this way, the fin height (H2) of the electronic device 206 is greater relative to the fin height (H1) of the electronic device 204 (and is greater than the initial fin height of the electronic device 206). The greater fin height of the electronic device 206 relative to the electronic device 204 may result in a lesser channel resistance for the transistors (e.g., transistors 356) included in the electronic device 206 relative to the transistors (e.g., transistors 356) included in the electronic device 204.

In some implementations, the fin height (H1) of the electronic device 204 is in a range of approximately 30 nanometers to approximately 60 nanometers to achieve low on-current while maintaining sufficient short channel control and low leakage below the fin structures 404a for the electronic device 204. However, other values for the fin height (H1) of the electronic device 204 are within the scope of the present disclosure. In some implementations, the fin height (H2) of the electronic device 206 is in a range of approximately 40 nanometers to approximately 80 nanometers to provide low channel resistance while maintaining good parasitic capacitance and parasitic resistance performance and while reducing the likelihood fin bending, fin collapse, and/or dummy poly line bending or collapse for the electronic device 206. However, other values for the fin height (H2) of the electronic device 206 are within the scope of the present disclosure. In some implementations, the portions 406a and 406b of the STI layer 406 are etched to achieve a ratio between the fin height (H1) and the fin height (H2) in a range of approximately 3:8 to approximately 3:4 to permit device parameters and/or attributes to be independently optimized for SoC devices and HPC devices.

In this way, the different fin heights (H1) and (H2), and/or the ratio between the fin height (H1) and the fin height (H2) provides the electronic devices 204 and 206 with different transistor device performance characteristics and/or attributes on the same substrate 402. This enables the transistors of the electronic devices 204 and 206 to be optimized for the device types of the electronic devices 204 and 206. In particular, the fin height (H1) (e.g., between the top of the fin structures 404a and the top surface of the portion 406a of the STI layer 406) being less than the fin height (H2) (e.g., between the top of the fin structures 404b and the top surface of the portion 406b of the STI layer 406) provides the transistors of the electronic device 204 (which includes an SoC device) with greater power efficiency and lower capacitance than the transistors of the electronic device 206 (which includes an HPC device, an I/O device, a diode device, or an analog device). The fin height (H2) (e.g., between the top of the fin structures 404b and the top surface of the portion 406b of the STI layer 406) being greater than the fin height (H1) (e.g., between the top of the fin structures 404a and the top surface of the portion 406a of the STI layer 406) provides the transistors of the electronic device 206 (which includes an HPC device, an I/O device, a diode device, or an analog device) with lower channel resistance and higher drive current than the transistors of the electronic device 204 (which includes an SoC device).

As indicated above, FIGS. 4A-4G is provided as an example. Other examples may differ from what is described with regard to FIGS. 4A-4G.

Figure 5A:
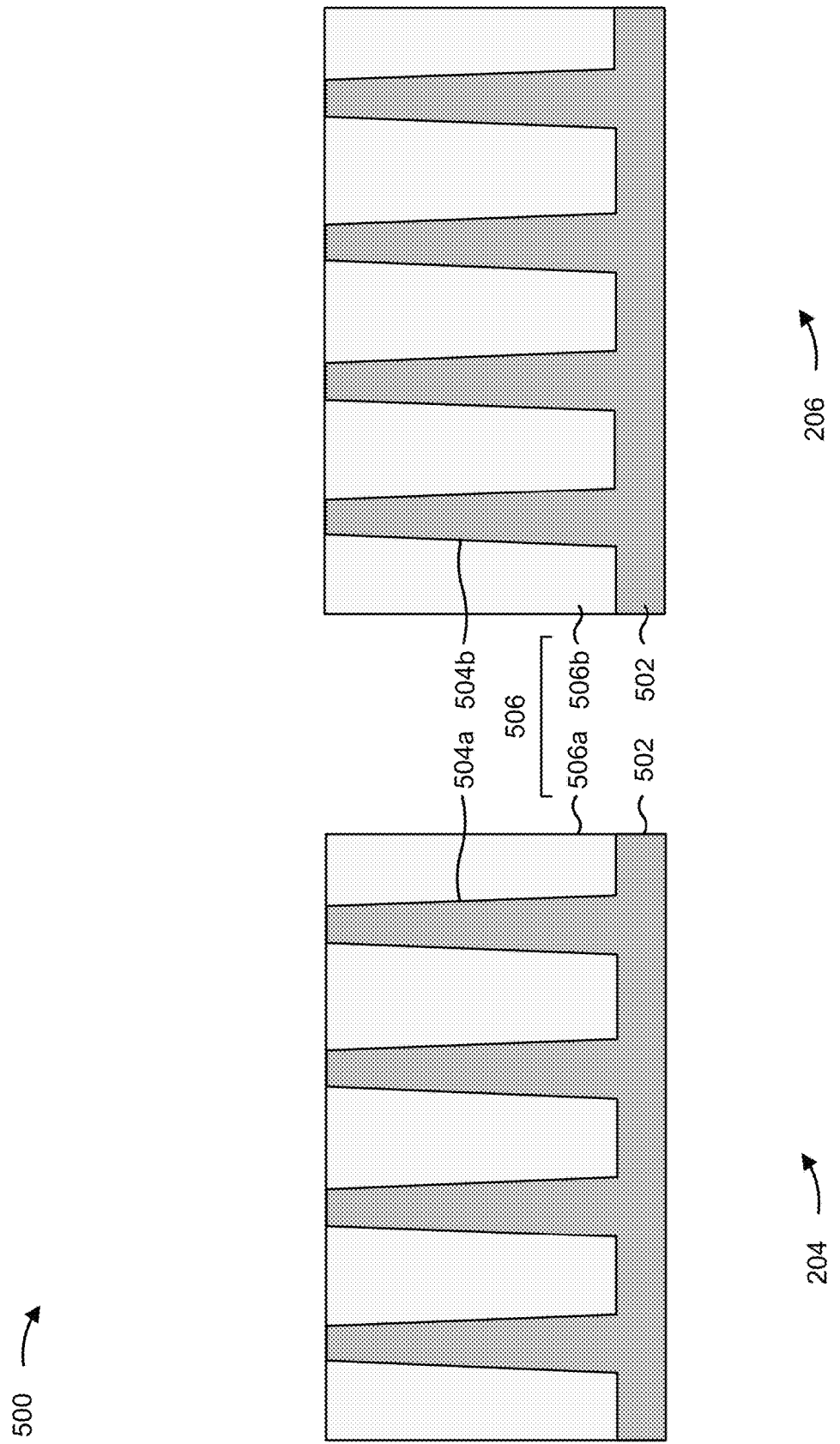

FIGS. 5A-5F are diagrams of an example implementation 500 described herein. The example implementation 500 is an alternative implementation to the example implementation 400 of forming finFET fin structures to different fin heights for different types of electronic devices on the same semiconductor substrate. FIGS. 5A-5F are illustrated from the perspective of the cross-sectional plane C-C in FIG. 3 for the electronic device 204, and from the perspective of the cross-sectional plane D-D in FIG. 3 for the electronic device 206. As shown in FIG. 5A, the electronic devices 204 and 206 are formed on the same substrate 502 such as the semiconductor substrate 200. The fin structures 504a and 504b and the STI layer 506 (including portions 506a and 506b) of the electronic devices 204 and 206, respectively, may be formed by similar techniques as described in connection with FIGS. 4A-4C.

Figure 5B:
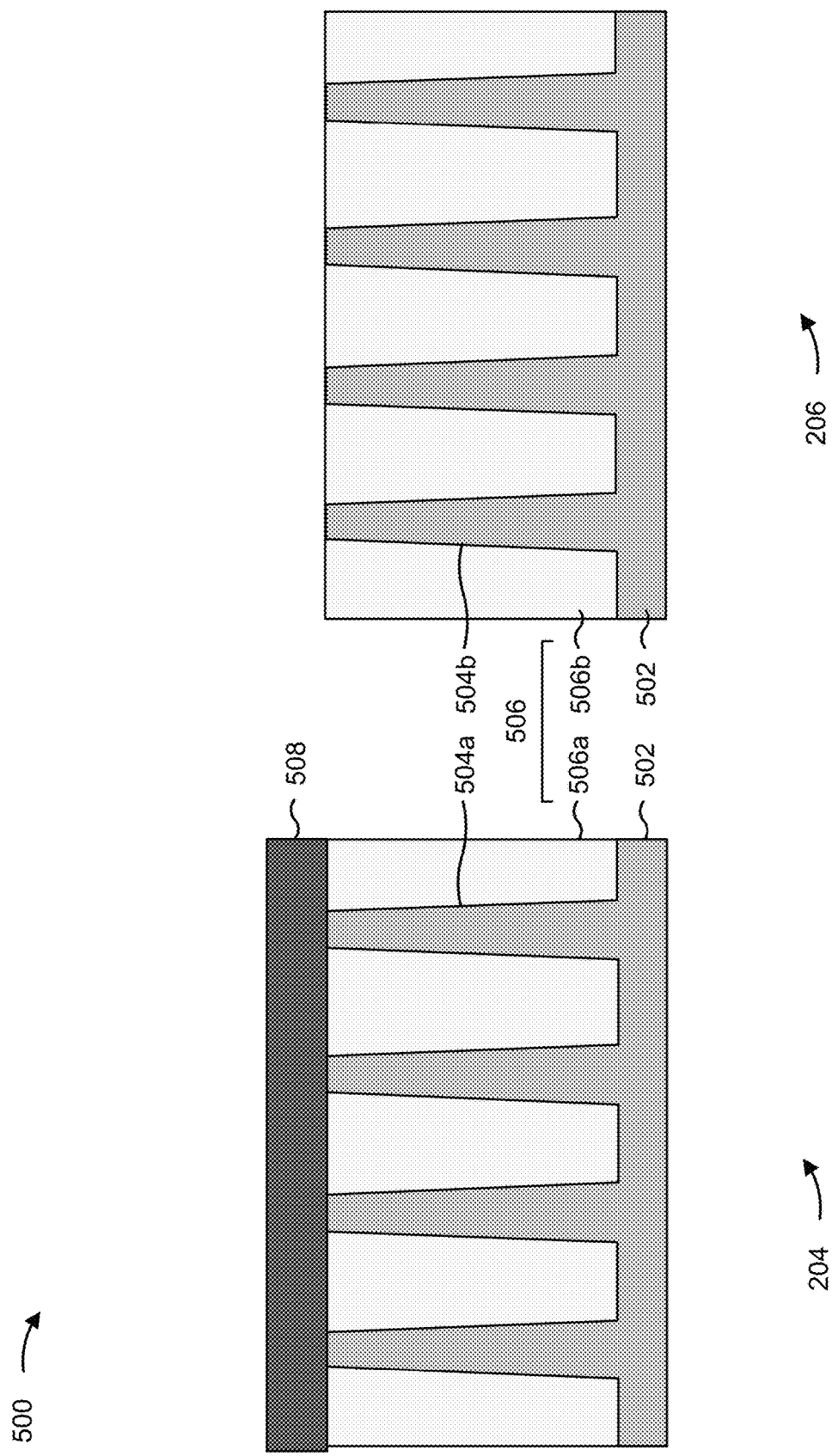

As shown in FIG. 5B, a photoresist layer 508 is formed on the portion 506a of the STI layer 506 and the fin structures 504a of the electronic device 204. The deposition tool 102 forms the photoresist layer 508 by a spin-coating technique or another deposition technique.

Figure 5C:
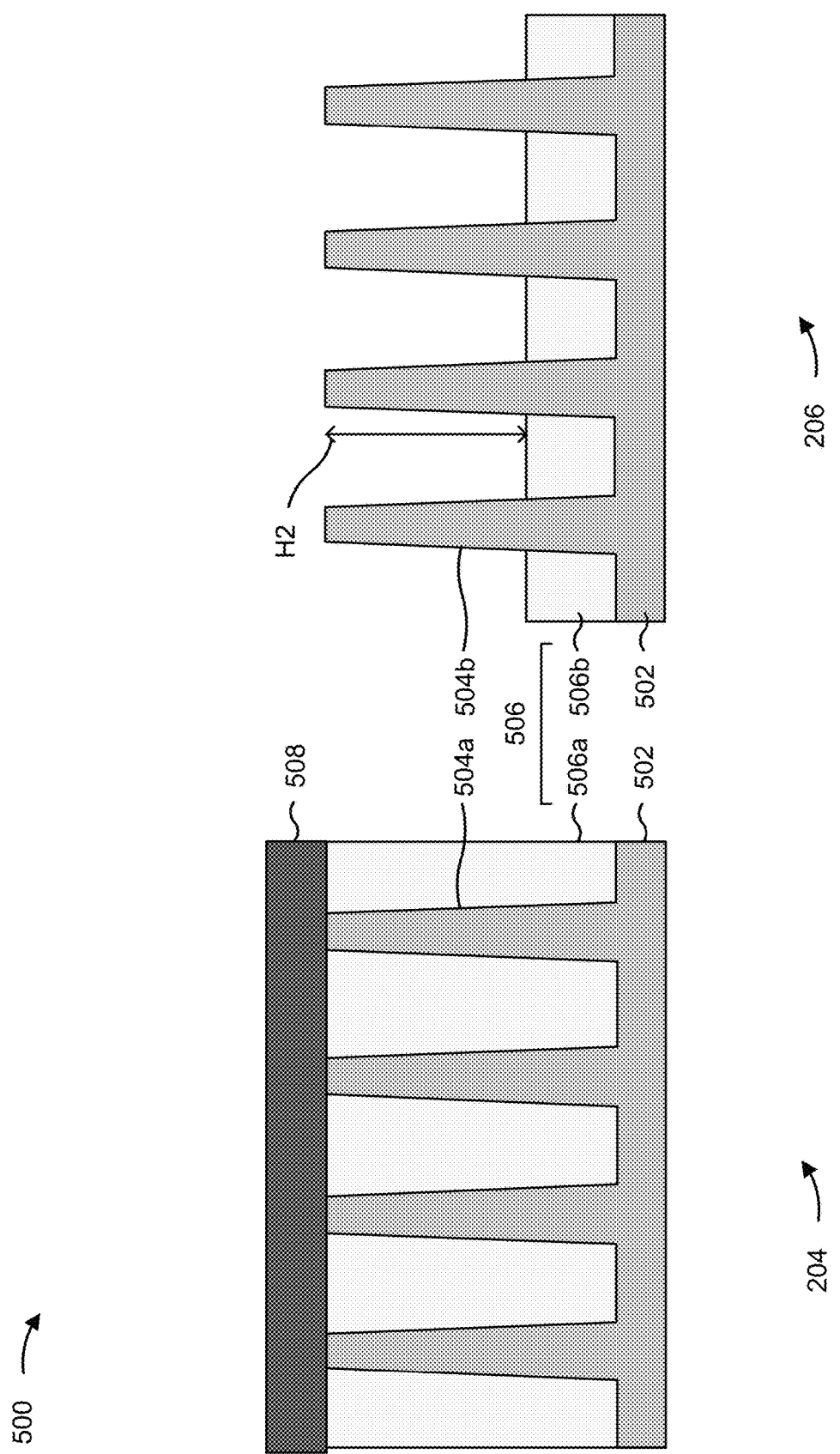

As shown in FIG. 5C, the portion 506b of the STI layer 506 between the fin structures 504b of the electronic device 206 is etched back in a first etch operation to expose portions of the fin structures 504b of the electronic device 206. In some implementations, the first etch operation includes a plasma etch technique, a wet chemical etch technique, and/or another type of etch technique. The etch tool 108 etches a portion 506b of the STI layer 506 to expose the portions of the fin structures 504b. The etch tool 108 etches the portion 506b of the STI layer 506 such that the fin height of the fin structures 504b of the electronic device 206, between a top of the fin structures 504b and a top of the portion 506b of the STI layer 506, is etched to the fin height (H2) described in connection with FIG. 4G.

Figure 5D:
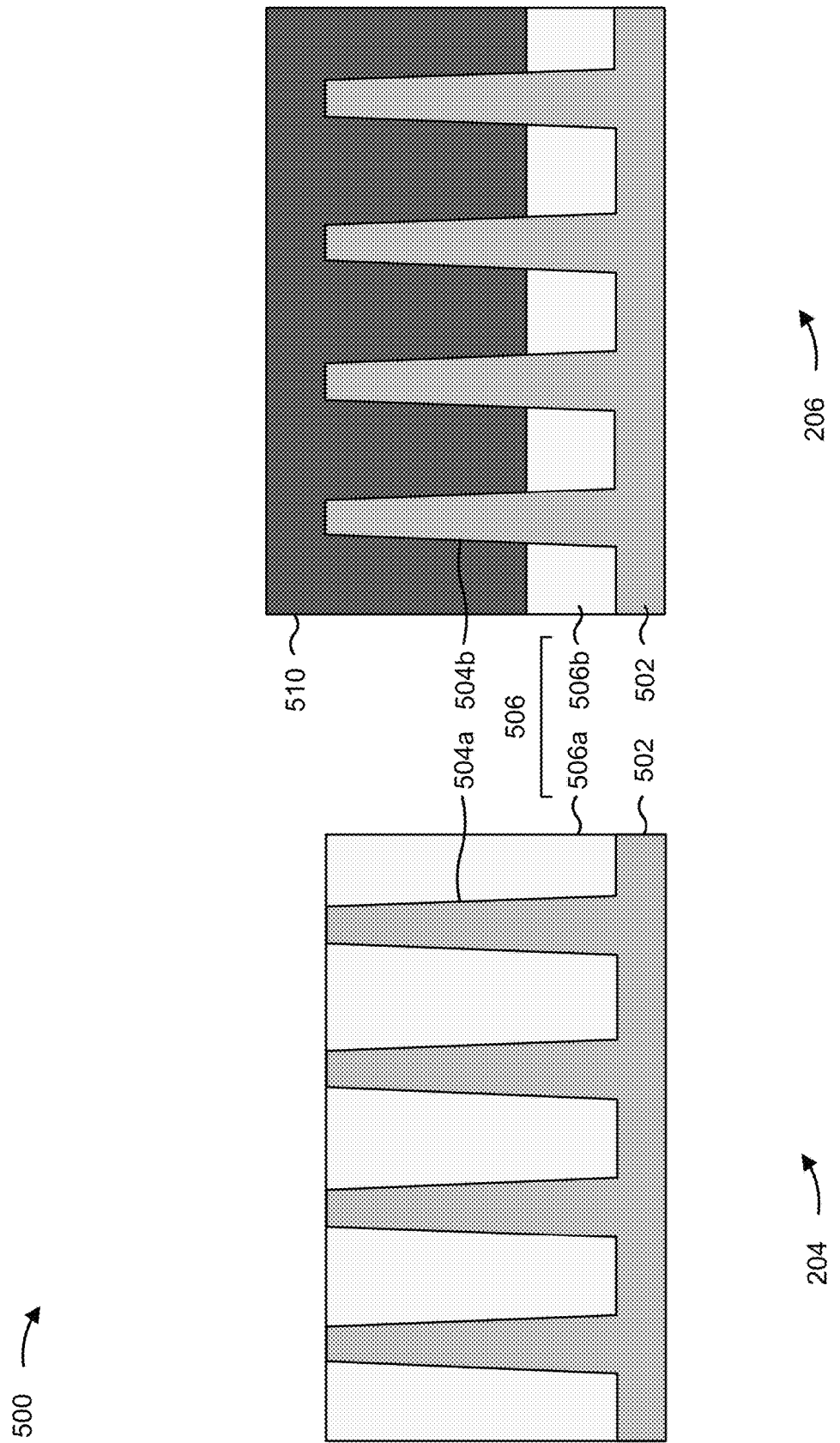

As shown in FIG. 5D, the photoresist layer 508 is removed from the portion 506a of the STI layer 506 and from the fin structures 504a of the electronic device 204. In particular, the photoresist layer 508 is removed after the first etch operation to etch back the portion 506b of the STI layer 506 such that the fin height of the fin structures 504b of the electronic device 206 is etched to the fin height (H2). In some implementations, a photoresist removal tool removes the photoresist layer 508 using a chemical stripper, plasma ashing, and/or another technique.

As further shown in FIG. 5D, a photoresist layer 510 is formed on the portion 506b of the STI layer 506 and the fin structures 504b of the electronic device 206. The photoresist layer 510 is formed after removal of the photoresist layer 508. The deposition tool 102 forms the photoresist layer 510 by a spin-coating technique or another deposition technique.

As shown in FIG. 5E, the portion 506a of the STI layer 506 between the fin structures 504a of the electronic device 204 is etched back in a second etch operation to expose portions of the fin structures 504a of the electronic device 204. In some implementations, the second etch operation includes a plasma etch technique, a wet chemical etch technique, and/or another type of etch technique. The etch tool 108 etches a portion 506a of the STI layer 506 to expose the portions of the fin structures 504a. The etch tool 108 etches the portion 506a of the STI layer 506 such that the fin height of the fin structures 504a of the electronic device 204, between a top of the fin structures 504a and a top of the portion 506a of the STI layer 506, is etched to the fin height (H1) described in connection with FIG. 4G.

Figure 5F:
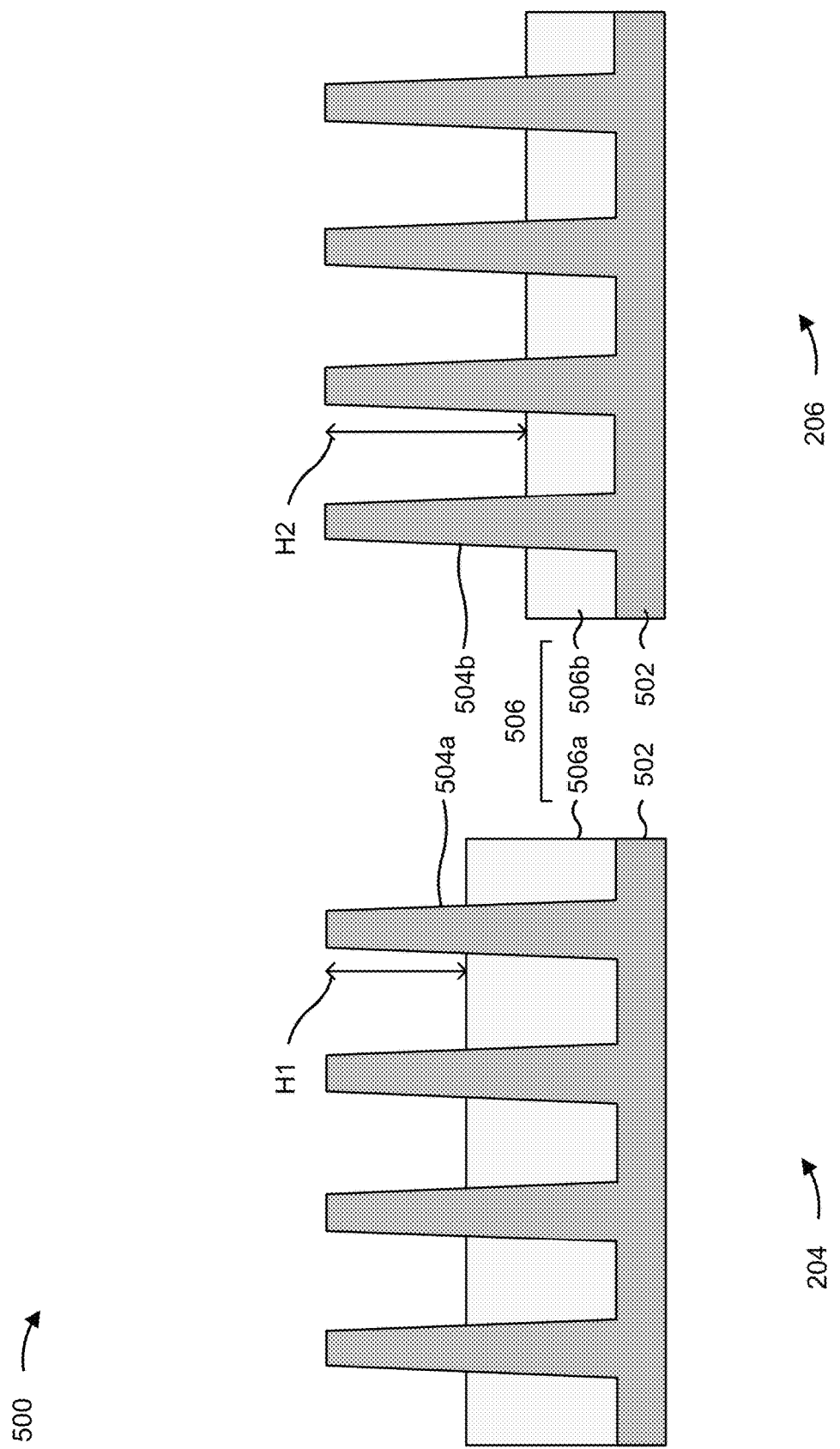

As shown in FIG. 5F, the photoresist layer 510 is removed from the portion 506b of the STI layer 506 and from the fin structures 504b of the electronic device 206. In particular, the photoresist layer 510 is removed after the second etch operation to etch back the portion 506a of the STI layer 506 such that the fin height of the fin structures 504a of the electronic device 204 is etched to the fin height (H1). In some implementations, a photoresist removal tool removes the photoresist layer 510 using a chemical stripper, plasma ashing, and/or another technique.

As indicated above, FIGS. 5A-5F is provided as an example. Other examples may differ from what is described with regard to FIGS. 5A-5F. As an example, the portions 506a and 506b of the STI layer 506 may be etched in a different order than the order described above in connection with FIGS. 5A-5F. In these implementations, the photoresist layer 510 is formed on the fin structures 504b and on the portion 506b of the STI layer 506, the portion 506a of the STI layer 506 is then etched back to the fin height (H1), the photoresist layer 510 is removed after etching the portion 506a of the STI layer 506, the photoresist layer 508 is then formed on the fin structures 504a and on the portion 506a of the STI layer 506, and the portion 506b of the STI layer 506 is then etched back to the fin height (H2) after forming the photoresist layer 508.

FIGS. 6A-6G are diagrams of an example implementation 600 described herein. The example implementation 600 includes an example of forming finFET epitaxial regions (e.g., source or drain regions or epitaxial regions 328) to different heights and/or distances to associated gates for different types of electronic devices on the same semiconductor substrate. In this way, one or more performance parameters for different types of electronic devices on the same semiconductor substrate are increased and/or optimized using the techniques described in connection with FIGS. 6A-6G. FIGS. 6A-6G are illustrated from the perspective of the cross-sectional plane A-A in FIG. 3 for the electronic device 204, and from the perspective of the cross-sectional plane B-B in FIG. 3 for the electronic device 206.

Figure 6A:
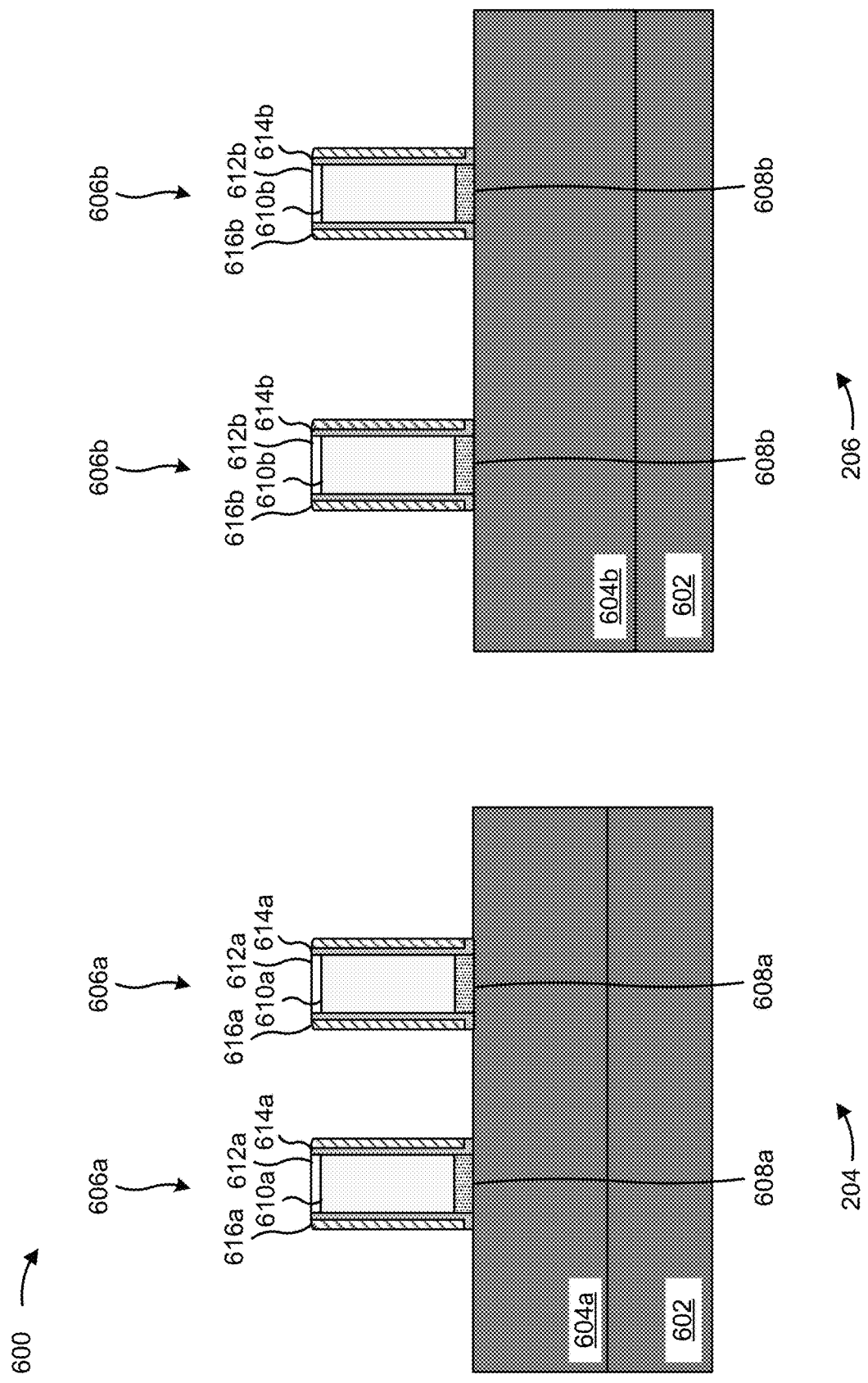

As shown in FIG. 6A, the example implementation 600 includes an electronic device 204 and an electronic device 206. The electronic devices 204 and 206 include different types of electronic devices. For example, the electronic device 204 may include an SoC device and the electronic device 206 may include an HPC device, an I/O device, a diode device, or an analog device, among other examples.

The electronic devices 204 and 206 are formed on a substrate 602 (e.g., the same substrate) such as the semiconductor substrate 200. The electronic device 204 includes one or more fin structures 604a formed in the substrate 602, and the electronic device 206 includes one or more fin structures 604b formed in the substrate 602.

The electronic devices 204 and 206 respectively include dummy gate structures 606a and 606b, respectively. The dummy gate structures 606a are formed and included over the fin structure(s) 604a, and around the sides of the fin structure(s) 604a such that the dummy gate structures 606a surround the fin structure(s) 604a on three sides of the fin structure(s) 604a. The dummy gate structures 606b are formed and included over the fin structure(s) 604b, and around the sides of the fin structure(s) 604b such that the dummy gate structures 606b surround the fin structure(s) 604b on three sides of the fin structure(s) 604b. The dummy gate structures 606a and 606b are formed as a placeholder for the actual gate structures (e.g., replacement high-k gate or metal gate) that are to be formed for the transistors included in the electronic devices 204 and 206. The dummy gate structures 606a and 606b may be formed as part of a replacement gate process, which enables other layers and/or structures to be formed prior to formation of the replacement gate structures.

The dummy gate structures 606a include a gate dielectric layer 608a, a gate electrode layer 610a, and a hard mask layer 612a. The dummy gate structures 606b include a gate dielectric layer 608b, a gate electrode layer 610b, and a hard mask layer 612b. The gate dielectric layers 608a and 608b may include dielectric oxide layers. As an example, the dielectric oxide layers 608a and 608b may be formed by chemical oxidation, thermal oxidation, atomic layer deposition (ALD), chemical vapor deposition (CVD), and/or other suitable methods. The gate electrode layers 610a and 610b may include a poly-silicon layer or other suitable layers. For example, the gate electrode layers 610a and 610b may be formed by suitable deposition processes such as low-pressure chemical vapor deposition (LPCVD) and plasma-enhanced CVD (PECVD). The hard mask layers 612a and 612b may be any material suitable to pattern the gate electrode layers 610a and 610b, respectively, with desired features/dimensions on the substrate. Examples include silicon nitride, silicon oxynitride, silicon carbon nitride, the like, or a combination thereof, deposited by CVD, PVD, ALD, or another deposition technique.

As further shown in FIG. 6A, seal spacers 614a are included on the sidewalls of the dummy gate structures 606a. Similarly, seal spacers 614b are included on the sidewalls of the dummy gate structures 606b. The seal spacers 614a and 614b may be conformally deposited (e.g., by the deposition tool 102) and may include a silicon oxycarbide (SiOC), a nitrogen free SiOC, or another suitable material. The seal spacers 614a and 614b may be formed by an ALD operation in which various types of precursor gasses including silicon (Si) and carbon (C) are sequentially supplied in a plurality of alternating cycles to form the seal spacers 614a and 614b.

The cycles of the ALD operation include alternating flows (or pulses) and purge operations, where each precursor is flowed (or pulsed) and subsequently purged at least once during a cycle. For example, silicon and carbon source precursor is flowed in an ALD tool chamber (e.g., a chamber of the deposition tool 102) into which the substrate 602 is transferred, and subsequently, the silicon and carbon source precursor is purged from the ALD tool chamber. In some examples, the silicon and carbon source precursor may react with reaction sites available on the substrate 602 before being purged. The reactions may saturate the reaction sites, or the silicon and carbon source precursor may not react with some reaction sites available on the substrate 602, in some examples. After the silicon and carbon source precursor is purged, an oxygen source precursor is then flowed in the ALD tool chamber, and subsequently, the oxygen source precursor is purged from the ALD tool chamber. Similarly, in some examples, the oxygen source precursor may react with reaction sites available on the substrate 602 before being purged. The reactions may saturate the reaction sites, or the oxygen source precursor may not react with some reaction sites available on the substrate 602, in some examples. The cycles of the pulses and the purges between the alternating silicon and carbon source precursor and the oxygen source precursor may be performed any number of times until a desired thickness of the seal spacer layers 614a and 614b is achieved.

In some implementations, the seal spacer layers 614a and 614b are treated to form treated seal spacer layers. A surface treatment may be performed on the seal spacer layers 614a and 614b using a plasma. The plasma surface treatment process may efficiently incorporate certain elements to react with the unsaturated bonds in the seal spacer layers 614a and 614b so as to improve the bonding energy and densify the film structure to treat the seal spacer layers 614a and 614b with relatively high film density. The higher film density resulting from treatment orf the seal spacer layers 614a and 614b may prevent the interface and the film stack subsequently formed thereon from plasma damage during the dummy gate removal process. Furthermore, the treatment process may also be performed to modify the morphology and/or surface roughness of the surface of the seal spacer layers 614a and 614b to improve the adhesion and robustness.

As further shown in FIG. 6A, bulk spacer layers 616a may be formed on the seal spacer layers 614a. Similarly bulk spacer layers 616b may be formed on the seal spacer layers 614b. The bulk spacer layers 616a and 616b may be formed of similar materials as the seal spacer layers 614a and 614b. However, the bulk spacer layers 616a and 616b may formed without the plasma surface treatment that is used for the seal spacer layers 614a and 614b. Moreover, the bulk spacer layers 616a and 616b may be formed to a greater thickness relative to the thickness of the seal spacer layers 614a and 614b.

The seal spacer layers 614a and 614b and the bulk spacer layers 616a and 616b may be conformally deposited on the dummy gate structures 606a and 606b, respectively, and on the fin structures 604a and 606b. The seal spacer layers 614a and 614b and the bulk spacer layers 616a and 616b are then patterned and etched to remove the seal spacer layers 614a and 614b and the bulk spacer layers 616a and 616b from the tops of the dummy gate structures 606a and 606b, and from the fin structures 604a and 604b.

Figure 6B:
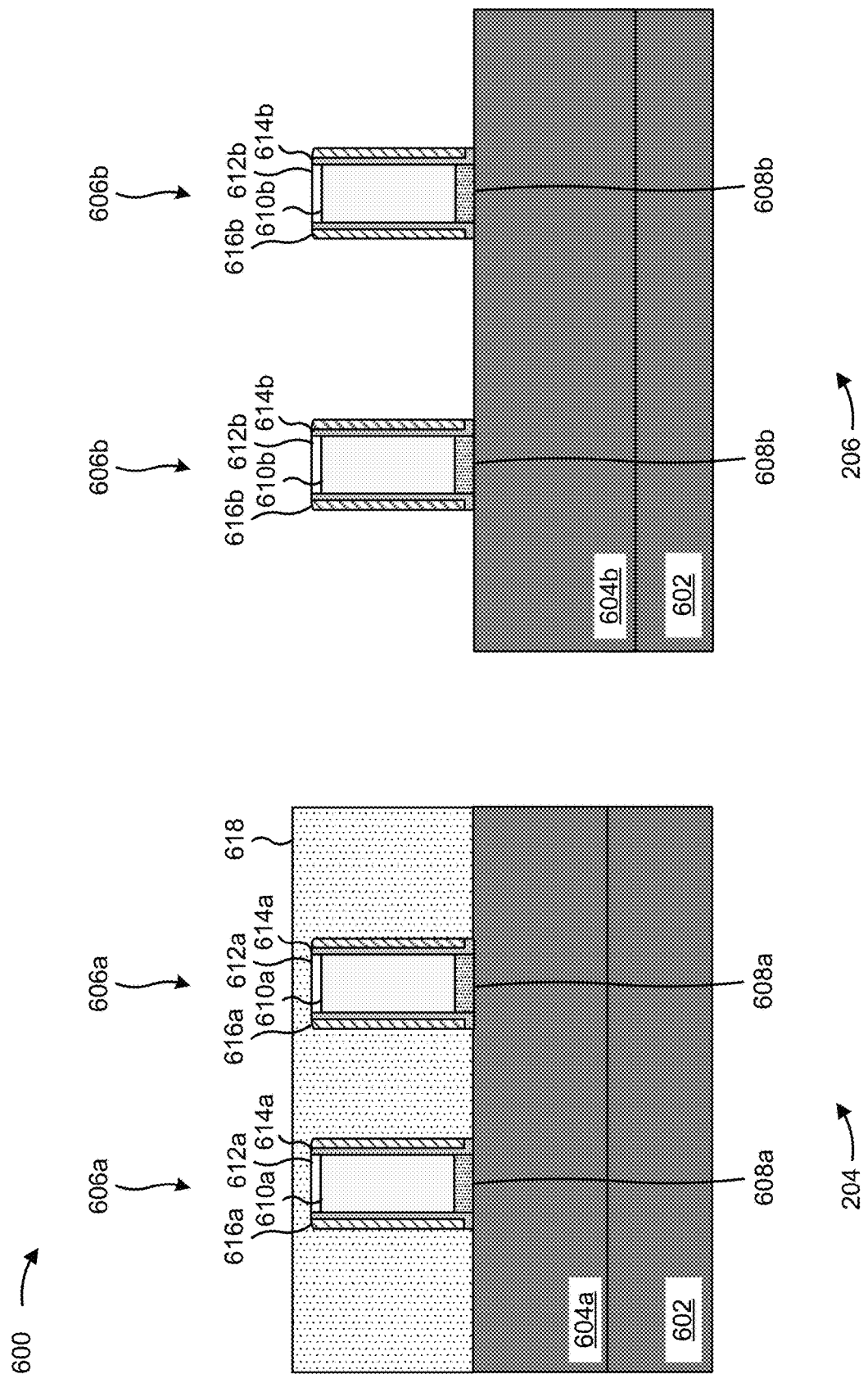

As shown in FIG. 6B, a photoresist layer 618 is formed over and/or on the fin structures 604a, and over and/or on the dummy gate structures 606a. The deposition tool 102 forms the photoresist layer 618 by a spin-coating technique or another deposition technique. The photoresist layer 618 is formed to protect the fin structures 604a and the dummy gate structures 606a in a subsequent etch operation in which openings for source or drain regions of the semiconductor device 206 are partially etched.

Figure 6C:
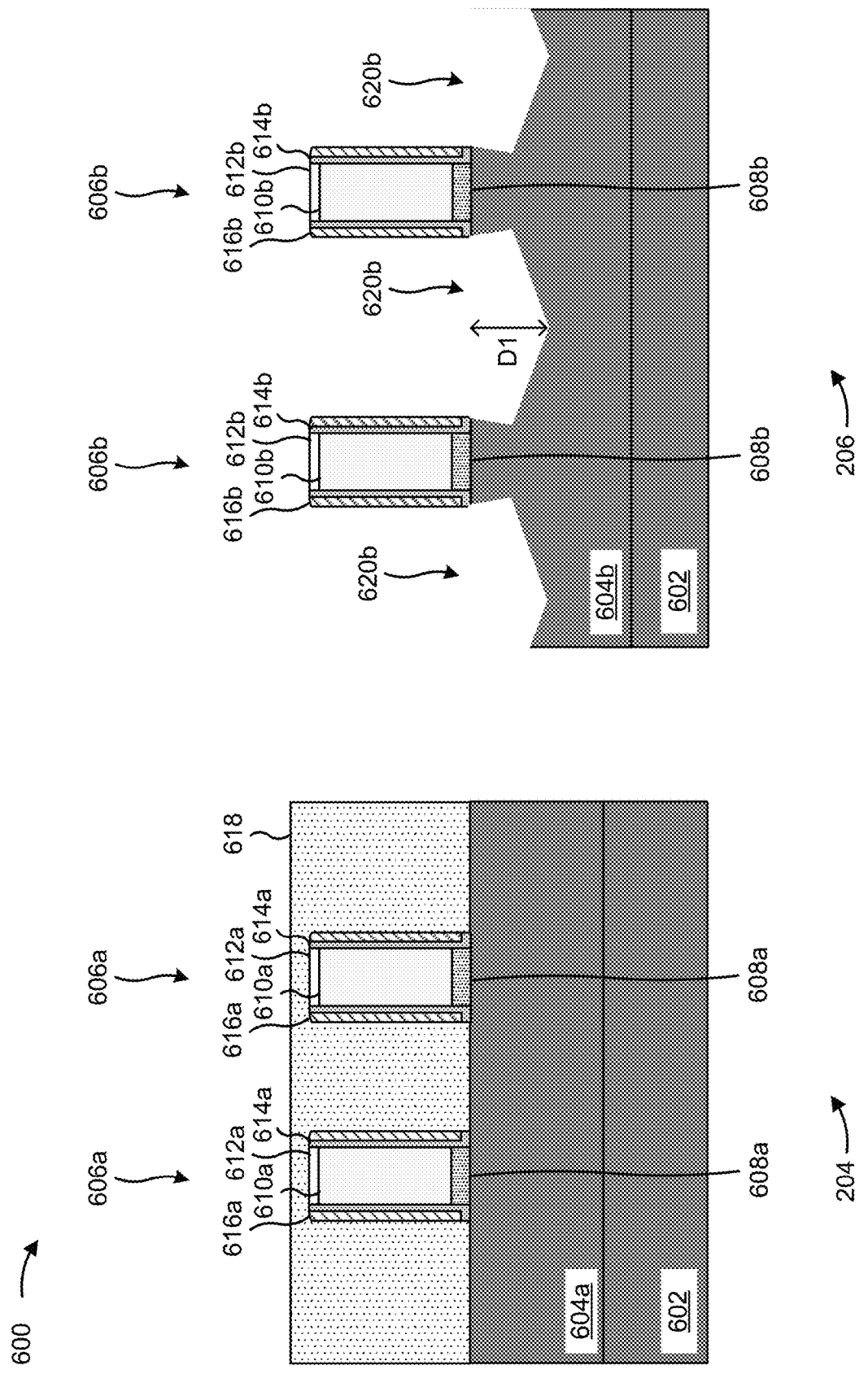

As shown in FIG. 6C, one or more recesses 620b are partially formed in a fin structure 604b of the electronic device 206 between the dummy gate structures 606b in a first etch operation. The first etch operation may be referred to a first strained source drain etch operation, and the recesses 620b may be referred to as first strained source drain regions. The etch tool 108 forms the recesses 620b after the photoresist layer 618 is formed. In this way, the photoresist layer 618 protects the fin structure(s) 604a of the semiconductor device 204 from being etched in the first etch operation. In some implementations, the first etch operation includes a plasma etch technique, a wet chemical etch technique, and/or another type of etch technique.

The etch tool 108 etches portions of the fin structure(s) 604b to form the recesses 620b to an initial depth (D1). The initial depth (D1) may be in a range of approximately 10 nanometers to approximately 20 nanometers to achieve a particular source or drain region depth and/or proximity to the adjacent dummy gates 606b (and thus, the replacement or metal gates that will replace the dummy gates 606b) in a subsequent etch operation for the fin structure(s) 604b. However, other values for the initial depth (D1) are within the scope of the present disclosure.

Additionally and/or alternatively, the fin structure(s) 604b are etched in the first etch operation such that a ratio between the initial depth (D1) and a final depth (or subsequent depth) of the recesses 620b after a second etch operation is in a range of approximately 1:9 to approximately 2:3 to achieve the desired depth (D2) for the recesses 620b in the second etch operation. However, other values for the ratio are within the scope of the present disclosure. In some implementations, the fin structure(s) 604 are etched such that the recesses 620b are formed to a different depth than recesses for source or drain regions ns of the electronic device 204 in the same subsequent etch operation. In other words, the recesses 620b are etched to a depth in the first etch operation such that the recesses 620b can be further etched deeper when the recesses 620b are etched together with the recesses of the electronic device 204 in a second etch operation to achieve desired depths for the recesses of the electronic devices 204 and 206. Accordingly, the depth of (or amount of material removed from) the recesses 620b after the first etch operation may be based on the desired difference in source or drain region depths for the electronic device 204 and 206.

Figure 6D:
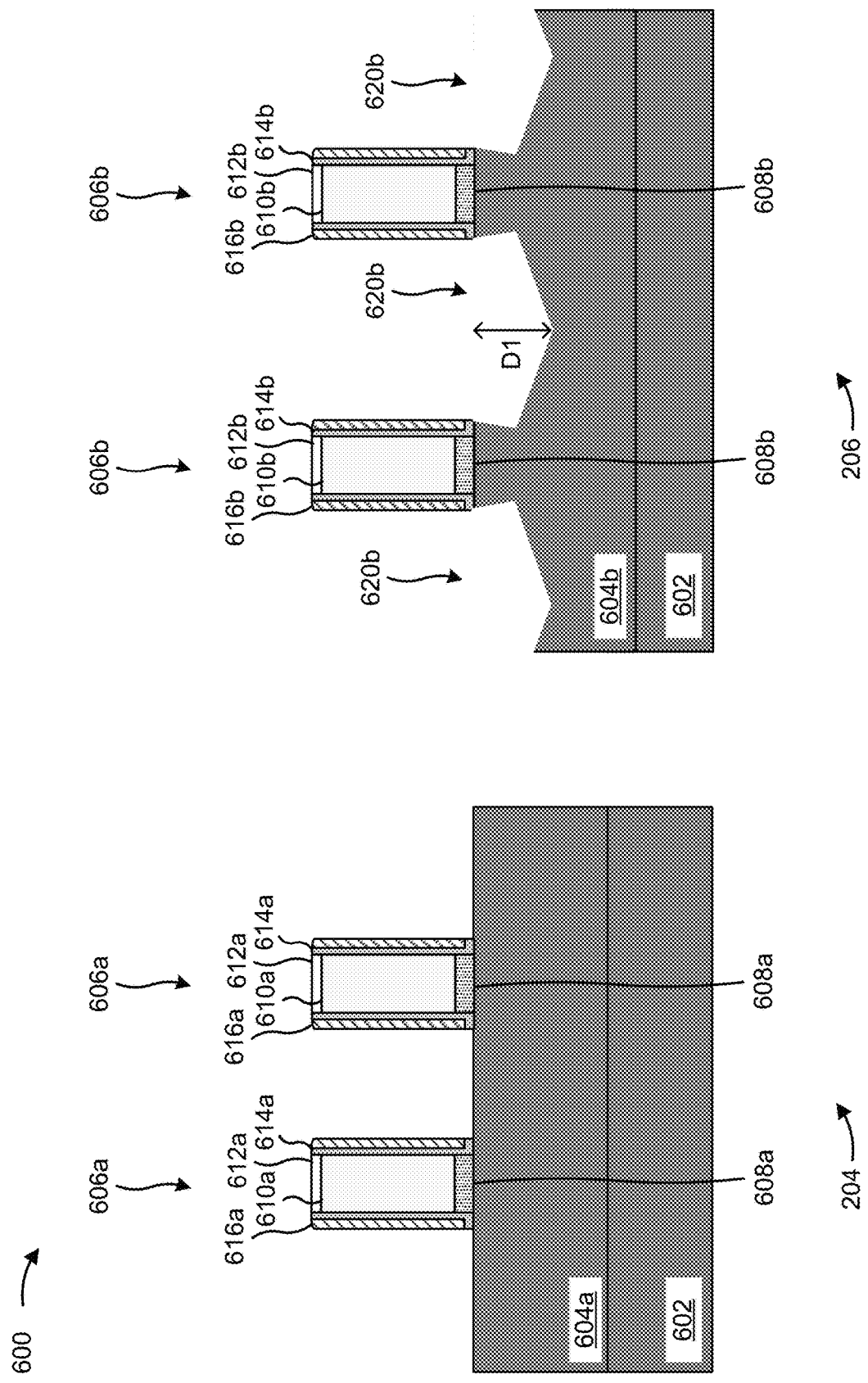

As shown in FIG. 6D, the photoresist layer 618 is removed from the electronic device 204. In particular, the photoresist layer 618 is removed after the first etch operation to partially form the recesses 620b in the fin structure(s) 604b to the initial depth (D1). In some implementations, a photoresist removal tool removes the photoresist layer 618 using a chemical stripper, plasma ashing, and/or another technique.

Figure 6E:
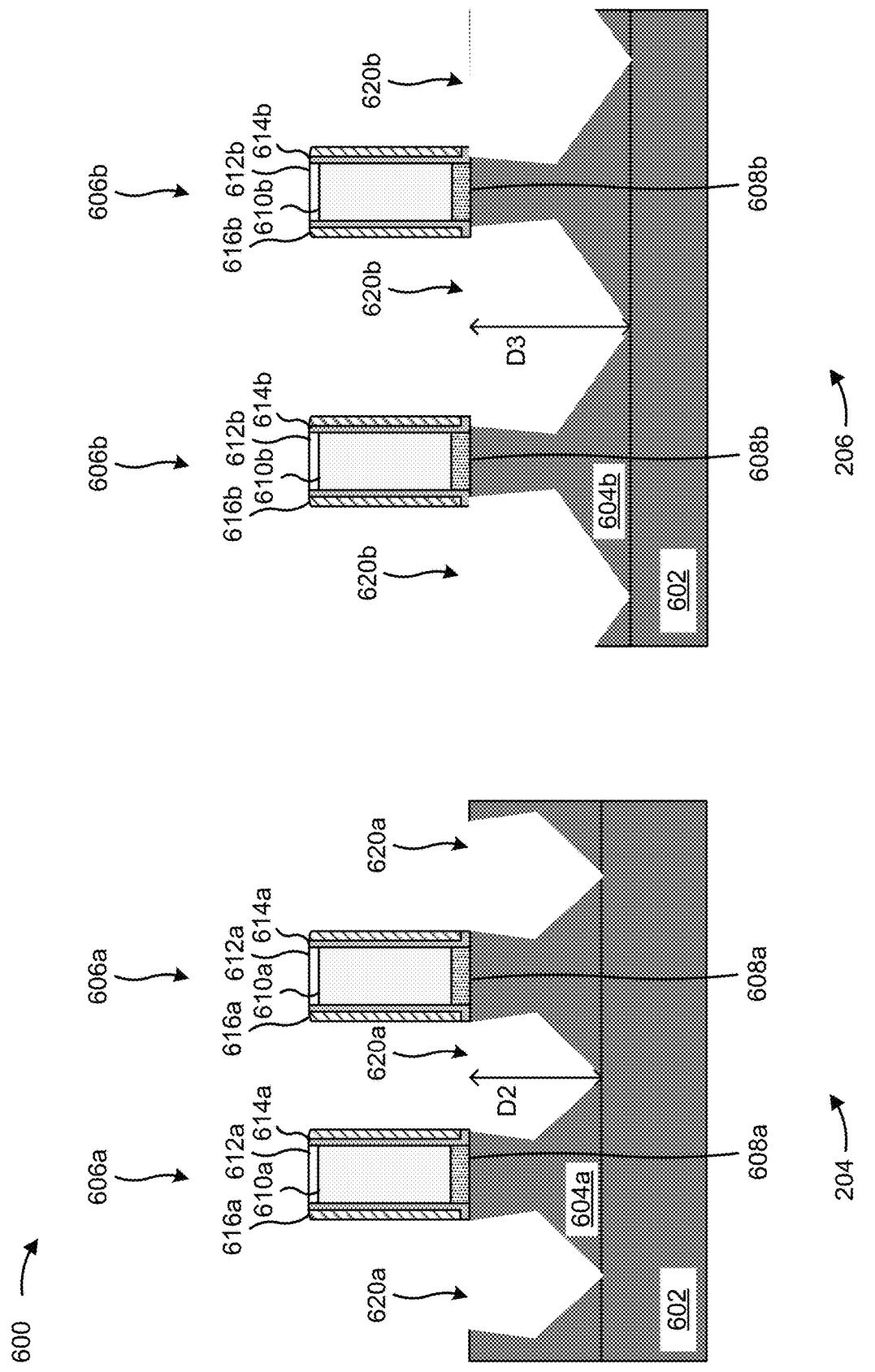

As shown in FIG. 6E, the fin structure(s) 604b and the fin structure(s) 604a are both etched together in a second etch operation after removing the photoresist layer 618. The second etch operation may be referred to a second strained source drain etch operation, and the recesses 620a may be referred to as a second strained source drain regions. The second etch operation includes etching the fin structure(s) 604a to form the recess 620a for the electronic device 204 to a depth (D2), and further etching the fin structure(s) 604b to increase the depth of the recesses 620b from the initial depth (D1) to a depth (D3) for the electronic device 206. In some implementations, the second etch operation includes a plasma etch technique, a wet chemical etch technique, and/or another type of etch technique. Since the recesses 620b were initially etched in the first etch operation, the second etch operation results in the depth (D3) of the recesses 620b being greater relative to the depth (D2) of the recesses 620a. This enables epitaxial regions to be formed in the recesses 620b for the electronic device 206 to a greater depth or height relative to epitaxial regions that are to be formed in the recesses 620a for the electronic device 204.

Figure 6F:
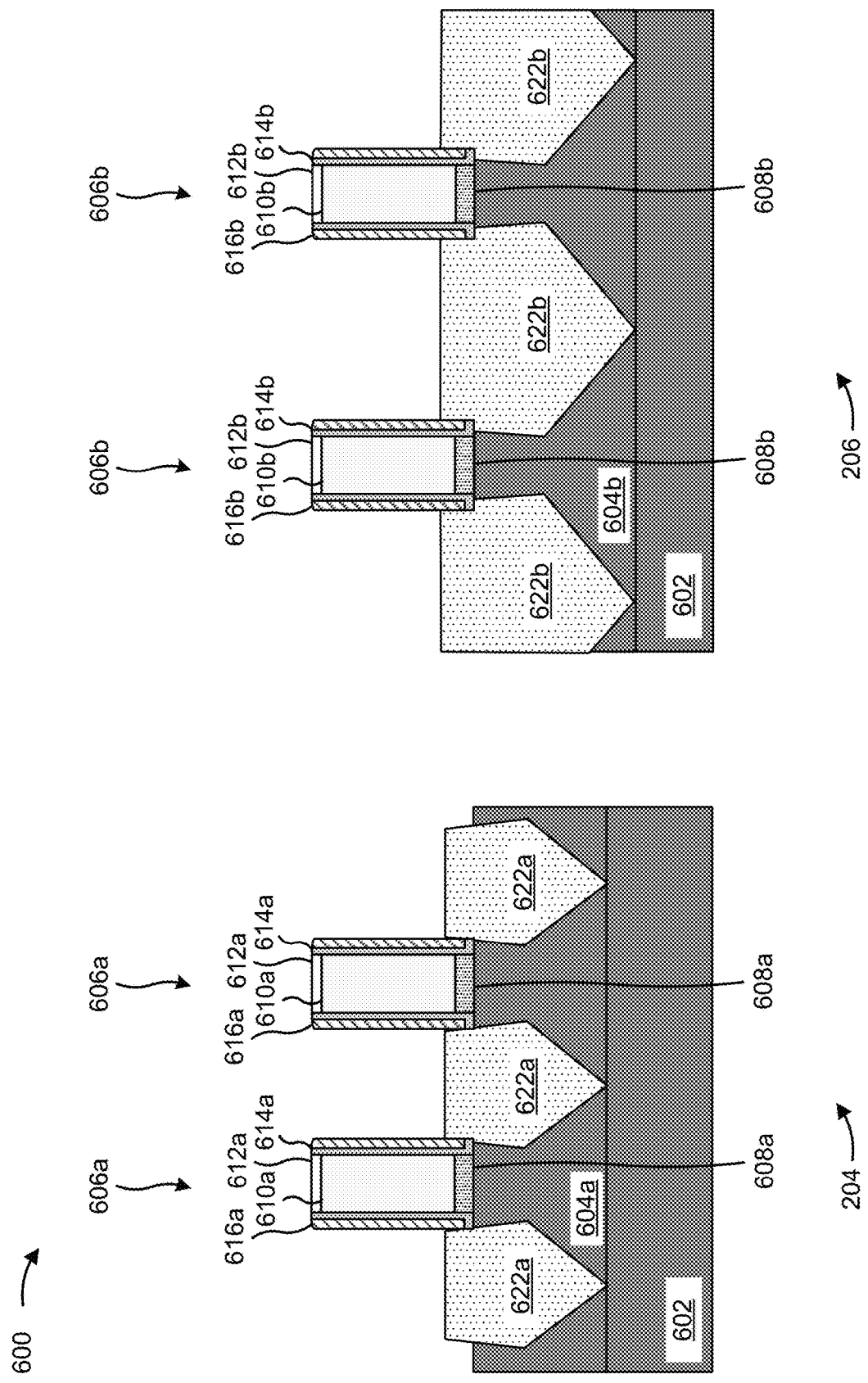

As shown in FIG. 6F, epitaxial regions 622a and 622b are respectively formed in the recesses 620a and 620b for the electronic devices 204 and 206. The deposition tool 102 forms the epitaxial regions 622a and 622b by depositing layers of the epitaxial regions 622a and 622b in the recesses 620a and 620b in the fin structures 604a and 604b, respectively, such that the layers of the epitaxial regions 622a and 622b are formed or grown in a particular crystalline orientation. The epitaxial regions 622a are formed as the source or drain regions of the transistors included in the electronic device 204, and the epitaxial regions 622b are formed as the source or drain regions of the transistors included in the electronic device 204. The epitaxial regions 622a are included between the dummy gate structures 620a and at least partially below and/or lower than the dummy gate structures 620a. The epitaxial regions 622b are included between the dummy gate structures 620b and at least partially below and/or lower than the dummy gate structures 620b. As further shown in FIG. 6F, the epitaxial regions 622a and 622b partially extend above the top surface of the fin structures 604a and 604b, respectively. The epitaxy regions 622a and 622b may include or be silicon germanium ($Si_xGe_{1-x}$, where x can be between approximately 0 and 100), silicon carbide, silicon phosphorus, pure or substantially pure germanium, a III-V compound semiconductor, a II-VI compound semiconductor, or the like. For example, materials for forming a III-V compound semiconductor include InAs, AlAs, GaAs, InP, GaN, InGaAs, InAlAs, GaSb, AlSb, AlP, GaP, and the like.

Figure 6G:
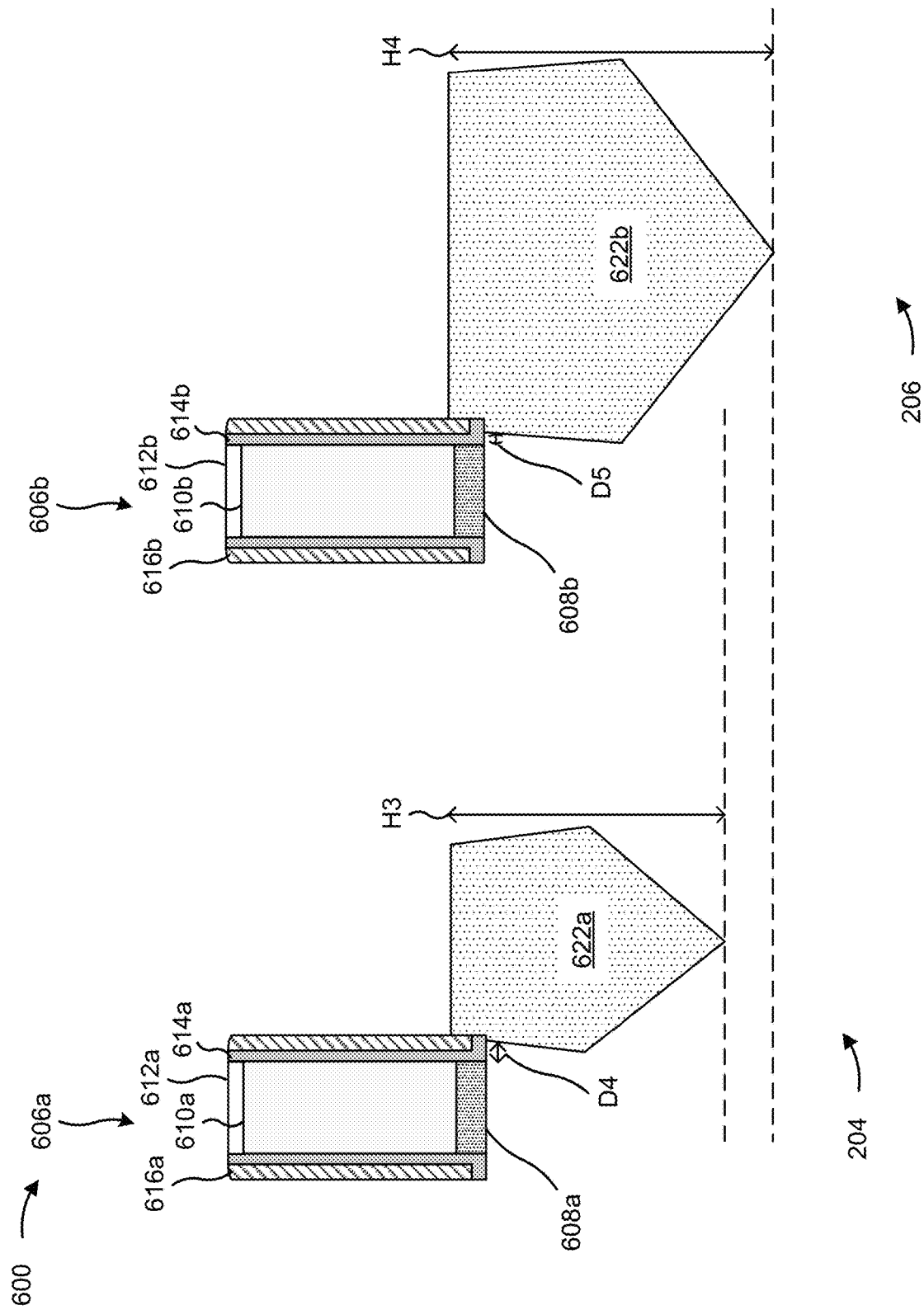

As shown in FIG. 6G, the epitaxial region 622a is formed to a source or drain region height (H3) and to a source or drain region to gate distance (D4). The source or drain region to gate distance (D4) refers to the distance between the side of the epitaxial region 622a and an adjacent gate dielectric layer 608a or gate electrode layer 610a of the electronic device 204. The epitaxial region 622b is formed to a source or drain region height (H4) and to a source or drain region to gate distance (D5). The source or drain region to gate distance (D5) refers to the distance between the side of the epitaxial region 620b and an adjacent gate dielectric layer 608b or gate electrode layer 610a of the electronic device 206.

As further shown in FIG. 6G, the epitaxial region 622b is at least partially under the adjacent bulk sidewall spacer 614b of the dummy gate structure 606b. Moreover, in some implementations, the epitaxial region 622b is at least partially under the gate dielectric layer 608b and the gate electrode layer 610b to further increase the proximity of the epitaxial region 622b to the replacement (e.g., metal or high-k) gate structure that is to be formed adjacent to the epitaxial region 622b.

The techniques described in connection with FIGS. 6A-6F enable the epitaxial region 622b to be formed to a greater height and/or to a lesser source or drain region to gate distance relative to the epitaxial region 622a. In this way, the source or drain region height (H4) of the electronic device 206 is greater relative to the source or drain region height (H3) of the electronic device 204. The greater source or drain region height of the electronic device 206 relative to the electronic device 204 may result in lower extension resistance, lower current crowding, increased drive current, lower hot carrier injection, and/or lesser junction leakage for the transistors (e.g., transistors 356) included in the electronic device 206 relative to the transistors (e.g., transistors 356) included in the electronic device 204. This provides lower overall resistance and higher drive current for HPC devices, I/O devices, analog devices, and diode devices, of which may be implemented as the electronic device 206. The lesser height of the transistors included in the electronic device 204 may enable increased transistor density for the electronic device 204 relative to the electronic device 206. This provides smaller form factor SoC devices and increased power efficiency for SoC devices, of which may be implemented as the electronic device 204.

In some implementations, the ratio between the source or drain region height (H3) of the electronic device 204 and the source or drain region height (H4) is in a range of approximately 1:4.5 to approximately 3.5:4.5. However, other values for the ratio are within the scope of the present disclosure. The different source or drain region heights (H3) and (H4), and/or the ratio between the source or drain region heights (H3) and (H4) provides the electronic devices 204 and 206 with different transistor device performance characteristics and/or attributes on the same substrate 602. In some implementations, the source or drain region height (H3) of the electronic device 204 is in a range of approximately 20 nanometers to approximately 70 nanometers to achieve low on-current due to a longer current path for the electronic device 204, and to achieve low leakage for the electronic device 204 (which may include an SoC device). However, other values for the source or drain region height (H3) of the electronic device 204 are within the scope of the present disclosure. In some implementations, the source or drain region height (H4) of the electronic device 206 is in a range of approximately 30 nanometers to approximately 90 nanometers to achieve low extension resistance, low current crowding, high drive current, low hot carrier injection, and/or low junction leakage for the electronic device 206 (which may include an HPC device, an I/O device, an analog device, or a diode device). However, other values for the source or drain region height (H4) of the electronic device 206 are within the scope of the present disclosure.

In some implementations, the ratio between the source or drain region to gate distance (D4) of the electronic device 204 and the source or drain region to gate distance (D5) of the electronic device 206 is in a range of approximately 10:1 to approximately 5:4. However, other values for the ratio are within the scope of the present disclosure. The different source or drain region to gate distances (D4) and (D5), and/or the ratio between the source or drain region to gate distances (D4) and (D5) provides the electronic devices 204 and 206 with different transistor device performance characteristics and/or attributes on the same substrate 602.

In some implementations, the source or drain region to gate distance (D4) of the electronic device 204 is in a range of approximately 1 nanometer to approximately 10 nanometers to achieve lower subthreshold leakage and lower parasitic capacitance for the electronic device 204 (which may include an SoC device) than the electronic device 206. However, other values for the source or drain region to gate distance (D4) of the electronic device 204 are within the scope of the present disclosure. In some implementations, the source or drain region to gate distance (D5) of the electronic device 206 is in a range of approximately 0 nanometers to approximately 8 nanometers to achieve higher on-current, lower current crowding, higher drive current, lower hot carrier injection, and/or lower junction leakage for the electronic device 206 than the electronic device 204 while achieving a sufficient sub-threshold leakage and parasitic capacitance for the electronic device 206 (which may include an HPC device, an I/O device, an analog device, or a diode device). However, other values for the source or drain region to gate distance (D5) of the electronic device 206 are within the scope of the present disclosure.

As indicated above, FIGS. 6A-6G is provided as an example. Other examples may differ from what is described with regard to FIGS. 6A-6G.

FIGS. 7A-7H are diagrams of an example implementation 700 described herein. The example implementation 700 is an alternative implementation to the example implementation 600 of forming finFET source or drain regions to different source or drain region heights and/or to different source or drain region to gate distances for different types of electronic devices on the same semiconductor substrate. FIGS. 7A-7H are illustrated from the perspective of the cross-sectional plane A-A in FIG. 3 for the electronic device 204, and from the perspective of the cross-sectional plane B-B in FIG. 3 for the electronic device 206.

Figure 7A:
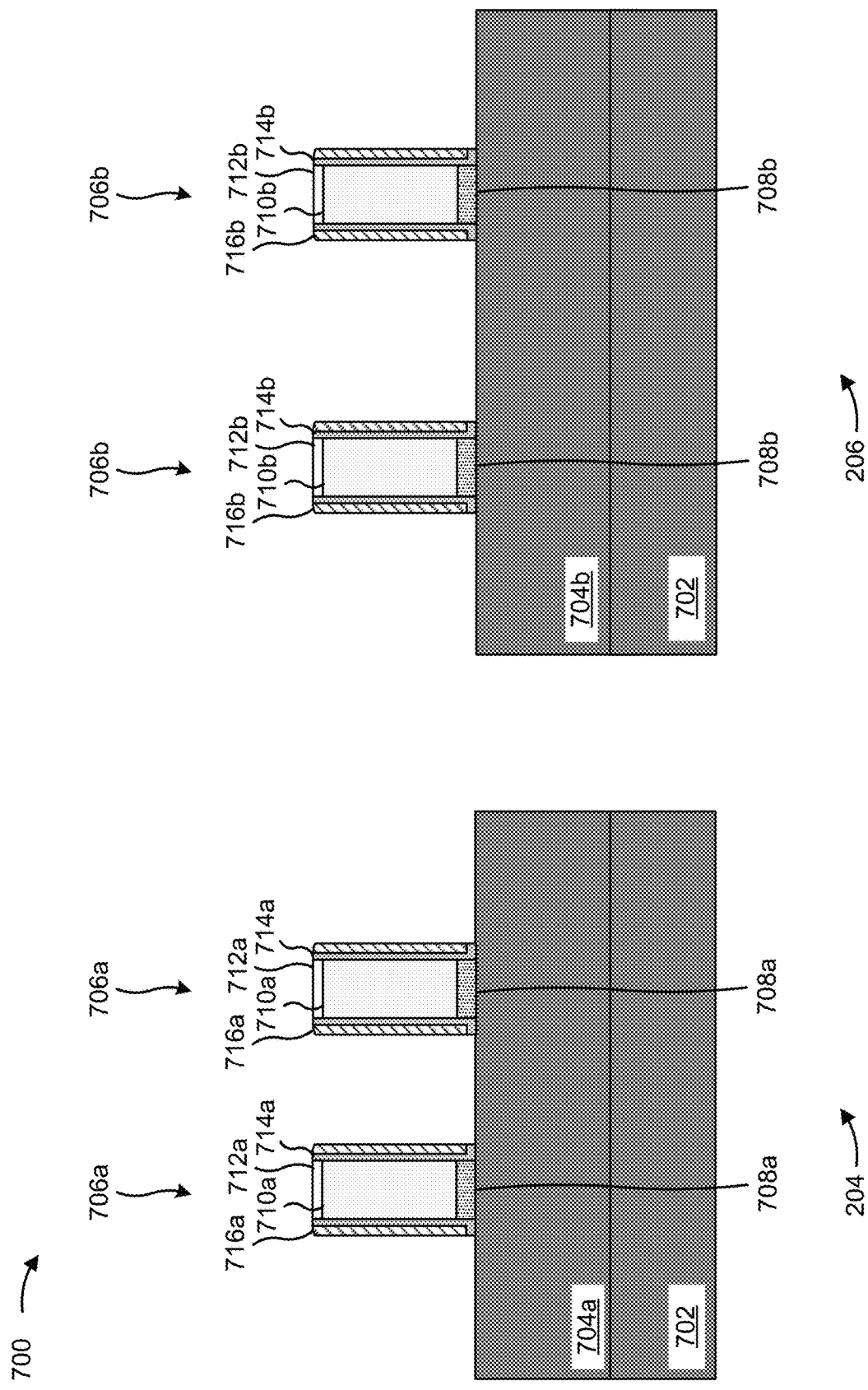

As shown in FIG. 7A, the electronic devices 204 and 206 are formed on the same substrate 702 such as the semiconductor substrate 200. The electronic devices 204 and 206 respectively include one or more fin structures 704a and 704b, and dummy gate structures 706a and 706b formed over and/or around the fin structure(s) 704a and 704b, respectively. The dummy gate structures 706a and 706b may be formed by similar techniques as the dummy gate structures 606a and 606b.

Figure 7B:
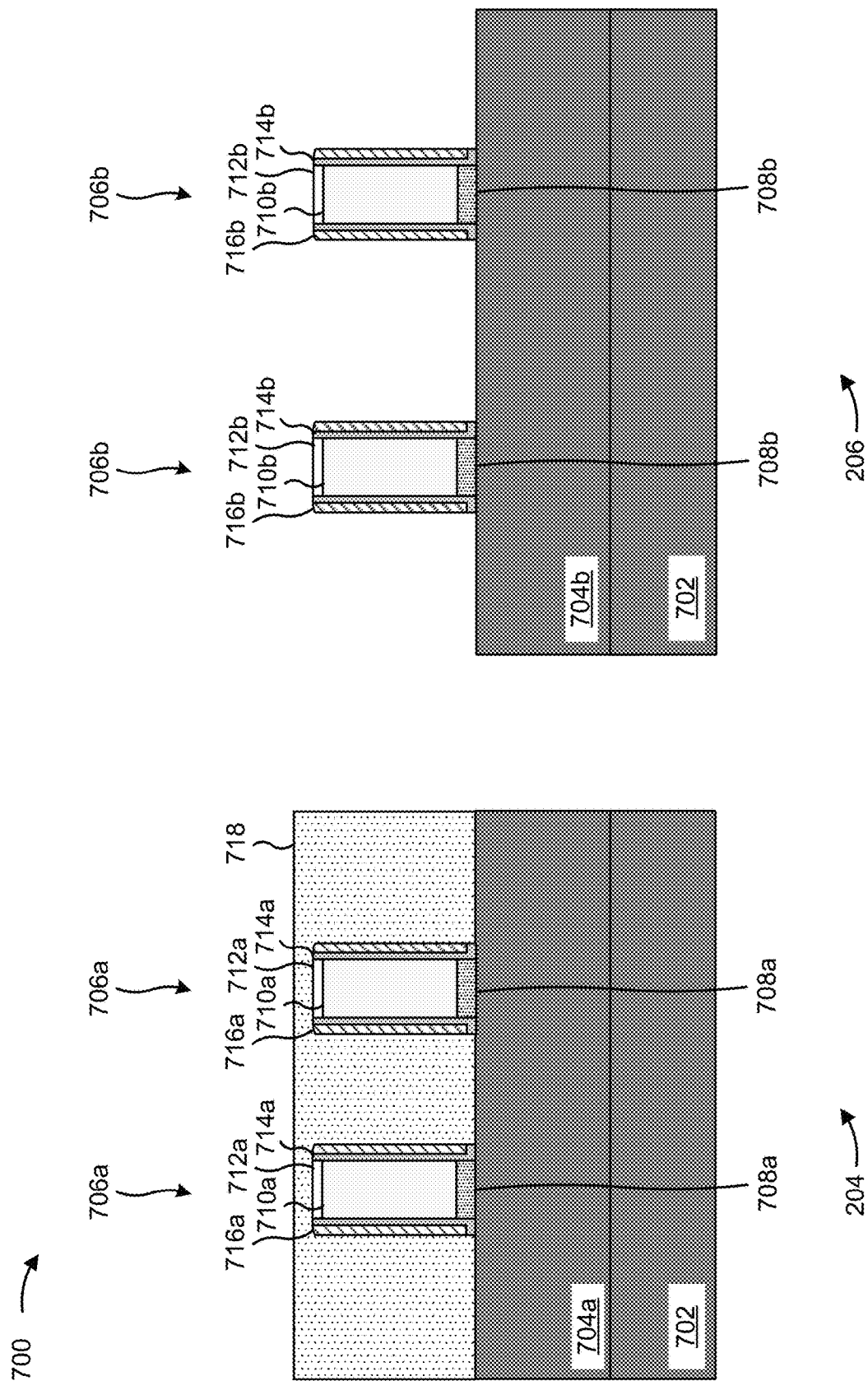

As shown in FIG. 7B, a photoresist layer 718 is formed over and/or on the fin structure(s) 704a and over and/or on the dummy gate structures 706a. The deposition tool 102 forms the photoresist layer 718 by a spin-coating technique or another deposition technique.

Figure 7C:
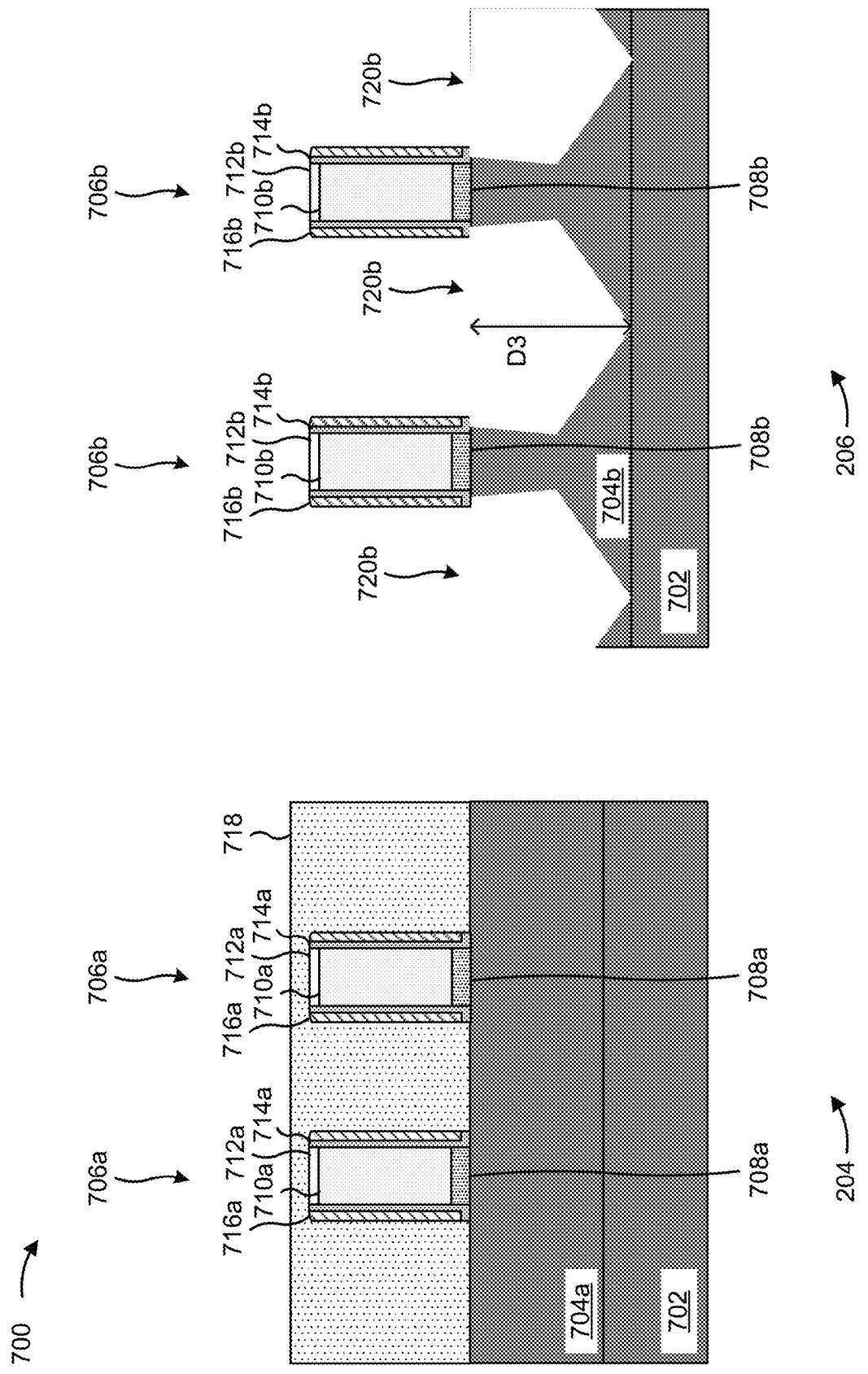

As shown in FIG. 7C, recesses 720b are formed in the fin structure(s) 704b of the electronic device 206 between dummy gate structures 706b in a first etch operation. The first etch operation may be referred to a first strained source drain etch operation, and the recess 720b may be referred to as a first strained source drain regions. The etch tool 108 formed the recesses 720b after the photoresist layer 718 is formed. In this way, the photoresist layer 718 protects the fin structure(s) 704a from being etched in the first etch operation. The etch tool 108 etches a portion of the fin structure(s) 704b to form the recesses 720b to the depth (D3) described above in connection with FIG. 6E. In some implementations, the first etch operation includes a plasma etch technique, a wet chemical etch technique, and/or another type of etch technique.

Figure 7D:
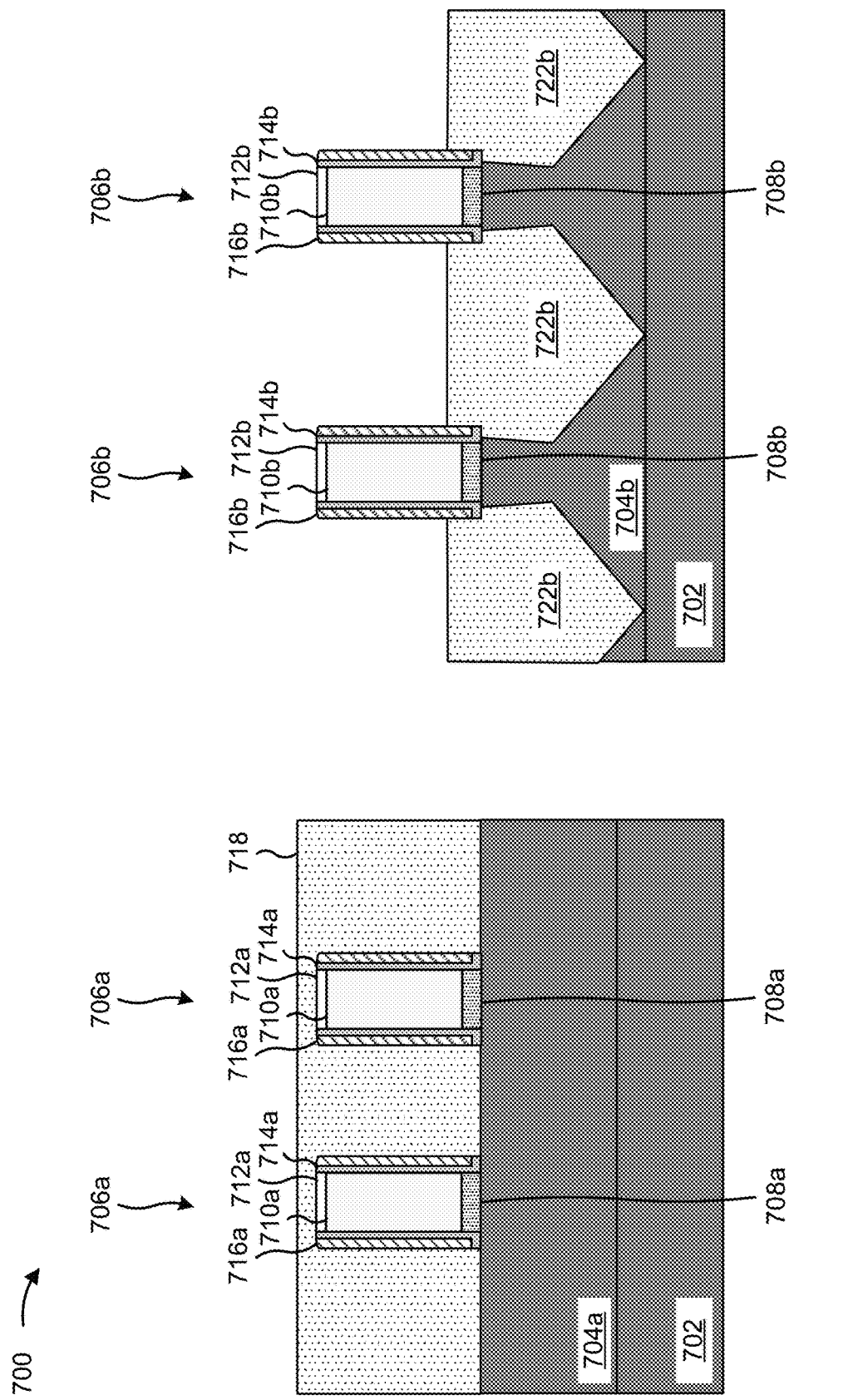

As shown in FIG. 7D, an epitaxial regions 722b are formed in the recesses 720b for the electronic device 206 after the first etch operation to form the recesses 720b. The epitaxial regions 722b are formed while the photoresist layer 718 is on the fin structure(s) 704a and on the dummy gate structures 706a. The deposition tool 102 forms the epitaxial regions 722b by depositing layers of the epitaxial regions 722b onto the fin structure(s) 704b such that the layers of the epitaxial regions 722b are formed or grown in a particular crystalline orientation. The epitaxial regions 722b are formed such that the epitaxial regions 722b partially extend above the tops of the fin structure(s) 704b.

Figure 7E:
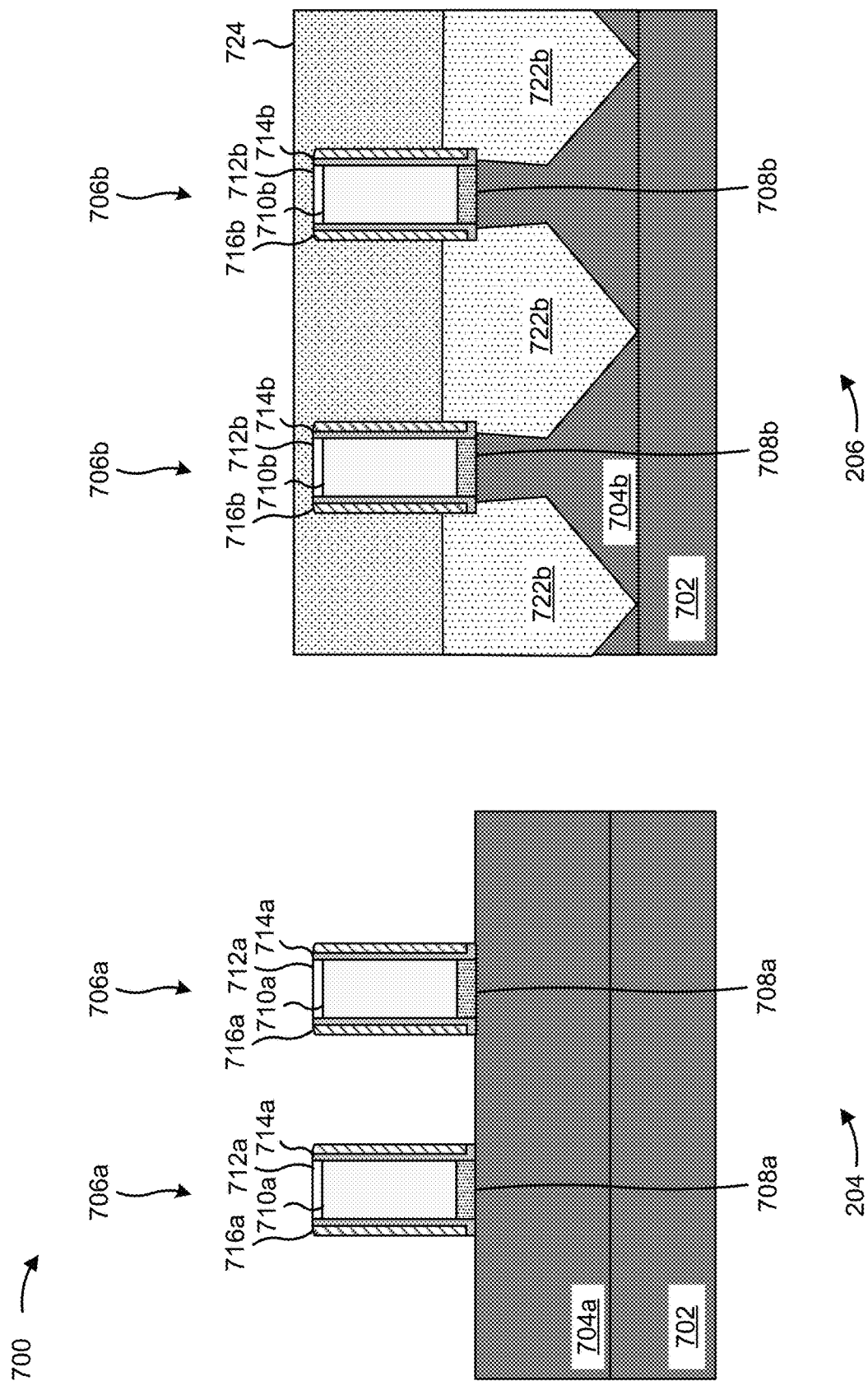

As shown in FIG. 7E, the photoresist layer 718 is removed from the electronic device 204. In particular, the photoresist layer 718 is removed after the first etch operation to form the recesses 720b in the fin structure(s) 704b to the depth (D3), and after the epitaxial region 722b are formed in the recesses 720b. In some implementations, the photoresist layer 718 is removed prior to forming the epitaxial regions 722b. In these implementations, another photoresist layer (or a hard mask) may be used to protect the electronic device 204 during formation of the epitaxial regions 722b In some implementations, a photoresist removal tool removes the photoresist layer 718 using a chemical stripper, plasma ashing, and/or another technique.

Figure 7F:
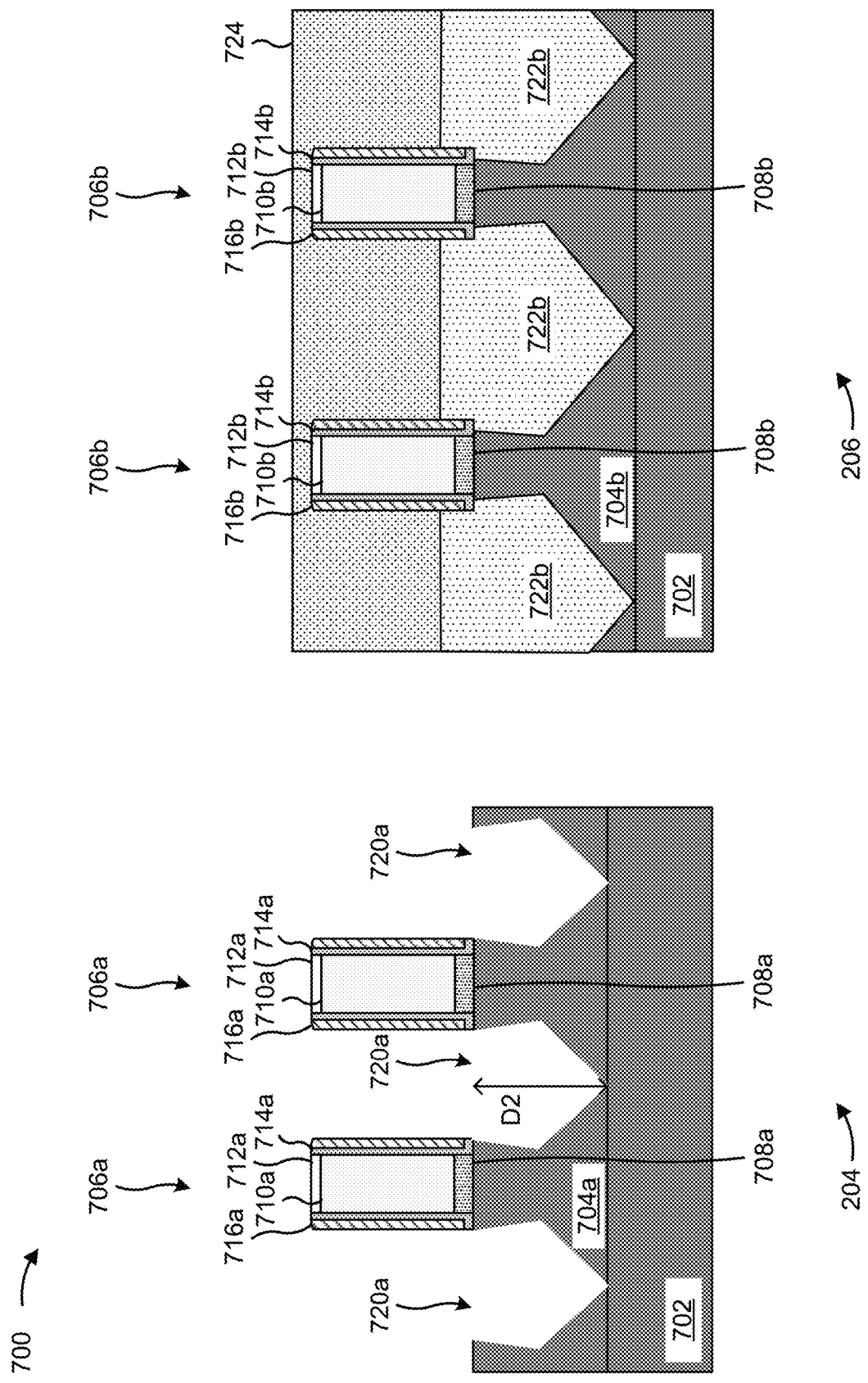

As further shown in FIG. 7F, a photoresist layer 724 is formed over the electronic device 206. In particular, the photoresist layer 724 is formed over and/or on the epitaxial regions 722b, over and/or on the dummy gate structures 706b, and/or over and/or on the fin structure(s) 704b. The deposition tool 102 forms the photoresist layer 724 by a spin-coating technique or another deposition technique.

As shown in FIG. 7F, recesses 720a is formed in a fin structure(s) 704a of the electronic device 204 between the dummy gates 706a in a second etch operation. The second etch operation may be referred to a second strained source drain etch operation, and the recesses 720a may be formed for second strained source drain regions. The etch tool 108 forms the recesses 720a after the photoresist layer 724 is formed. In this way, the photoresist layer 724 protects the electronic device 206 from further etching during the second etch operation. The etch tool 108 etches portions of the fin structure(s) 704a to form the recesses 720a to the depth (D2) described above in connection with FIG. 6E. The depth (D2) is less than the depth (D3) of the recesses 722b formed for the electronic device 206 such that transistor parameters may be optimized for SoC devices and HPC device (or other types of devices) on the same substrate 702. In some implementations, the second etch operation includes a plasma etch technique, a wet chemical etch technique, and/or another type of etch technique.

Figure 7G:
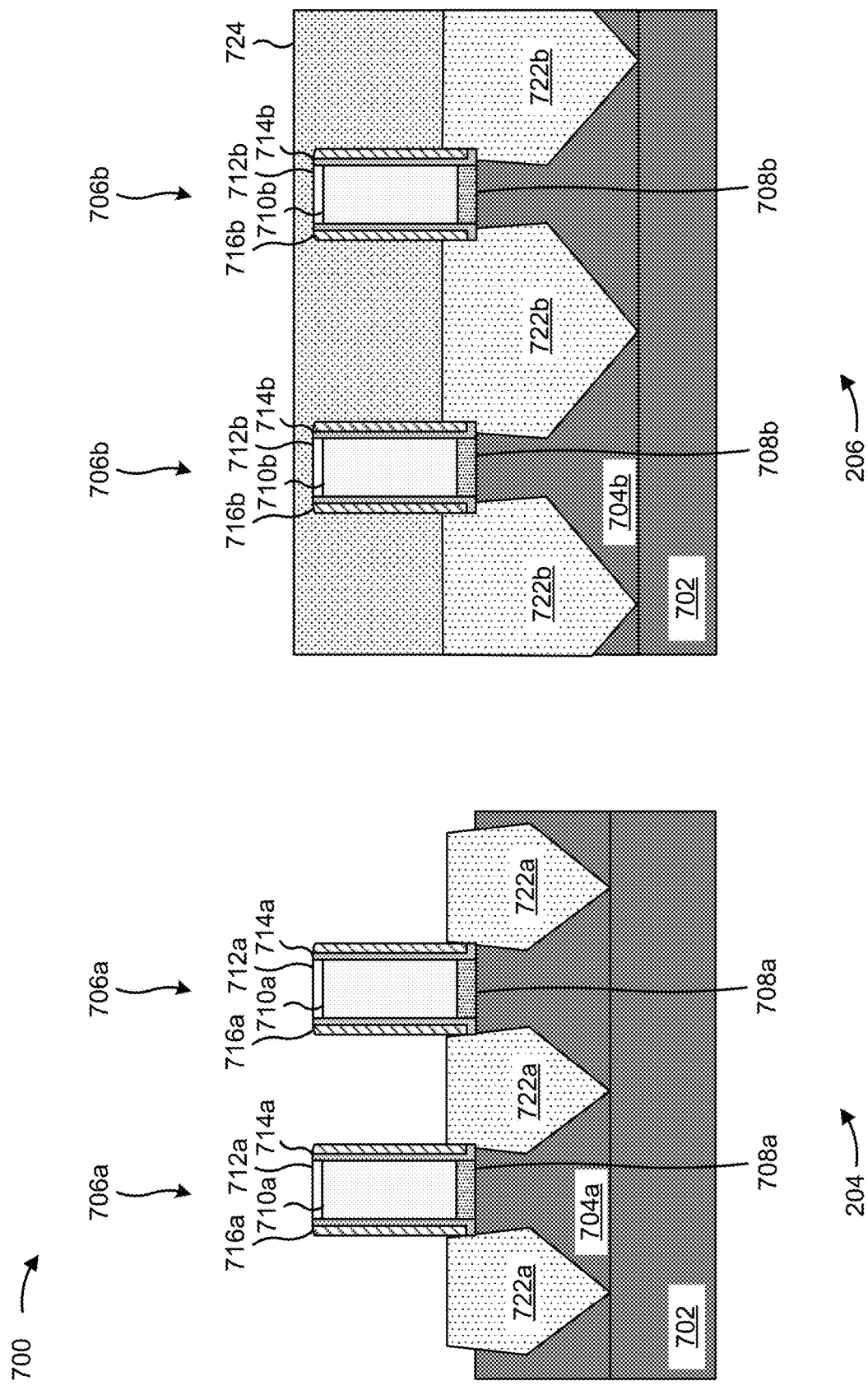

As shown in FIG. 7G, epitaxial regions 722a are formed in the recesses 720a for the electronic device 204 after the second etch operation to form the recesses 720a. The deposition tool 102 forms the epitaxial regions 722a by depositing layers of the epitaxial regions 722a in the recesses 720a such that the layers of the epitaxial region 722a are formed or grown in a particular crystalline orientation. The epitaxial regions 722a partially extend above the top surfaces of the fin structure(s) 704a.

Figure 7H:
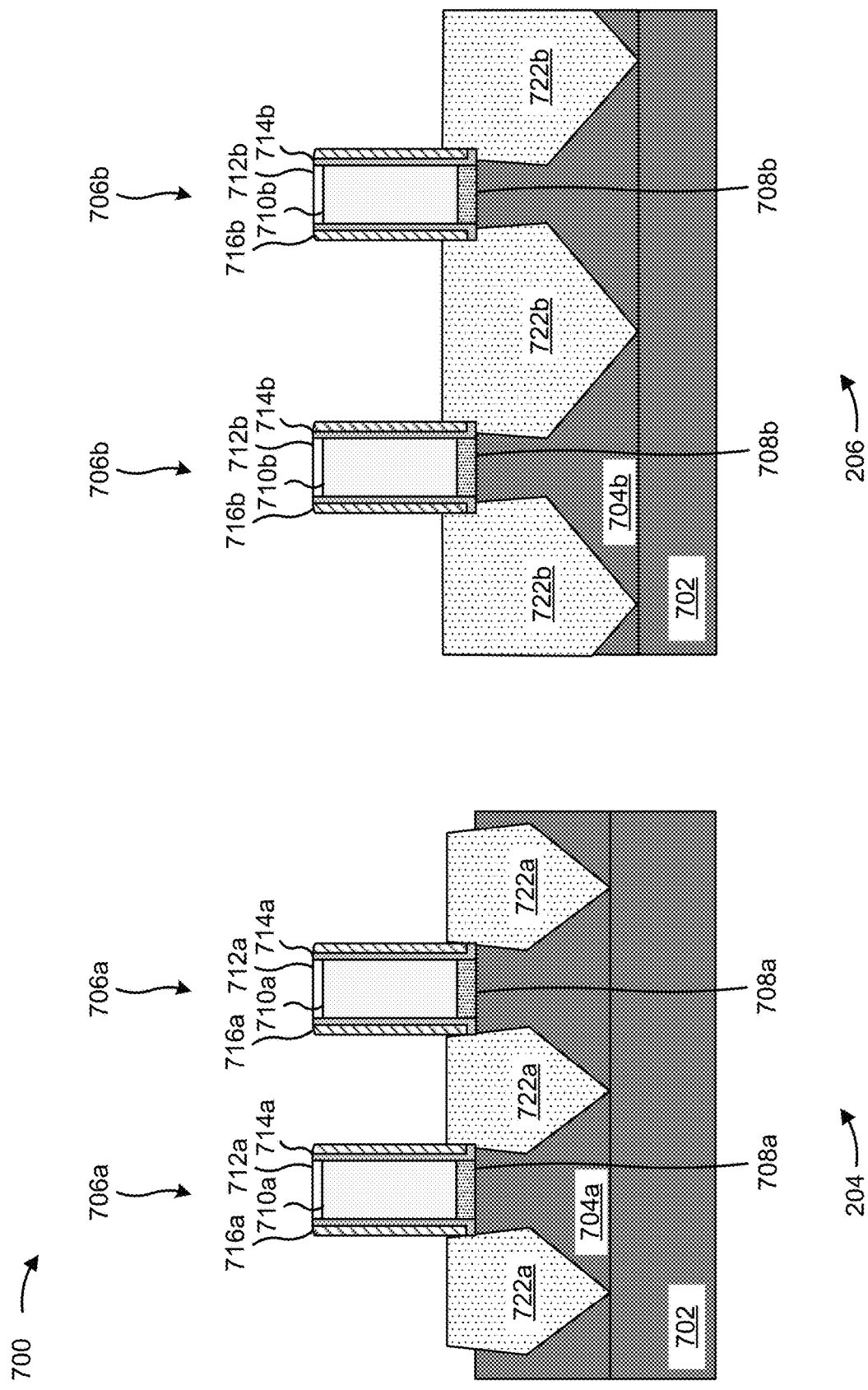

As shown in FIG. 7H, the photoresist layer 724 is removed from the electronic device 206. In particular, the photoresist layer 724 is removed after the second etch operation to form the recesses 720a in the fin structure(s) 704a to the depth (D2). In some implementations, the photoresist layer 724 is removed after forming the epitaxial regions 722a in the recesses 720a. In some implementations, the photoresist layer 724 is removed prior to forming the epitaxial regions 722a. In these implementations, another photoresist layer or a hard mask layer may be used to protect the electronic device 206 during formation of the epitaxial regions 722a. In some implementations, a photoresist removal tool removes the photoresist layer 724 using a chemical stripper, plasma ashing, and/or another technique.

As indicated above, FIGS. 7A-7H is provided as an example. Other examples may differ from what is described with regard to FIGS. 7A-7H. As an example, the recesses 720a and 720b, and the epitaxial regions 722a and 722b, may be formed in a different order than the order described above in connection with FIGS. 7A-7H. In these implementations, the photoresist layer 724 is formed for the electronic device 206 first, the recesses 720a are then formed to the depth (D2) in the fin structure(s) 704a and the epitaxial regions 722a are formed in the recesses 720a for the electronic device 204, the photoresist layer 724 is removed after forming the recesses 720a (and, in some implementations, after forming the epitaxial regions 722a), the photoresist layer 718 is then formed for the electronic device 204, and the recesses 720b are then formed to the depth (D3) in the fin structure(s) 704b and the epitaxial regions 722b are formed in the recesses 720b for the electronic device 206.

FIGS. 8A-8H are diagrams of an example implementation 800 described herein. The example implementation 800 includes an example of forming finFET source or drain contacts (e.g., source or drain contacts 330) to different widths for different types of electronic devices on the same semiconductor substrate. In this way, one or more performance parameters for different types of electronic devices on the same semiconductor substrate are increased and/or optimized using the techniques described in connection with FIGS. 8A-8C. For example, the width for the source or drain contacts of an SoC device may be formed to a smaller width than the source or drain contacts for an HPC device (or an I/O device, an analog device, a diode device) to provide greater power efficiency and/or increased transistor density for the SoC device compared to the HPC device. Moreover, the width for the source or drain contacts of an HPC device may be formed to a greater width than the source or drain contacts for an SoC device to provide lower contact resistance for the HPC device compared to the SoC device. FIGS. 8A-8H are illustrated from the perspective of the cross-sectional plane A-A in FIG. 3 for the electronic device 204, and from the perspective of the cross-sectional plane B-B in FIG. 3 for the electronic device 206.

Figure 8A:
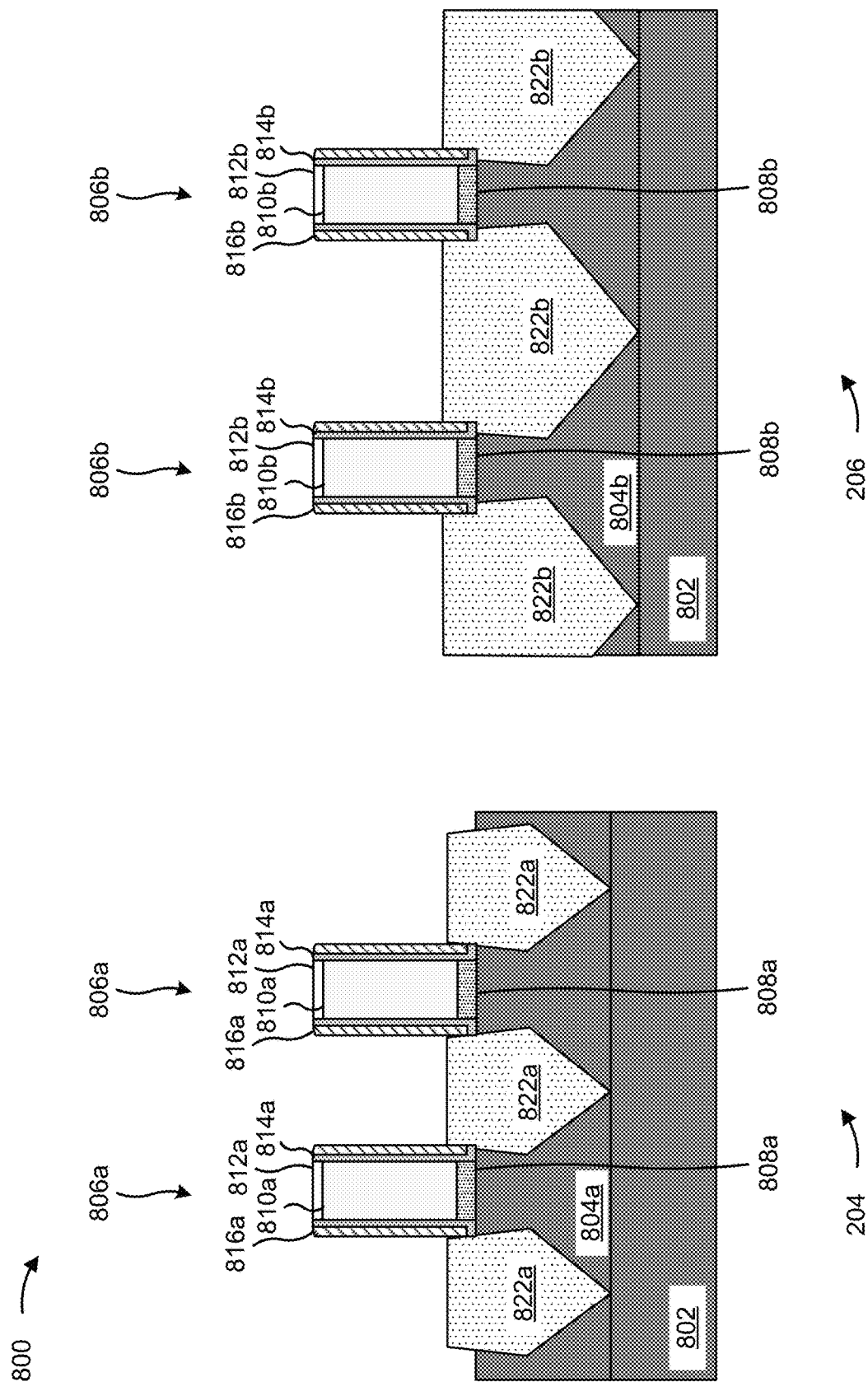

As shown in FIG. 8A, the example implementation 800 includes an electronic device 204 and an electronic device 206. The electronic devices 204 and 206 include different types of electronic devices. For example, the electronic device 204 may include an SoC device and the electronic device 206 may include an HPC device, an I/O device, a diode device, or an analog device, among other examples. The electronic devices 204 and 206 include similarly numbered structures and layers as illustrated and described in FIGS. 6A-6G and 7A-7H, and are therefore not described in connection with FIGS. 8A-8H. In some implementations, the operations and/or techniques described in connection with FIGS. 8A-8H are performed subsequent to the operations and techniques described in connection with FIGS. 6A-6G and 7A-7H.

Figure 8B:
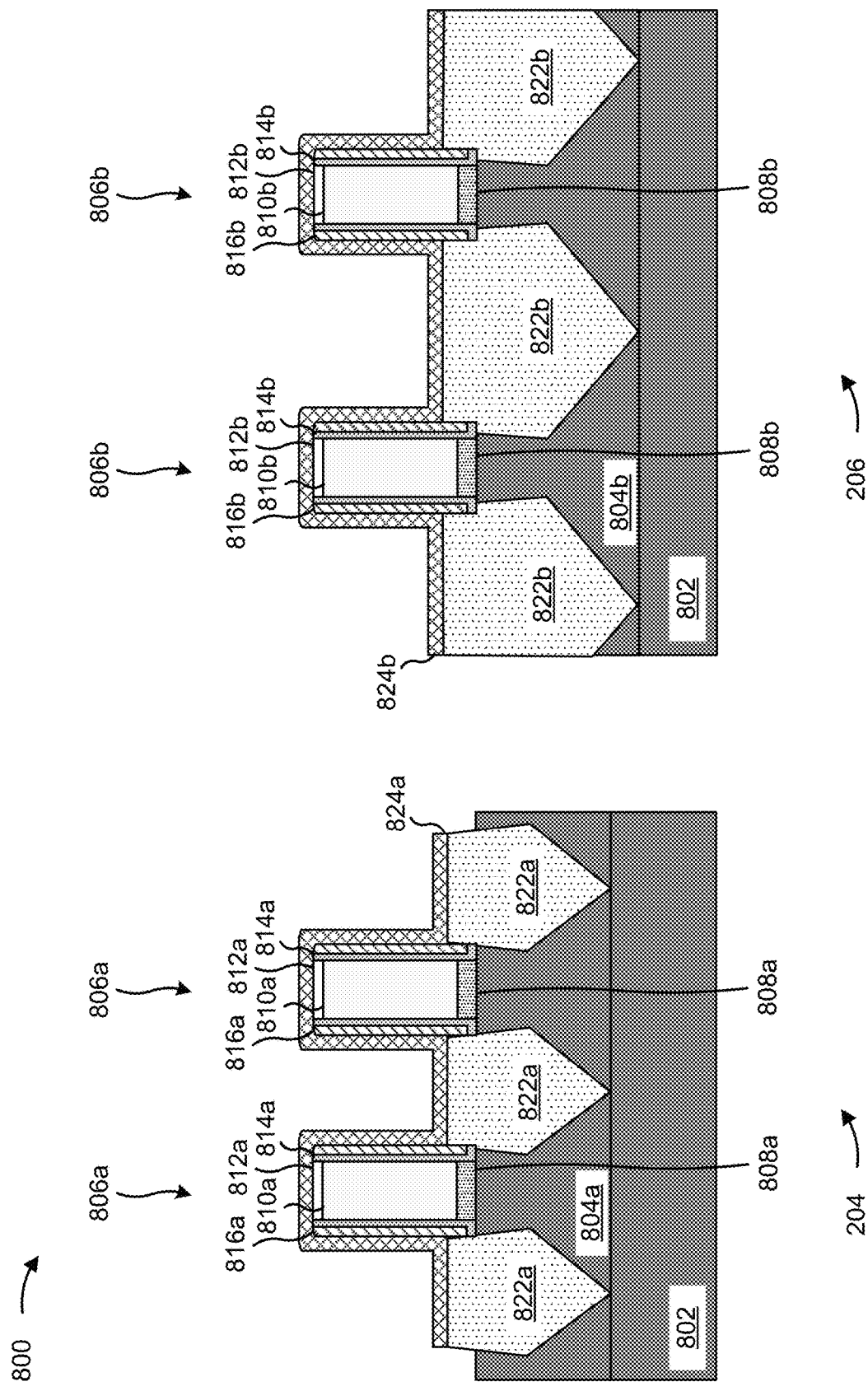

As shown in FIG. 8B, a contact etch stop layer (CESL) 824a is conformally deposited (e.g., by the deposition tool 102) over the epitaxial regions 822a, over the dummy gate structures 806a, and on the sidewalls of the bulk spacer layers 816a. Similarly, a CESL 824b is conformally deposited (e.g., by the deposition tool 102) over the epitaxial regions 822b, over the dummy gate structures 806b, and on the sidewalls of the bulk spacer layers 816b. The CESLs 824a and 824b may provide a mechanism to stop an etch process when forming contacts or vias for the electronic devices 204 and 206. The CESLs 824a and 824b may be formed of a dielectric material having a different etch selectivity from adjacent layers or components. The CESLs 824a and 824b may include or may be a nitrogen containing material, a silicon containing material, and/or a carbon containing material. Furthermore the CESLs 824a and 824b may include or may be silicon nitride, silicon carbon nitride, carbon nitride, silicon oxynitride, silicon carbon oxide, the like, or a combination thereof. The CESLs 824a and 824b may be deposited by a deposition process, such as a Plasma Enhanced ALD (PEALD), CVD, or another deposition technique.

Figure 8C:
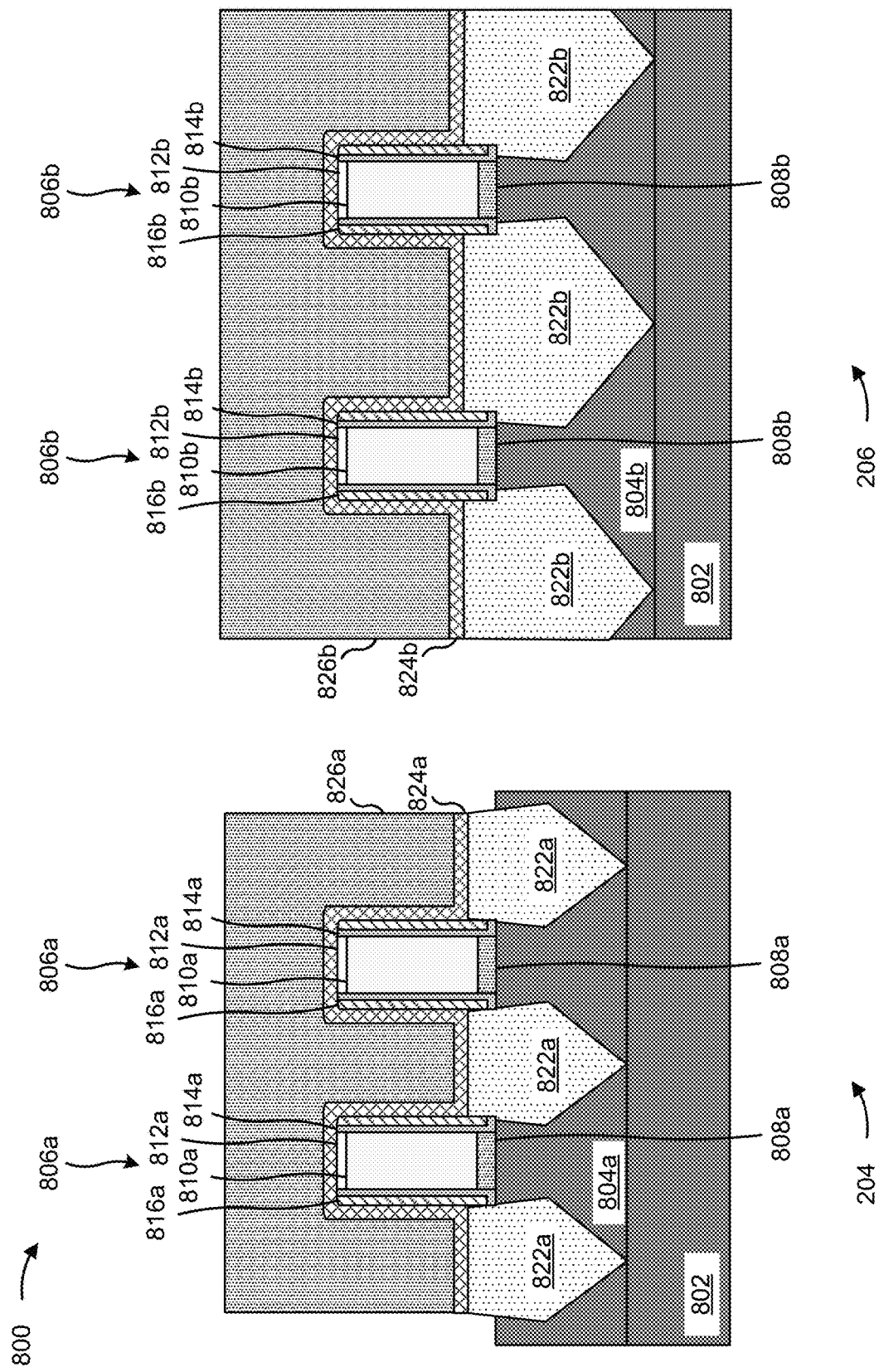

As shown in FIG. 8C, an interlayer dielectric (ILD) layer 826a is formed (e.g., by the deposition tool 102) over and/or on the CESL 824a. The ILD layer 826a fills in the areas between the dummy gate structures 806a over the epitaxial regions 822a. An ILD layer 826b is formed (e.g., by the deposition tool 102) over and/or on the CESL 824*b*. The ILD layer 826*b* fills in the areas between the dummy gate structures 806*b*. The ILD layers 826*a* and 826*b* are formed to permit a replacement gate structure process to be performed for the electronic devices 204 and 206, respectively, in which metal gate structures are formed to replace the dummy gate structures 806*a* and 806*b*.

Figure 8D:
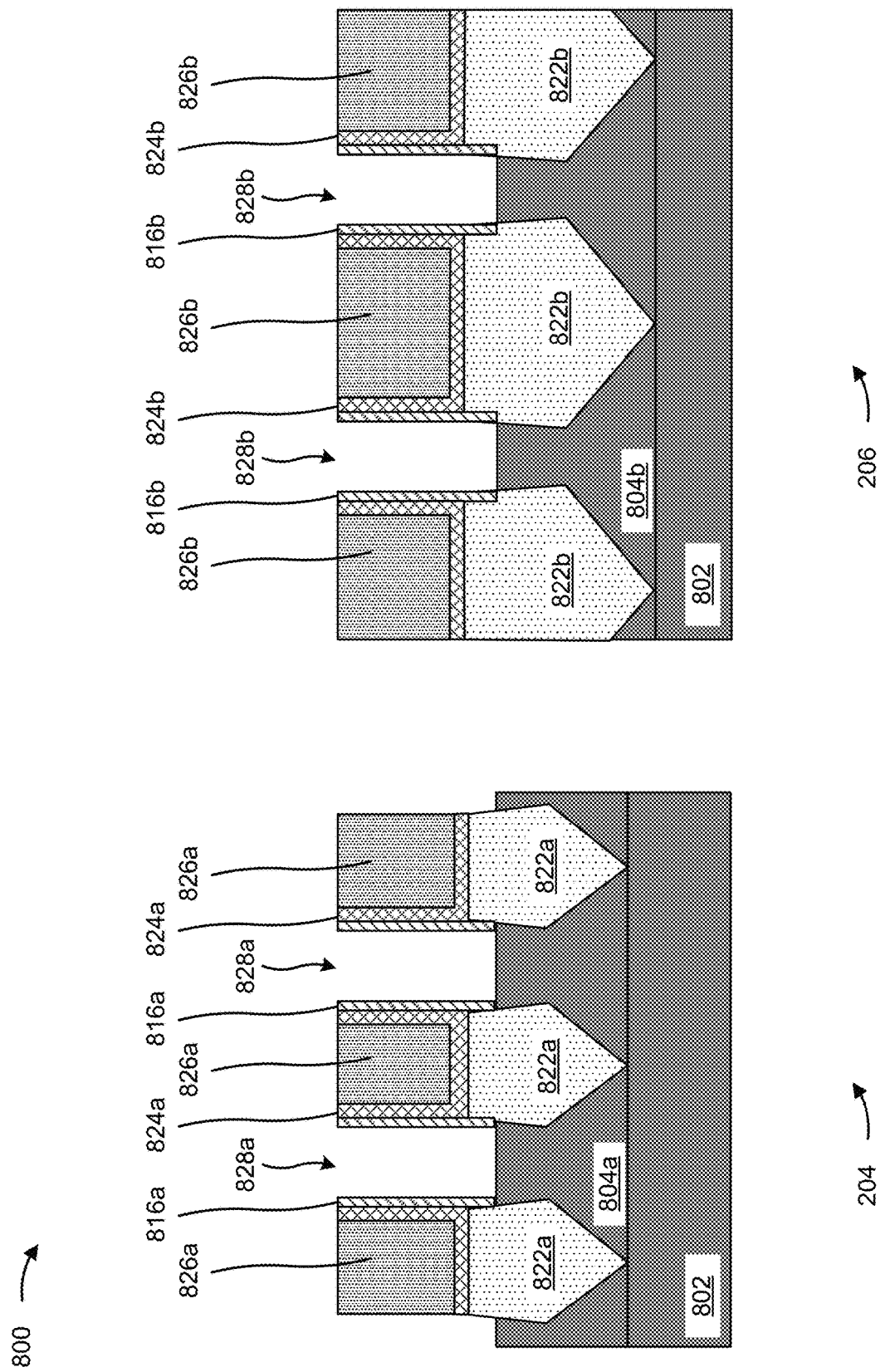

As shown in FIG. 8D, the replacement gate operation is performed (e.g., by one or more of the semiconductor processing tools 102-112) to remove the dummy gate structures 806*a* from the electronic device 204 and the dummy gate structures 806*b* from the electronic device 206. The removal of the dummy gate structures 806*a* leaves behind openings 828*a* between the bulk spacer layers 816*a* and between the epitaxial regions 822*a*. The removal of the dummy gate structures 806*b* leaves behind openings 828*b* between the bulk spacer layers 816*b* and between the epitaxial regions 822*b*.

Figure 8E:
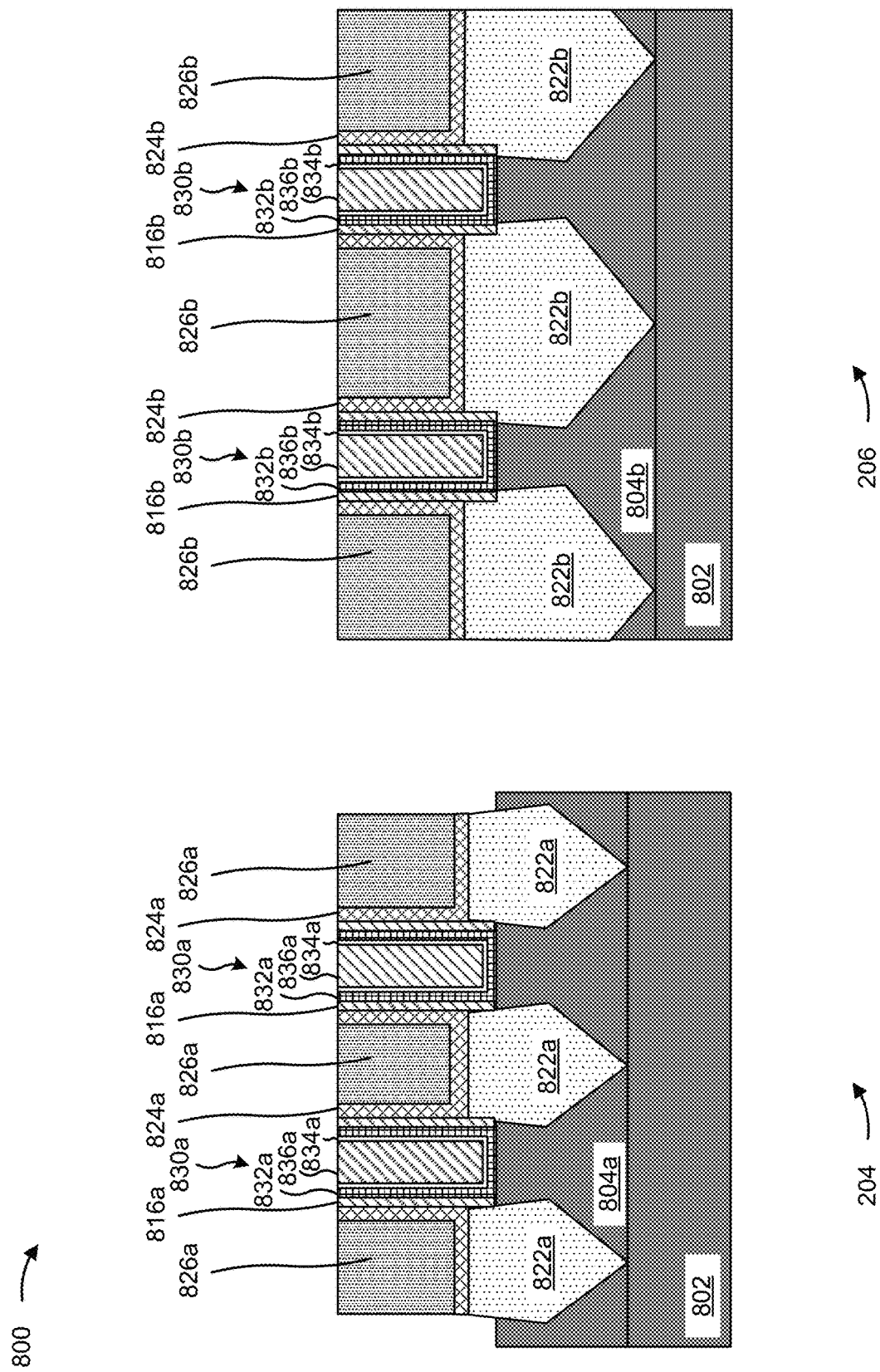

As shown in FIG. 8E, the replacement gate operation continues to form gate structures (e.g., replacement gate structures) 830*a* in the openings 828*a* between the bulk spacer layers 816*a* and between the epitaxial regions 822*a*, and to form gate structures 830*b* in the openings 828*b* between the bulk spacer layers 816*b* and between the epitaxial regions 822*b*. The gate structures 830*a* and 830*b* may include metal gate structures. The gate structures 830*a* may include an interfacial layer (not shown), a high dielectric constant dielectric layer 832*a*, a work function tuning layer 834*a*, and a metal electrode structure 836*a* formed therein to form a metal gate structure 830*a*. The gate structures 830*b* may include an interfacial layer (not shown), a high dielectric constant dielectric layer 832*b*, a work function tuning layer 834*b*, and a metal electrode structure 836*b* formed therein to form a metal gate structure 830*b*.

Figure 8F:
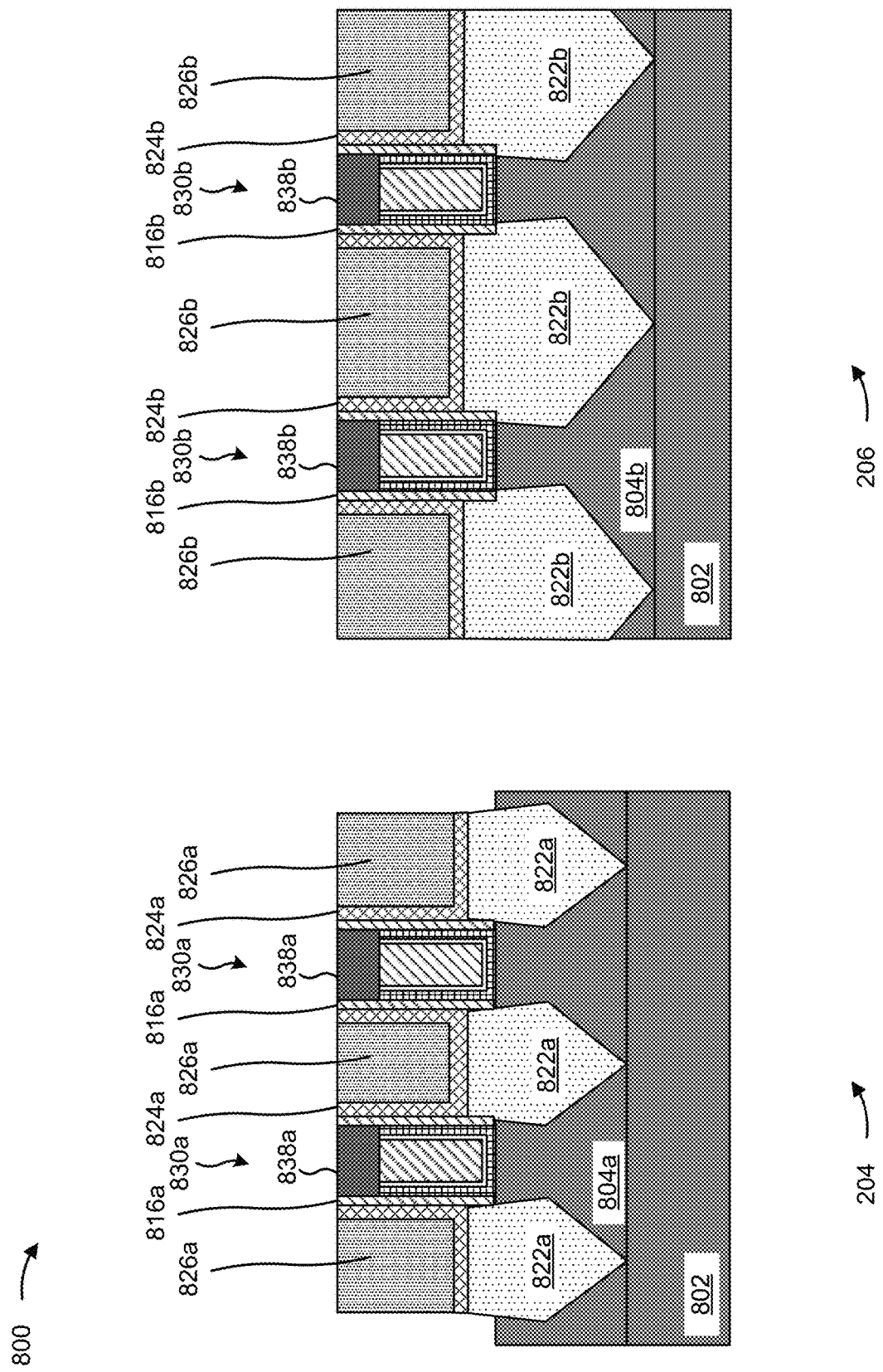

As shown in FIG. 8F, portions of the gate structures 830*a* and 830*b* may be etched back, and self-aligned contacts (SACs) 838*a* and 838*b* may be formed in the etched back portions. The SACs 838*a* and 838*b* may include conductive materials, such as copper (Cu), cobalt (Co), ruthenium (Ru), tungsten (W), a combination thereof, and/or other conductive materials.

Figure 8G:
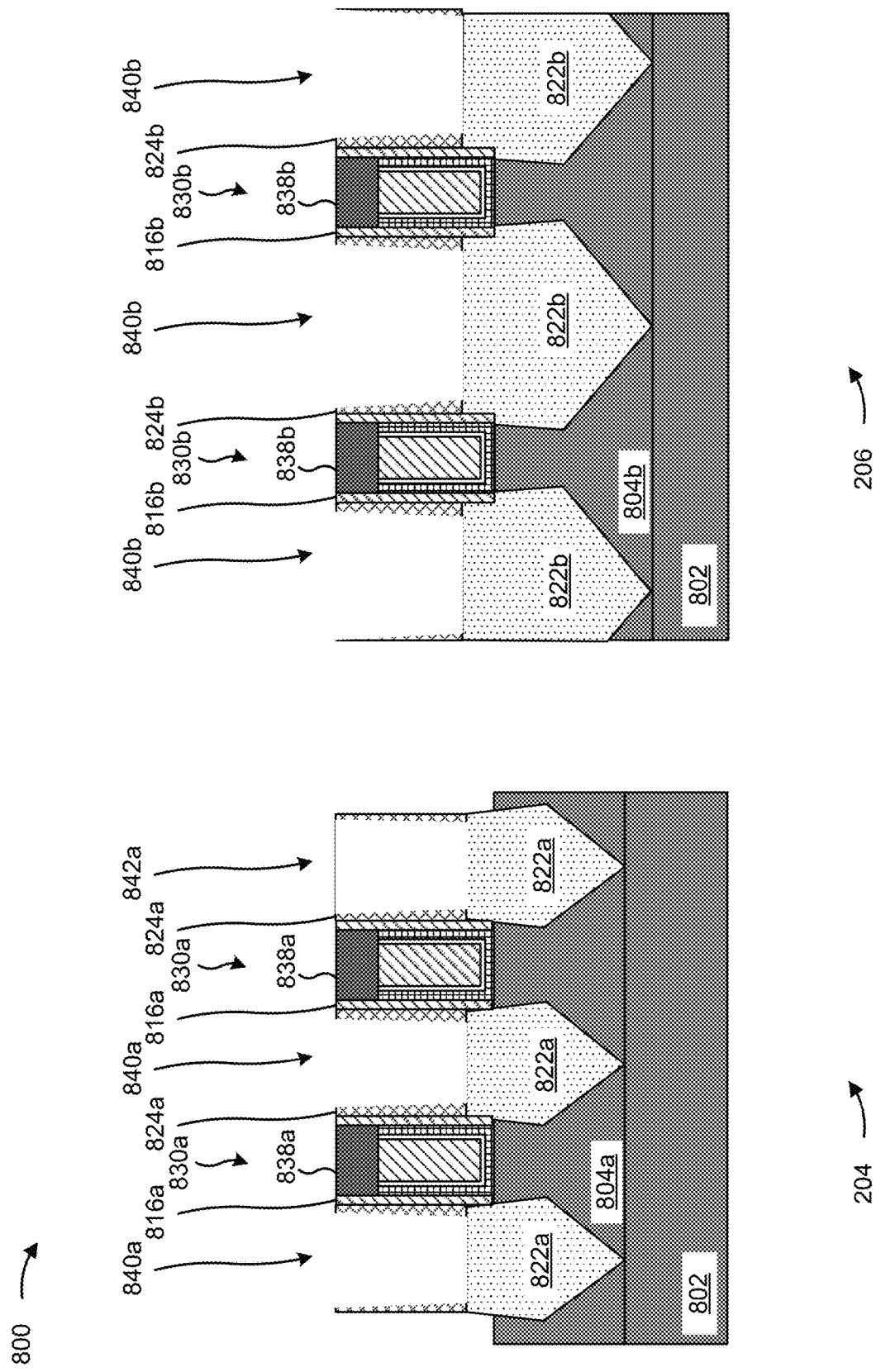

As shown in FIG. 8G, the ILD layers 826*a* between the gate structures 830*a* of the electronic device 204 are etched to form openings 840*a* between the gate structures 830*a* to the epitaxial regions 822*a* of the electronic device 204. The ILD layers 826*b* between the gate structures 830*b* of the electronic device 206 are etched to form openings 840*b* between the gate structures 830*b* to the epitaxial regions 822*b* of the electronic device 206.

Figure 8H:
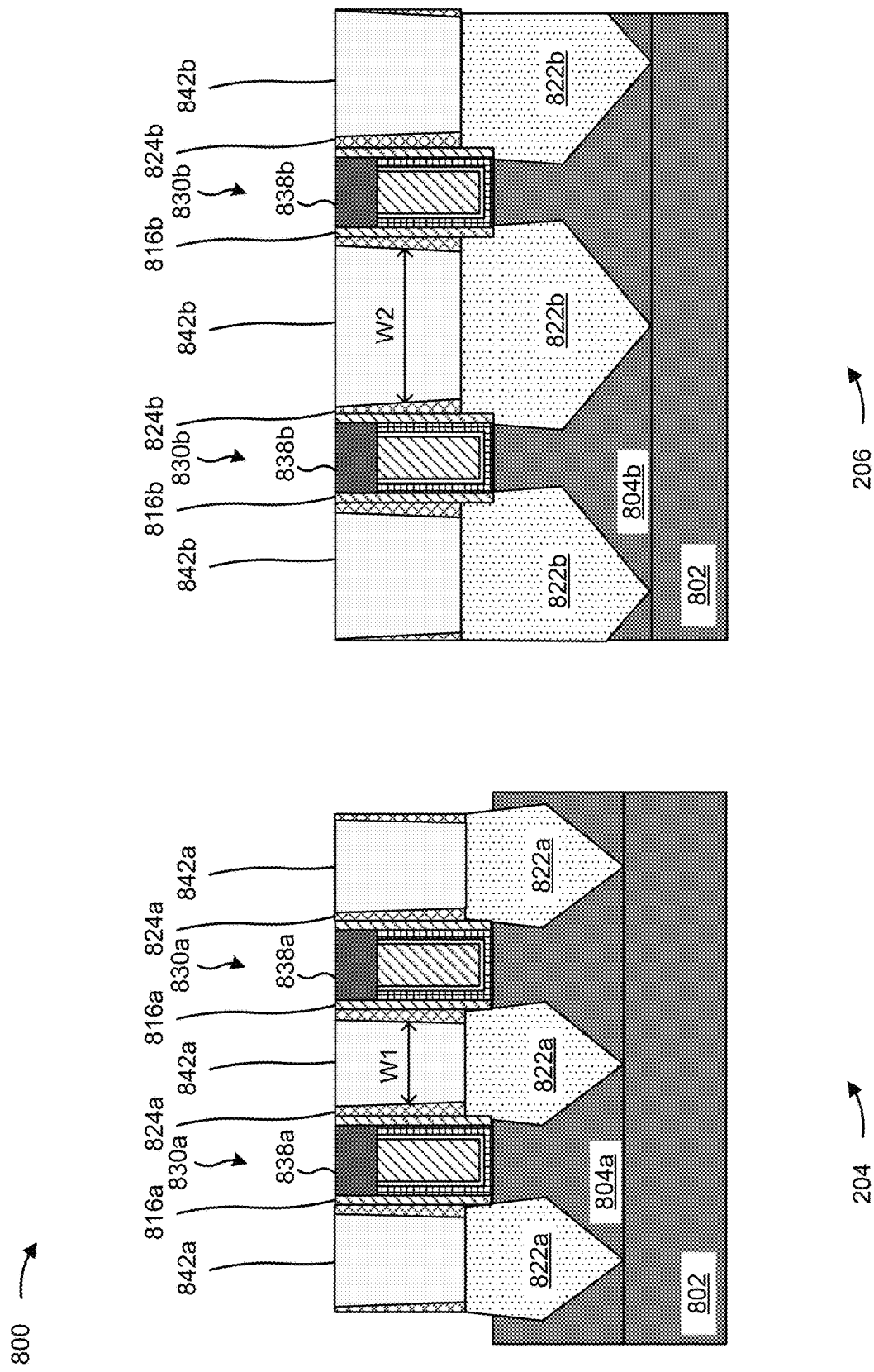

As shown in FIG. 8H, contacts 842*a* (e.g., source or drain contacts) for the electronic device 204 are formed in the openings 840*a* between the gate structures 830*a* and over and/or on the epitaxial regions 822*a*. Contacts 842*b* (e.g., source or drain contacts) are formed for the electronic device 206 in the openings 840*b* between the gate structures 830*b* and over and/or on the epitaxial regions 822*b*. The deposition tool 102 and/or the plating tool 112 deposits the contacts 842*a* and 842*b* by a CVD technique, a PVD technique, an ALD technique, an electroplating technique, another deposition technique described above in connection with FIG. 1, and/or another deposition technique.

As further shown in FIG. 8H, the contacts 842*a* are formed to a width (W1), and the contacts 842*b* are formed to a width (W2). The width (W2) of the contacts 842*b* is greater relative to the width (W1) of the contacts 842*b* such that the contact resistance between the contacts 842*b* and the epitaxial regions 822*b* is lesser for the electronic device 206 (e.g., the HPC device, the I/O device, the analog device, or the diode device) relative to the contact resistance between the contacts 842*a* and the epitaxial regions 822*a* for the electronic device 204 (e.g., the SoC device). The width (W1) of the contacts 842*a* is lesser relative to the width (W2) of the contacts 842*b* such that the size of the transistors included in the electronic device 204 (e.g., the SoC device) are lesser relative to the size of the transistors included in the electronic device 206 (e.g., the HPC device, the I/O device, the analog device, or the diode device), and such that the transistor density of the electronic device 204 is greater relative to the transistor density of the electronic device 206.

In some implementations, the width (W1) of the contacts 842*a* included in the electronic device 204 is in a range of approximately 8 nanometers to approximately 40 nanometers to achieve increased transistor density for the electronic device 204 (which includes an SoC device). In some implementations, the width (W2) of the contacts 842*b* included in the electronic device 206 is in a range of approximately 10 nanometers to approximately 50 nanometers to achieve low contact resistance for the electronic device 206 (which includes an HPC device, an I/O device, an analog device, or a diode device).

In some implementations, an aspect ratio, between the height of the contacts 842*a* included in the electronic device 204 and the width (W1), is in a range of approximately 0.5 to approximately 5 to achieve low contact resistance and low parasitic capacitance for the electronic device 204 while reducing and/or minimizing process control issues for the electronic device 204. In some implementations, and aspect ratio, between the height of the contacts 842*b* included in the electronic device 206 and the width (W2), is in a range of approximately 1 to approximately 10 to achieve low leakage current for the electronic device 206 while reducing and/or minimizing process control issues for the electronic device 206.

In some implementations, other techniques are used to form the contacts 842*b* to a width that is greater relative to the width of the contacts 842*a*. As an example, the gate structures 830*b* of the electronic device 206 may be formed a greater distance apart relative to the distance between the gate structures 830*b* of the electronic device 204. As another example, the gate structures 830*b* of the electronic device 206 may be formed with a lesser width relative to the width of the gate structures 830*a* of the electronic device 204.

As indicated above, FIGS. 8A-8H is provided as an example. Other examples may differ from what is described with regard to FIGS. 8A-8H.

FIG. 9 is a diagram of example components of a device 900. In some implementations, one or more of the semiconductor process tools 102-112 and/or the wafer/die transport tool 114 may include one or more devices 900 and/or one or more components of device 900. As shown in FIG. 9, device 900 may include a bus 910, a processor 920, a memory 930, a storage component 940, an input component 950, an output component 960, and a communication component 970.

Bus 910 includes a component that enables wired and/or wireless communication among the components of device 900. Processor 920 includes a central processing unit, a graphics processing unit, a microprocessor, a controller, a microcontroller, a digital signal processor, a field-programmable gate array, an application-specific integrated circuit, and/or another type of processing component. Processor 920 is implemented in hardware, firmware, or a combination of hardware and software. In some implementations, processor 920 includes one or more processors capable of being programmed to perform a function. Memory 930 includes a random access memory, a read only memory, and/or another type of memory (e.g., a flash memory, a magnetic memory, and/or an optical memory).

Storage component 940 stores information and/or software related to the operation of device 900. For example, storage component 940 may include a hard disk drive, a magnetic disk drive, an optical disk drive, a solid state disk drive, a compact disc, a digital versatile disc, and/or another type of non-transitory computer-readable medium. Input component 950 enables device 900 to receive input, such as user input and/or sensed inputs. For example, input component 950 may include a touch screen, a keyboard, a keypad, a mouse, a button, a microphone, a switch, a sensor, a global positioning system component, an accelerometer, a gyroscope, and/or an actuator. Output component 960 enables device 900 to provide output, such as via a display, a speaker, and/or one or more light-emitting diodes. Communication component 970 enables device 900 to communicate with other devices, such as via a wired connection and/or a wireless connection. For example, communication component 970 may include a receiver, a transmitter, a transceiver, a modem, a network interface card, and/or an antenna.

Device 900 may perform one or more processes described herein. For example, a non-transitory computer-readable medium (e.g., memory 930 and/or storage component 940) may store a set of instructions (e.g., one or more instructions, code, software code, and/or program code) for execution by processor 920. Processor 920 may execute the set of instructions to perform one or more processes described herein. In some implementations, execution of the set of instructions, by one or more processors 920, causes the one or more processors 920 and/or the device 900 to perform one or more processes described herein. In some implementations, hardwired circuitry may be used instead of or in combination with the instructions to perform one or more processes described herein. Thus, implementations described herein are not limited to any specific combination of hardware circuitry and software.

The number and arrangement of components shown in FIG. 9 are provided as an example. Device 900 may include additional components, fewer components, different components, or differently arranged components than those shown in FIG. 9. Additionally, or alternatively, a set of components (e.g., one or more components) of device 900 may perform one or more functions described as being performed by another set of components of device 900.

Figure 10:
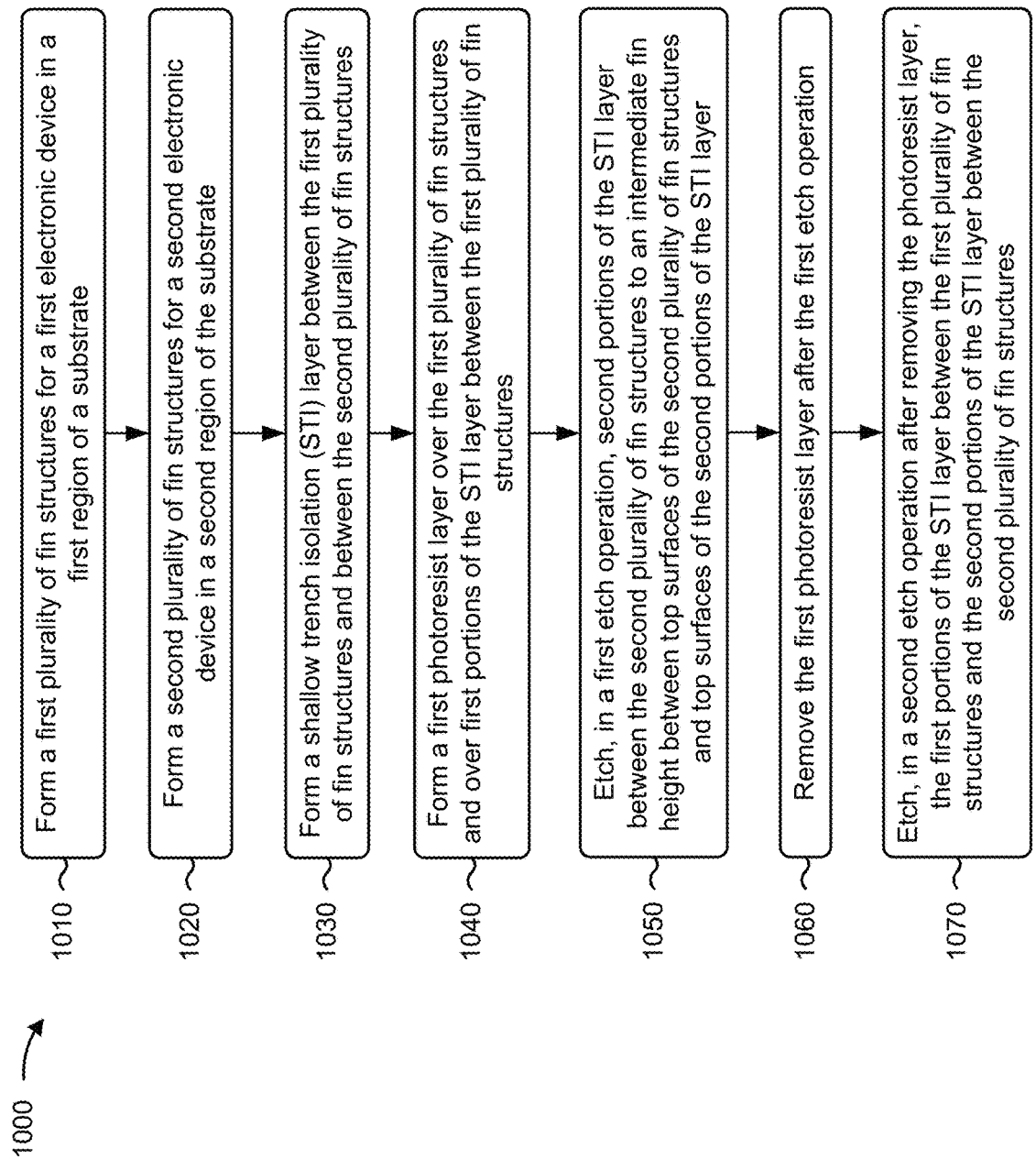
FIGS. 10 and 11 are flowcharts of example processes relating to forming electronic devices described herein.

FIG. 10 is a flowchart of an example process 1000 associated with forming an electronic device. In some implementations, one or more process blocks of FIG. 10 may be performed by one or more of semiconductor processing tools (e.g., one or more of the semiconductor processing tools 102-112). Additionally, or alternatively, one or more process blocks of FIG. 10 may be performed by one or more components of device 900, such as processor 920, memory 930, storage component 940, input component 950, output component 960, and/or communication component 970.

As shown in FIG. 10, process 1000 may include forming a first plurality of fin structures for a first electronic device in a first region of a substrate (block 1010). For example, one or more of the semiconductor processing tools 102-112 may form a first plurality of fin structures (e.g., the fin structures 304, 404a, and/or 504a) for a first electronic device (e.g., the electronic device 204) in a first region of a substrate (e.g., the substrate 200, 402, and/or 502), as described above.

As further shown in FIG. 10, process 1000 may include forming a second plurality of fin structures for a second electronic device in a second region of the substrate (block 1020). For example, one or more of the semiconductor processing tools 102-112 may form a second plurality of fin structures (e.g., the fin structures 304, 404b, and/or 504b) for a second electronic device (e.g., the electronic device 206) in a second region of the substrate, as described above.

As further shown in FIG. 10, process 1000 may include forming an STI layer between first plurality of fin structures and between the second plurality of fin structures (block 1030). For example, one or more of the semiconductor processing tools 102-112 may form an STI layer (e.g., the STI layer 406 and/or 506) between the first plurality of fin structures and between the second plurality of fin structures, as described above.

As further shown in FIG. 10, process 1000 may include forming a first photoresist layer over the first plurality of fin structures and over first portions of the STI layer between the first plurality of fin structures (block 1040). For example, one or more of the semiconductor processing tools 102-112 may form a first photoresist layer (e.g., the photoresist layer 408) over the first plurality of fin structures (e.g., the fin structures 404a) and over first portions (e.g., portions 406a) of the STI layer (e.g., the STI layer 406) between the first plurality of fin structures, as described above.

As further shown in FIG. 10, process 1000 may include etching, in a first etch operation, second portions of the STI layer between the second plurality of fin structures to an intermediate fin height between top surfaces of the second plurality of fin structures and top surfaces of the second portions of the STI layer (block 1050). For example, one or more of the semiconductor processing tools 102-112 may etch, in a first etch operation, second portions (e.g., portions 404b) of the STI layer between the second plurality of fin structures (e.g., the fin structures 404a) to an intermediate fin height ($H_i$) between top surfaces of the second plurality of fin structures and top surfaces of the second portions of the STI layer, as described above.

As further shown in FIG. 10, process 1000 may include removing the first photoresist layer after the first etch operation (block 1060). For example, one or more of the semiconductor processing tools 102-112 may remove the first photoresist layer after the first etch operation, as described above.

As further shown in FIG. 10, process 1000 may include etching, in a second etch operation after removing the photoresist layer, the first portions of the STI layer between the first plurality of fin structures and the second portions of the STI layer between the second plurality of fin structures (block 1070). For example, one or more of the semiconductor processing tools 102-112 may etch, in a second etch operation after removing the photoresist layer, the first portions of the STI layer between the first plurality of fin structures and the second portions of the STI layer between the second plurality of fin structures, as described above. In some implementations, the second portions of the STI layer are further etched in the second operation such that intermediate fin height is increased to a second fin height (H2) between the top surfaces of the second plurality of fin structures and the top surfaces of the second portions of the STI layer. In some implementations, the first portions of the STI layer are etched such that a first fin height (H1) between the top surfaces of the first plurality of fin structures and the top surfaces of the first portions of the STI layer is less than the first fin height.

Process 1000 may include additional implementations, such as any single implementation or any combination of implementations described below and/or in connection with one or more other processes described elsewhere herein.

In a first implementation, the second electronic device includes an HPC device, an I/O device, or an analog device. In a second implementation, alone or in combination with the first implementation, the first fin height being lesser than the second fin height provides greater power efficiency and lower capacitance for the first electronic device, and the second fin height being greater than the first fin height provides lower channel resistance and higher drive current for the second electronic device. In a third implementation, alone or in combination with one or more of the first or second implementations, a ratio between the first fin height and the second fin height is in a range of approximately 3:8 to approximately 3:4.

Although FIG. 10 shows example blocks of process 1000, in some implementations, process 1000 may include additional blocks, fewer blocks, different blocks, or differently arranged blocks than those depicted in FIG. 10. Additionally, or alternatively, two or more of the blocks of process 1000 may be performed in parallel.

Figure 11:
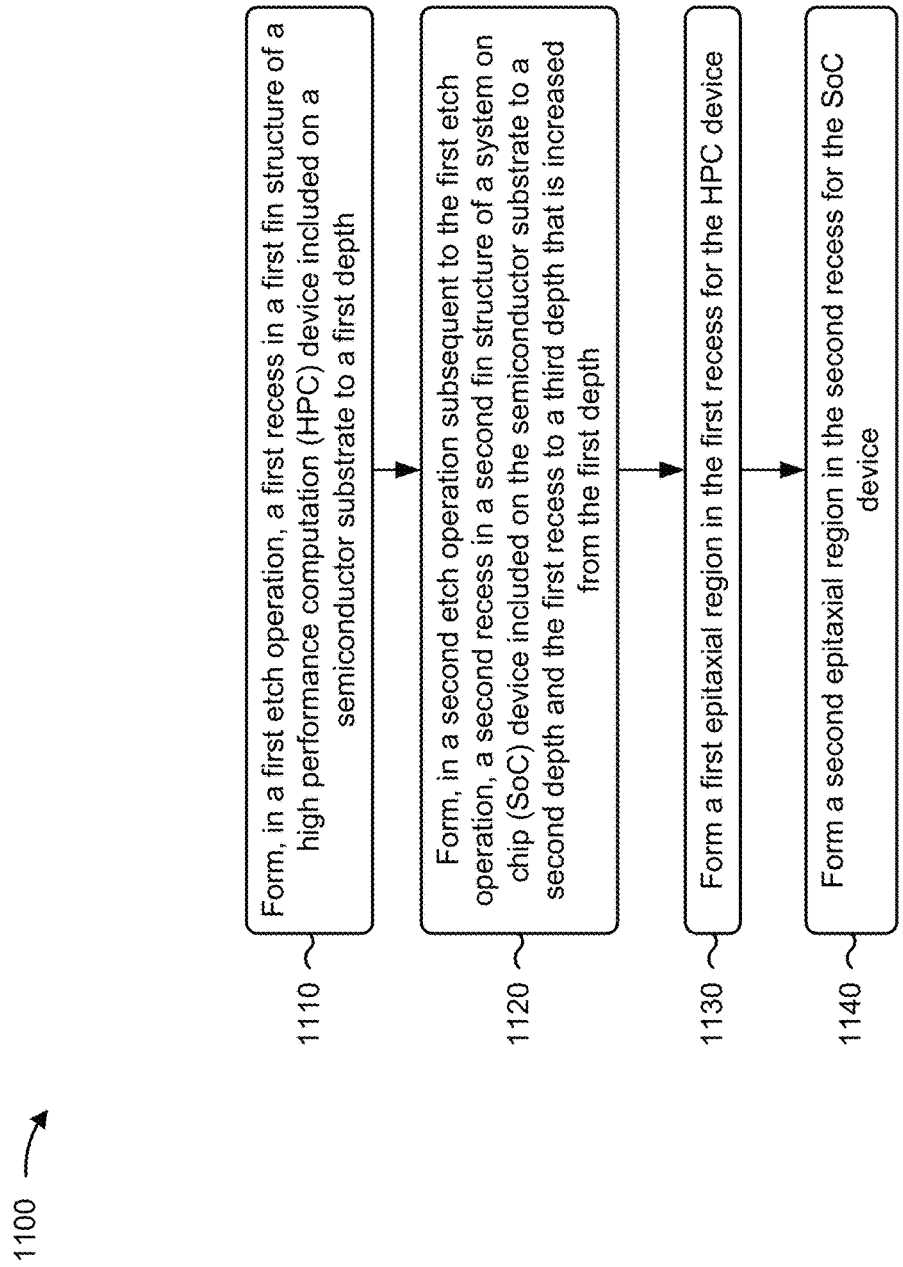

FIG. 11 is a flowchart of an example process 1100 associated with forming an electronic device. In some implementations, one or more process blocks of FIG. 11 may be performed by one or more of the semiconductor processing tools (e.g., one or more of the semiconductor processing tools 102-112). Additionally, or alternatively, one or more process blocks of FIG. 11 may be performed by one or more components of device 900, such as processor 920, memory 930, storage component 940, input component 950, output component 960, and/or communication component 970.

As shown in FIG. 11, process 1100 may include forming, in a first etch operation, a first recess in a first fin structure of an HPC device included on a semiconductor substrate to a first depth (block 1110). For example, one or more of the semiconductor processing tools 102-112 may form, in a first etch operation, a first recess (e.g., the recess 620*b*) in a first fin structure (e.g., the fin structure 304*b*, 404*b*, 504*b*, 604*b*, and/or 804*b*) of an HPC device (e.g., the electronic device 206) included on a semiconductor substrate (e.g., the substrate 200, 302, 402, 502, 602, and/or 802), as described herein. In some implementations, the first recess is formed to a first depth (D1) between a first plurality of dummy gate structures (e.g., the dummy gate structures 310*b*, 606*b*, and/or 806*b*) of the HPC device in the first etch operation.

As further shown in FIG. 11, process 1100 may include forming, in a second etch operation subsequent to the first etch operation, a second recess in a second fin structure of an SoC device included on the semiconductor substrate to a second depth and the first recess to a third depth that is increased from the first depth (block 1120). For example, one or more of the semiconductor processing tools 102-112 may form, in a second etch operation subsequent to the first etch operation, a second recess (e.g., the recess 620*a*) in a second fin structure (e.g., the fin structure 304*a*, 404*a*, 504*a*, 604*a*, and/or 804*a*) of an SoC device (e.g., the electronic device 204) included on the semiconductor substrate to a second depth (D2) and the first recess to a third depth (D2) that is increased from the first depth (D1), as described herein. In some implementations, the SoC device and the HPC device are included in a different regions of the semiconductor substrate. In some implementations, the second recess is formed to the second depth (D2) between a second plurality of dummy gate structures (e.g., the dummy gate structures 310*a*, 606*a*, and/or 808*a*) of the SoC device.

As further shown in FIG. 11, process 1100 may include forming a first epitaxial region in the first recess for the HPC device (block 1130). For example, one or more of the semiconductor processing tools 102-112 may form a first epitaxial region (e.g., an epitaxial region 622*b* and/or 822*b* in the first recess for the HPC device, as described herein.

As further shown in FIG. 11, process 1100 may include forming a second epitaxial region in the second recess for the SoC device (block 1140). For example, one or more of the semiconductor processing tools 102-112 may form a second epitaxial region (e.g., an epitaxial region 622*a* and/or 822*a*) in the second recess for the SoC device, as described herein. In some implementations, a first height (H4) of the first epitaxial region is greater than a second height (H3) of the second epitaxial region.

Process 1100 may include additional implementations, such as any single implementation or any combination of implementations described below and/or in connection with one or more other processes described elsewhere herein.

In a first implementation, a ratio between the first depth and the third depth is in a range of approximately 1:9 to approximately 2:3. In a second implementation, alone or in combination with the first implementation, the third depth being greater than the second depth enables the first epitaxial region to be formed to the first height that is greater than the second height of the second epitaxial region, the first height being greater than the second height provides lower extension resistance, lower current crowding, and higher drive current for the HPC device than the SoC device, and the second height being lesser than the first height provides increased power efficiency and increased transistor density for the SoC device than the HPC device.

In a third implementation, alone or in combination with one or more of the first or second implementations, process 1100 includes forming the first recess to a first distance (D5) from the first plurality of dummy gate structures, and forming the second recess to a second distance (D4) from the second plurality of dummy gate structures, where the first distance is lesser than the first distance, where the first distance being lesser than the second distance provides at least one of lower current crowding, higher drive current, lower hot carrier injection, or lower junction leakage for the HPC device than the SoC device, and where the second distance being greater than the first distance provides lower subthreshold leakage and lower parasitic capacitance for the SoC device than the HPC device.

In a fourth implementation, alone or in combination with one or more of the first through third implementations, a ratio between the second distance and the first distance is in a range of approximately 10:1 to approximately 5:4. In a fifth implementation, alone or in combination with one or more of the first through fourth implementations, the process 1100 includes forming a first source or drain contact (842*b*) over the first epitaxial region for the HPC device and forming a second source or drain contact (842*a*) over the second epitaxial region for the SoC device, where a width of the first source or drain contact is greater relative to a width of the second source or drain contact to provide lower contact resistance for the HPC device than the SoC device.

Although FIG. 11 shows example blocks of process 1100, in some implementations, process 1100 may include additional blocks, fewer blocks, different blocks, or differently arranged blocks than those depicted in FIG. 11. Additionally, or alternatively, two or more of the blocks of process 1100 may be performed in parallel.

In this way, transistors of different types of electronic devices on the same semiconductor substrate are configured with different transistor attributes to increase the performance of the different types of electronic devices. Fin height, SSD height, source or drain width, and/or one or more other transistor attributes may be co-optimized for the different types of electronic devices by various semiconductor manufacturing processes such as etching, lithography, process loading, and/or masking, among other examples. This enables the performance of a plurality of types of electronic devices on the same semiconductor substrate to be increased.

As described in greater detail herein, some implementations described herein provide a semiconductor substrate. The semiconductor substrate includes a first device region corresponding to a first electronic device, a first plurality of fin structures in the first electronic device region for the first device, and a first plurality of portions of a STI layer between the first plurality of fin structures. The semiconductor substrate includes a second device region corresponding to a second electronic device, a second plurality of fin structures in the second device region for the second electronic device, and a second plurality of portions of the STI layer between the second plurality of fin structures. The first electronic device includes an HPC device, an I/O device, or an analog device. The second electronic device includes an SoC device. The first fin height of the first plurality of fin structures, from a top surface of the first plurality of portions of the STI layer to top surfaces of the first plurality of fin structures, is greater than a second fin height of the second plurality of fin structures from a top surface of the second plurality of portions of the STI layer to top surfaces of the second plurality of fin structures.

As described in greater detail herein, some implementations described herein provide a method. The method forming a first plurality of fin structures for a first electronic device in a first region of a substrate. The method includes forming a second plurality of fin structures for a second electronic device in a second region of the substrate. The method includes forming an STI layer between the first plurality of fin structures and between the second plurality of fin structures. The method includes forming a first photoresist layer over the first plurality of fin structures and over first portions of the STI layer between the first plurality of fin structures. The method includes etching, in a first etch operation, second portions of the STI layer between the second plurality of fin structures to an intermediate fin height between top surfaces of the second plurality of fin structures and top surfaces of the second portions of the STI layer. The method includes removing the first photoresist layer after the first etch operation. The method includes etching, in a second etch operation after removing the photoresist layer, the first portions of the STI layer between the first plurality of fin structures and the second portions of the STI layer between the second plurality of fin structures. The second portions of the STI layer are further etched in the second operation such that intermediate fin height is increased to a second fin height between the top surfaces of the second plurality of fin structures and the top surfaces of the second portions of the STI layer. The first portions of the STI layer are etched such that a first fin height between the top surfaces of the first plurality of fin structures and the top surfaces of the first portions of the STI layer is less than the second fin height.

As described in greater detail herein, some implementations described herein provide a method. The method includes forming, in a first etch operation, a first recess in a first fin structure of a HPC device included on a semiconductor substrate. The first recess is formed to a first depth between a first plurality of dummy gate structures of the HPC device in the first etch operation. The method includes forming, in a second etch operation subsequent to the first etch operation, a second recess in a second fin structure of an SoC device included on the semiconductor substrate and the first recess to a third depth that is increased from the first depth. The SoC device and the HPC device are included in different regions of the semiconductor substrate. The second recess is formed to a second depth between a second plurality of dummy gate structures of the SoC device. The third depth is greater than the second depth. The method includes forming a first epitaxial region in the first recess for the HPC device. The method includes forming a second epitaxial region in the second recess for the SoC device. A first height of the first epitaxial region is greater than a second height of the second epitaxial region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   forming a first plurality of fin structures for a first electronic device in a substrate;
   forming a second plurality of fin structures for a second electronic device in the substrate;
   forming a shallow trench isolation (STI) layer between fin structures of the first plurality of fin structures and fin structures of the second plurality of fin structures;
   etching a first portion of the STI layer such that the first plurality of fin structures have a first fin height between a top of the first plurality of fin structures and a top of the first portion of the STI layer between the fin structures of the first plurality of fin structures; and
   etching, after or before etching the first portion of the STI layer, a second portion of the STI layer such that the second plurality of fin structures have a second fin height, between a top of the second plurality of fin structures and a top of the second portion of the STI layer between the fin structures of the second plurality of fin structures, different than the first fin height.

2. The method of claim 1, wherein etching of the STI layer uses a photoresist layer.

3. The method of claim 2, wherein the photoresist layer has a pattern to form the first plurality of fin structures and the second plurality of fin structures.

4. The method of claim 3, wherein the STI layer is etched based on the pattern of the photoresist layer to expose portions of the first plurality of fin structures and portions of the second plurality of fin structures.

5. The method of claim 2, further comprising:
   forming the photoresist layer on the first plurality of fin structures and on the first portion of the STI layer;
   etching the second portion of the STI layer to an intermediate fin height after forming the photoresist layer; and removing the photoresist layer after etching the second portion of the STI layer,
wherein, after removing the photoresist layer, the first portion of the STI layer is etched to the first fin height and the second portion of the STI layer is etched to the second fin height.

6. The method of claim 2, further comprising:
forming the photoresist layer on the first plurality of fin structures and on the first portion of the STI layer,
wherein the second portion of the STI layer is etched to the second fin height after forming the photoresist layer;
removing the photoresist layer after etching the second portion of the STI layer; and
forming, after removing the photoresist layer, a second photoresist layer on the second plurality of fin structures and on the second portion of the STI layer,
wherein the first portion of the STI layer is etched to the first fin height after forming the second photoresist layer.

7. The method of claim 2, further comprising:
forming the photoresist layer on the second plurality of fin structures and on the second portion of the STI layer,
wherein the first portion of the STI layer is etched to the first fin height after forming the photoresist layer;
removing the photoresist layer after etching the first portion of the STI layer; and
forming, after removing the photoresist layer, a second photoresist layer on the first plurality of fin structures and on the first portion of the STI layer,
wherein the second portion of the STI layer is etched to the second fin height after forming the second photoresist layer.

8. A method, comprising:
forming a first plurality of fin structures for a first electronic device in a first region of a substrate;
forming a second plurality of fin structures for a second electronic device in a second region of the substrate;
forming a shallow trench isolation (STI) layer between the first plurality of fin structures and between the second plurality of fin structures;
forming a photoresist layer over the first plurality of fin structures and over first portions of the STI layer between the first plurality of fin structures;
etching, in a first etch operation, second portions of the STI layer between the second plurality of fin structures to an intermediate fin height between top surfaces of the second plurality of fin structures and top surfaces of the second portions of the STI layer;
removing the photoresist layer after the first etch operation; and
etching, in a second etch operation after removing the photoresist layer, the first portions of the STI layer between the first plurality of fin structures and the second portions of the STI layer between the second plurality of fin structures.

9. The method of claim 8, wherein, in the second etch operation, the second portions of the STI layer are further etched such that the intermediate fin height is increased to a second fin height between the top surfaces of the second plurality of fin structures and the top surfaces of the second portions of the STI layer.

10. The method of claim 9, wherein the first portions of the STI layer are etched such that a first fin height between the top surfaces of the first plurality of fin structures and the top surfaces of the first portions of the STI layer is less than the second fin height.

11. The method of claim 10, wherein the first fin height being less than the second fin height provides greater power efficiency and lower capacitance for the first electronic device; and
wherein the second fin height being greater than the first fin height provides lower channel resistance and higher drive current for the second electronic device.

12. The method of claim 10, wherein a ratio between the first fin height and the second fin height is in a range of approximately 3:8 to approximately 3:4.

13. The method of claim 8, wherein the second electronic device comprises:
a high performance computation (HPC) device,
an input/output (I/O) device, or
an analog device, and
wherein the first electronic device comprises a system on chip (SoC) device.

14. A method, comprising:
forming, in a first etch operation, a first recess in a first fin structure of a first device included on a semiconductor substrate,
wherein the first recess is formed to a first depth between a first plurality of dummy gate structures of the first device in the first etch operation;
forming, in a second etch operation subsequent to the first etch operation:
a second recess in a second fin structure of a second device included on the semiconductor substrate,
wherein the first device and the second device are included in different regions of the semiconductor substrate, and
wherein the second recess is formed to a second depth between a second plurality of dummy gate structures of the second device; and
the first recess to have a third depth that is greater than the first depth,
wherein the third depth is greater than the second depth;
forming a first epitaxial region in the first recess for the first device; and
forming a second epitaxial region in the second recess for the second device,
wherein a first height of the first epitaxial region is greater than a second height of the second epitaxial region.

15. The method of claim 14, wherein the first device comprises at least one of:
a high performance computation (HPC) device,
an input/output (I/O) device, or
an analog device, and
wherein the second device is a system on chip (SoC) device.

16. The method of claim 14, wherein a ratio between the first depth and the third depth is in a range of approximately 1:9 to approximately 2:3.

17. The method of claim 14, wherein the third depth being greater than the second depth enables the first epitaxial region to be formed to the first height that is greater than the second height of the second epitaxial region;
wherein the first height being greater than the second height provides lower extension resistance, lower current crowding, and higher drive current for the first device than the second device; and
wherein the second height being less than the first height provides increased power efficiency and increased transistor density for the second device than the first device.

18. The method of claim 14, further comprising:
forming the first recess to a first distance from the first plurality of dummy gate structures; and
forming the second recess to a second distance from the second plurality of dummy gate structures,
  wherein the first distance is less than the second distance,
    wherein the first distance being less than the second distance provides at least one of lower current crowding, higher drive current, lower hot carrier injection, or lower junction leakage for the first device than the second device; and
  wherein the second distance being greater than the first distance provides lower subthreshold leakage and lower parasitic capacitance for the second device than the first device.

19. The method of claim 18, wherein a ratio between the second distance and the first distance is in a range of approximately 10:1 to approximately 5:4.

20. The method of claim 14, further comprising:
forming a first source or drain contact over the first epitaxial region for the first device; and
forming a second source or drain contact over the second epitaxial region for the second device,
  wherein a width of the first source or drain contact is greater relative to a width of the second source or drain contact to provide lower contact resistance for the first device than the second device.

\* \* \* \* \*